(12) United States Patent
Shin et al.

(10) Patent No.: US 12,660,258 B2
(45) Date of Patent: Jun. 16, 2026

(54) SEMICONDUCTOR DEVICE AND METHOD FOR FABRICATING THEREOF

(71) Applicant: Samsung Electronics Co., Ltd., Suwon-si (KR)

(72) Inventors: Dong Suk Shin, Suwon-si (KR); Hyun-Kwan Yu, Suwon-si (KR); Seok Hoon Kim, Suwon-si (KR); Pan Kwi Park, Incheon (KR); Yong Seung Kim, Seongnam-si (KR); Jung Taek Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 842 days.

(21) Appl. No.: 17/935,528

(22) Filed: Sep. 26, 2022

(65) Prior Publication Data

US 2023/0253449 A1      Aug. 10, 2023

(30) Foreign Application Priority Data

Jan. 21, 2022    (KR) ........................ 10-2022-0009280
Mar. 14, 2022    (KR) ........................ 10-2022-0031447

(51) Int. Cl.
H10D 62/822        (2025.01)
H01L 21/762        (2006.01)
(Continued)

(52) U.S. Cl.
CPC ..... H10D 62/116 (2025.01); H01L 21/76224 (2013.01); H10D 64/018 (2025.01); H10D 64/511 (2025.01)

(58) Field of Classification Search
None
See application file for complete search history.

(56) References Cited

U.S. PATENT DOCUMENTS 7,154,146 B2    12/2006   Wang et al.
9,741,811 B2     8/2017   Hatcher et al.
(Continued)

FOREIGN PATENT DOCUMENTS

KR    10-2020-0142158 A    12/2020
TW         201937659 A     9/2019

*Primary Examiner* — Steven B Gauthier
*Assistant Examiner* — Lamont B Koo
(74) *Attorney, Agent, or Firm* — Wolf, Greenfield & Sacks, P.C.

(57)            ABSTRACT

A semiconductor device includes a lower pattern extending in a first direction and sheet patterns spaced apart therefrom in a second direction, a gate structure on the lower pattern and including a gate insulating layer, a gate spacer, and a gate electrode, a source/drain pattern on the lower pattern and in contact with each of the sheet patterns and the gate insulating layer, and a first etch blocking pattern between the gate spacer and the source/drain pattern. The gate spacer includes an inner sidewall extending in the third direction, and a connection sidewall extending from the inner sidewall in the first direction. The source/drain pattern includes a semiconductor filling layer on a semiconductor liner layer that is in contact with the sheet pattern and includes a facet surface extending from the connection sidewall. The first etch blocking pattern is in contact with the facet surface and the connection sidewall.

20 Claims, 59 Drawing Sheets

(51) Int. Cl.
     *H10D 62/10*      (2025.01)
     *H10D 64/01*      (2025.01)
     *H10D 64/27*      (2025.01)

(56)                References Cited

U.S. PATENT DOCUMENTS

| | | | |
|---|---|---|---|
| 10,522,616 B2 | 12/2019 | Cho et al. | |
| 10,600,889 B2 | 3/2020 | Cheng et al. | |
| 10,651,291 B2 | 5/2020 | Frougier et al. | |
| 2019/0326395 A1 | 10/2019 | Ando et al. | |
| 2020/0395446 A1* | 12/2020 | Yi | B82Y 10/00 |
| 2021/0175352 A1 | 6/2021 | Han et al. | |
| 2021/0328010 A1 | 10/2021 | Kim et al. | |
| 2021/0367032 A1 | 11/2021 | Chen et al. | |
| 2021/0367036 A1 | 11/2021 | Kim et al. | |
| 2021/0408289 A1 | 12/2021 | Guha et al. | |

* cited by examiner

SEMICONDUCTOR DEVICE AND METHOD FOR FABRICATING THEREOF

CROSS-REFERENCE TO RELATED APPLICATION

This application claims priority from Korean Patent Application No. 10-2022-0009280 filed on Jan. 21, 2022, and No. 10-2022-0031447 filed on Mar. 14, 2022 in the Korean Intellectual Property Office, and all the benefits accruing therefrom under 35 U.S.C. 119, the contents of which in its entirety are herein incorporated by reference.

FIELD

The present disclosure relates to a semiconductor device and a method for fabricating the same, and more particularly, to a semiconductor device including a multi-bridge channel field effect transistor (MBCFET™), and a method for fabricating the same.

BACKGROUND

As a scaling technology for increasing a density of a semiconductor device, a multi-gate transistor has been proposed. In a multi-gate transistor, a multi-channel active pattern (or a silicon body) having a fin or nanowire shape may be formed on a substrate, and gates may be formed on a surface of the multi-channel active pattern.

Such a multi-gate transistor may have a three-dimensional channel, and it may thus be easier to perform scaling. In addition, a current control capability may be improved without increasing a gate length of the multi-gate transistor. Furthermore, a short channel effect (SCE) (in which a potential of a channel region is affected by a drain voltage) may be effectively suppressed.

SUMMARY

Aspects of the present disclosure provide a semiconductor device capable of improving performance and reliability of an element.

Aspects of the present disclosure also provide a method for fabricating a semiconductor device capable of improving performance and reliability of an element.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a semiconductor device comprises an active pattern including a lower pattern extending in a first direction and a plurality of sheet patterns spaced apart from the lower pattern in a second direction, a gate structure on the lower pattern and including a gate insulating layer, a gate electrode, and a gate spacer, the gate electrode extending in a third direction perpendicular to the first direction, a source/drain pattern on the lower pattern and in contact with the sheet patterns and the gate insulating layer, and a first etch blocking pattern between the gate spacer and the source/drain pattern, wherein the gate spacer includes an inner sidewall facing the gate electrode and extending in the third direction, and a connection sidewall extending from the inner sidewall of the gate spacer in the first direction, the source/drain pattern includes a semiconductor liner layer and a semiconductor filling layer on the semiconductor liner layer, the semiconductor liner layer is in contact with the sheet pattern, and includes a facet surface extending from the connection sidewall of the gate spacer, and the first etch blocking pattern is in contact with the facet surface of the semiconductor liner layer and the connection sidewall of the gate spacer.

According to another aspect of the present disclosure, a semiconductor device comprises an active pattern including a lower pattern extending in a first direction and a plurality of sheet patterns spaced apart from the lower pattern in a second direction, a gate structure on the lower pattern and including a gate insulating layer, a gate electrode, and a gate spacer, the gate electrode extending in a third direction perpendicular to the first direction, and a source/drain pattern on the lower pattern and in contact with the sheet patterns and the gate insulating layer, wherein the source/drain pattern includes a semiconductor liner layer and a semiconductor filling layer on the semiconductor liner layer and in contact with the semiconductor liner layer, the semiconductor liner layer is in contact with the sheet patterns, and includes a facet surface extending from the gate spacer, and in plan view at a level of one of the sheet patterns, a first width comprising a maximum width of the semiconductor liner layer in the third direction is greater than a second width, in the third direction, of an interface between the semiconductor liner layer and the semiconductor filling layer.

According to still another aspect of the present disclosure, a semiconductor device comprises a first active pattern including a first lower pattern extending in a first direction and a plurality of first sheet patterns spaced apart from the first lower pattern in a second direction, a first gate structure on the first lower pattern and including a first gate insulating layer, a first gate electrode, and a first gate spacer, the first gate electrode extending in a third direction perpendicular to the first direction, a second active pattern including a second lower pattern extending in the first direction and a plurality of second sheet patterns spaced apart from the second lower pattern in the second direction, a width of an upper surface of the second lower pattern in the third direction being smaller than a width of an upper surface of the first lower pattern in the third direction, a second gate structure on the second lower pattern and including a second gate insulating layer, a second gate electrode, and a second gate spacer, the second gate electrode extending in the third direction, a first source/drain pattern on the first lower pattern and in contact with the first sheet patterns and the first gate insulating layer, a second source/drain pattern on the second lower pattern and in contact with the second sheet patterns and the second gate insulating layer, and a first etch blocking pattern between the first gate spacer and the first source/drain pattern, wherein the first gate spacer includes an inner sidewall facing the first gate electrode and extending in the third direction and a connection sidewall extending from the inner sidewall of the first gate spacer in the first direction, the first source/drain pattern includes a semiconductor liner layer and a semiconductor filling layer on the semiconductor liner layer, the semiconductor liner layer is in contact with the first sheet pattern, and includes a facet surface extending from the connection sidewall of the first gate spacer, and the first etch blocking pattern is in contact with the facet surface of the semiconductor liner layer and the connection sidewall of the first gate spacer.

According to still another aspect of the present disclosure, a method of fabricating a semiconductor device comprises forming a lower pattern and an upper pattern structure extending in a first direction, forming a dummy gate structure on the upper pattern structure, the dummy gate structure extending in a second direction and including a dummy gate electrode and a pre-gate spacer on the dummy gate electrode, and the pre-gate spacer including an inner sidewall facing the dummy gate electrode and extending in the second direction and a connection sidewall extending from the inner sidewall of the pre-gate spacer in the first direction, forming a source/drain recess in the upper pattern structure using the dummy gate structure as a mask, the source/drain recess exposing at least a portion of the connection sidewall of the pre-gate spacer, forming a semiconductor liner layer along a profile of the source/drain recess, the semiconductor liner layer including a facet surface extending from the connection sidewall of the pre-gate spacer, forming an etch blocking pattern in contact with the facet surface of the semiconductor liner layer and the connection sidewall of the pre-gate spacer and extending in a third direction, and forming a semiconductor filling layer on the semiconductor liner layer after the forming of the etch blocking pattern.

BRIEF DESCRIPTION OF THE DRAWINGS

The above and other aspects and features of the present disclosure will become more apparent by describing in detail example embodiments thereof with reference to the attached drawings, in which:

FIG. 4 is a view for describing a shape of a first sheet pattern of FIG. 2:

FIG. 8 is an enlarged view of portion Q of FIG. 5;

Figure 10:
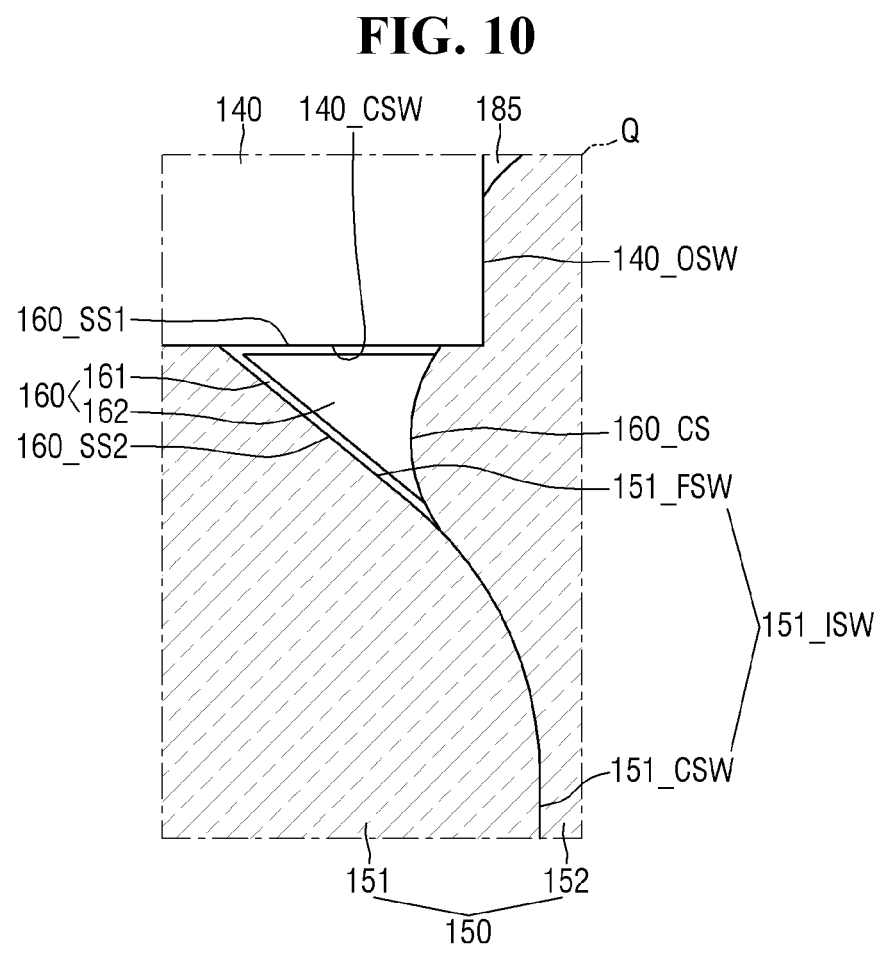

FIGS. 9 and 10 are views for describing a semiconductor device according to some embodiments:

Figure 12:
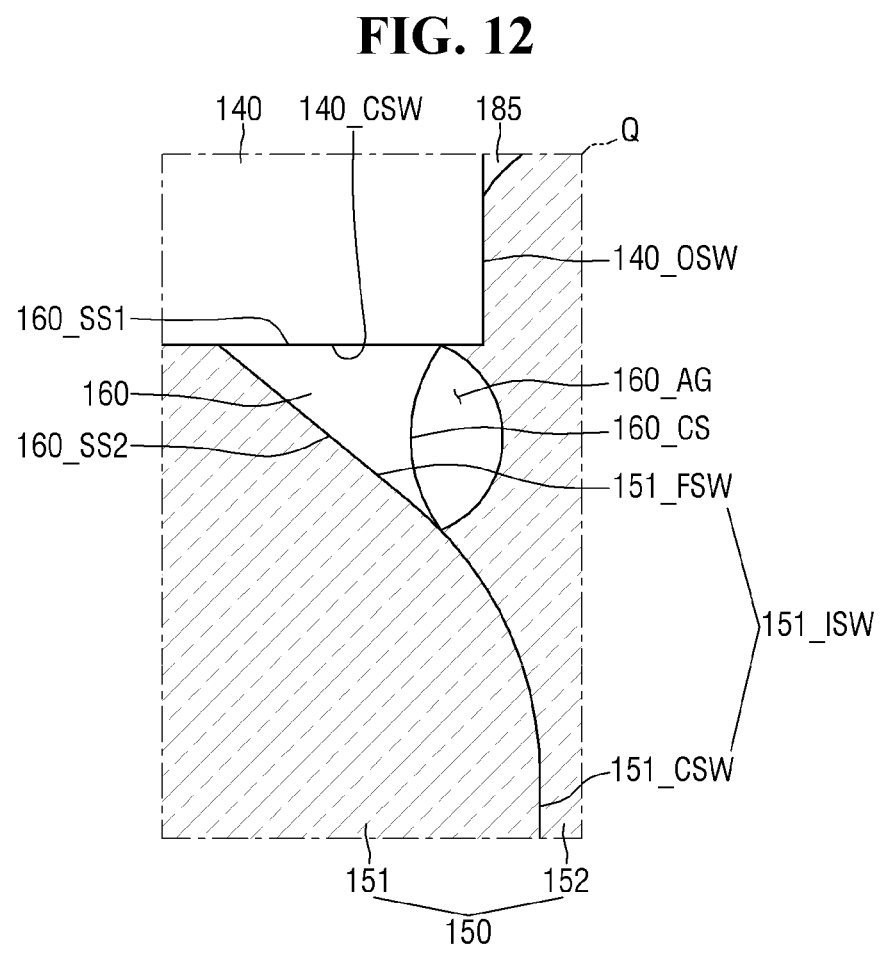

FIGS. 11 and 12 are views for describing a semiconductor device according to some embodiments:

Figure 16:
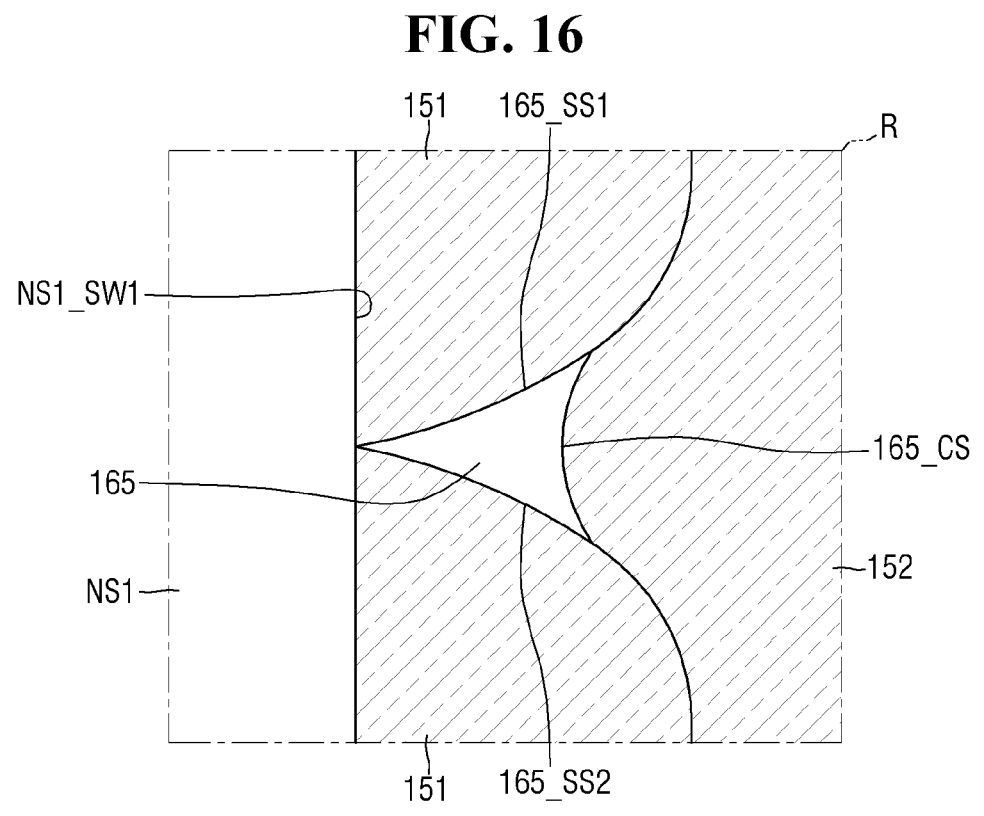

FIGS. 13, 14, 15, and 16 are views for describing a semiconductor device according to some embodiments:

FIGS. 17, 18, and 19 are views for describing a semiconductor device according to some embodiments:

FIGS. 36, 37, 38, 39, 40, 41, 42, 43, 44, 45, 46, 47, 48, 49, 50, 51, 52, and 53 are views for describing intermediate steps of a method for fabricating a semiconductor device according to some embodiments:

4

FIGS. 56, 57, 58, and 59 are views for describing intermediate steps of a method for fabricating a semiconductor device according to some embodiments.

DETAILED DESCRIPTION OF EMBODIMENTS

A semiconductor device according to some embodiments may include a tunneling field effect transistor (FET), a three-dimensional (3D) FET, or a two-dimensional material-based FET, and a heterostructure thereof. In addition, the semiconductor device according to some embodiments may include a bipolar junction transistor, a lateral double-diffused metal oxide semiconductor (LDMOS) transistor, or the like.

A semiconductor device according to some embodiments will be described with reference to FIGS. 1 to 8.

Figure 1:
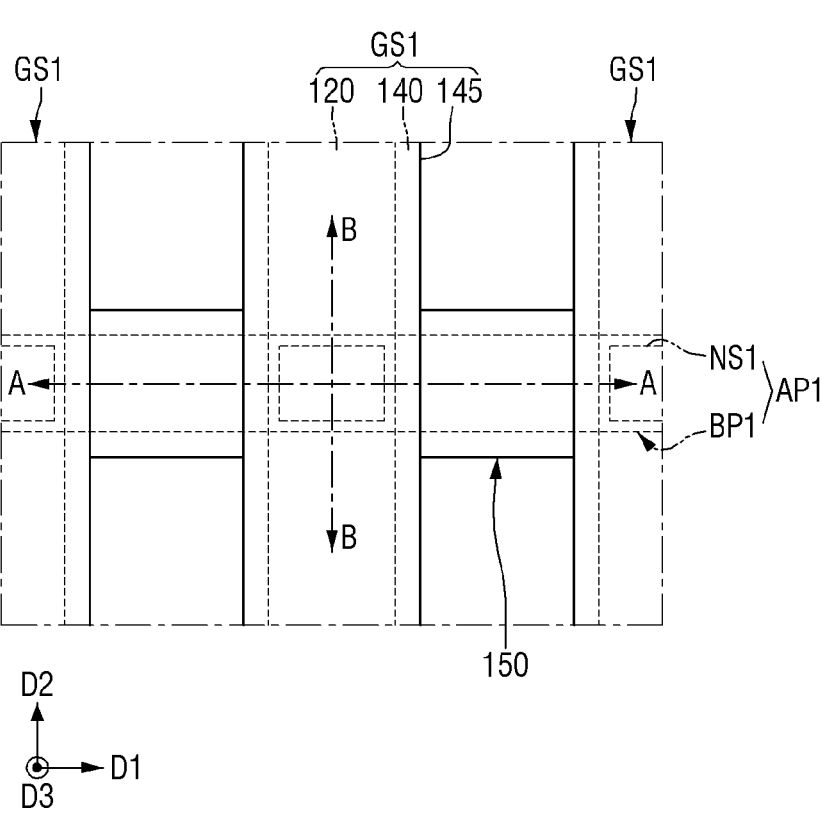
FIG. 1 is an illustrative plan view for describing a semiconductor device according to some embodiments.
Figure 2:
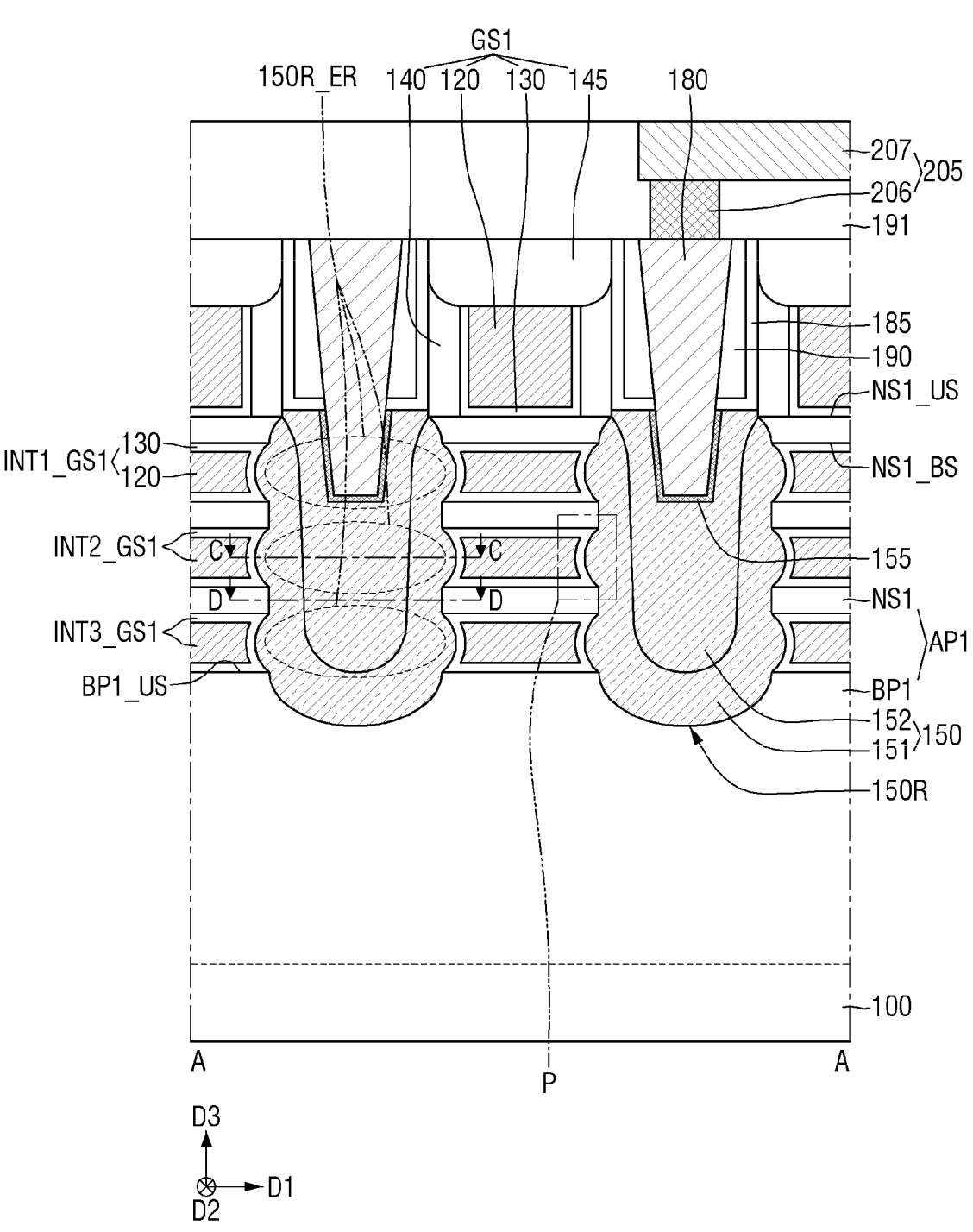
FIGS. 2 and 3 are cross-sectional views taken along line A-A and line B-B of FIG. 1, respectively.
Figure 3:
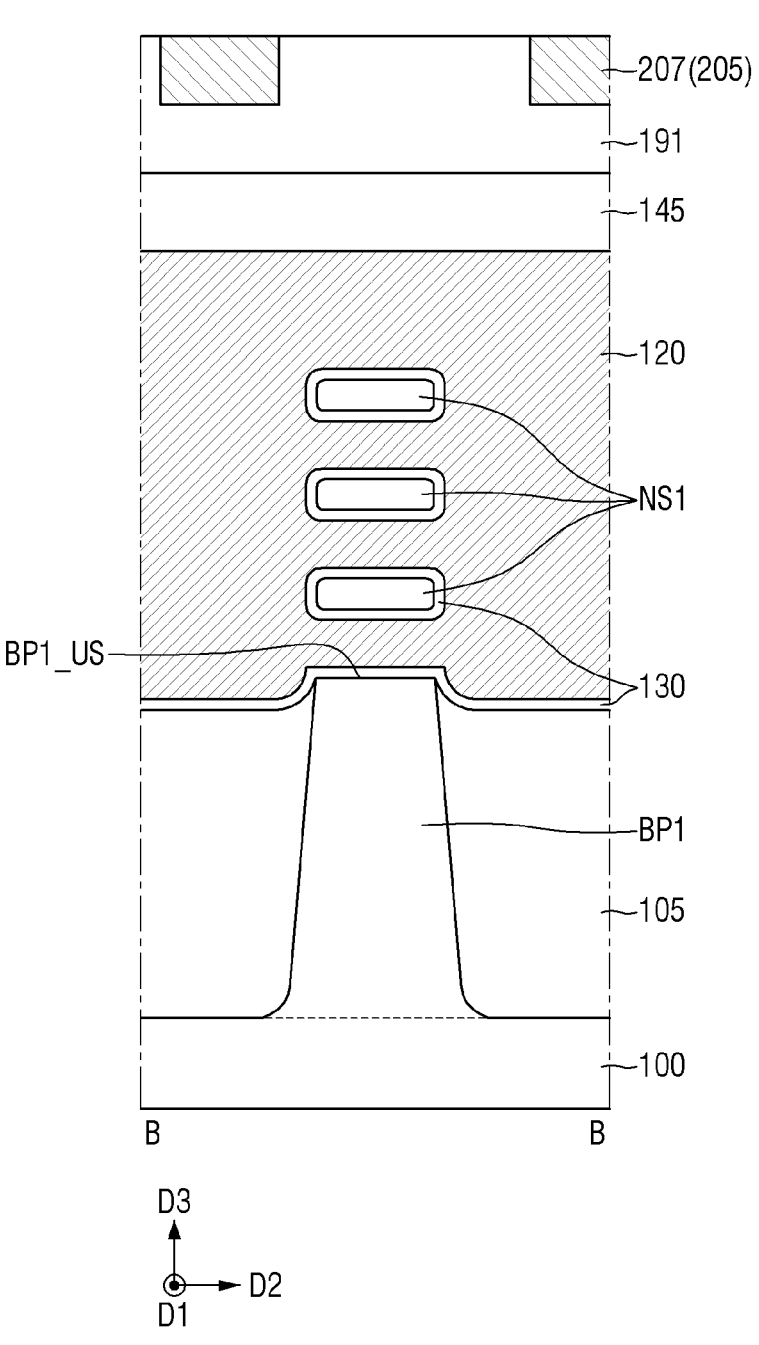
Figure 4:
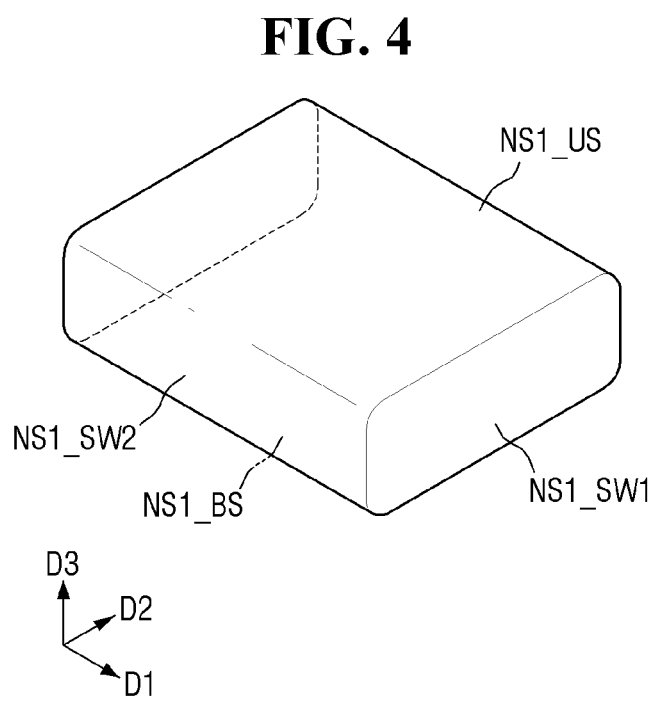
Figure 5:
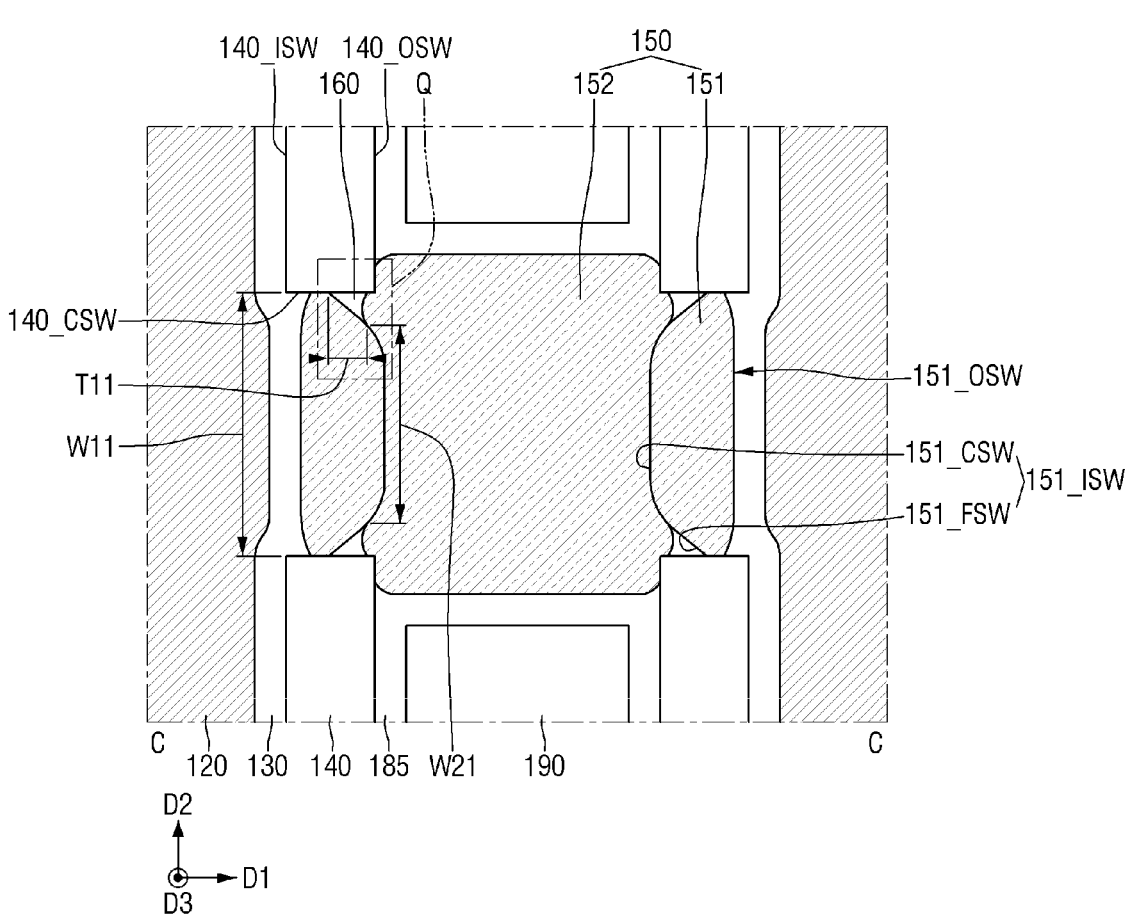
FIG. 5 is a plan view taken along line C-C of FIG. 2 and viewed from above.
Figure 6:
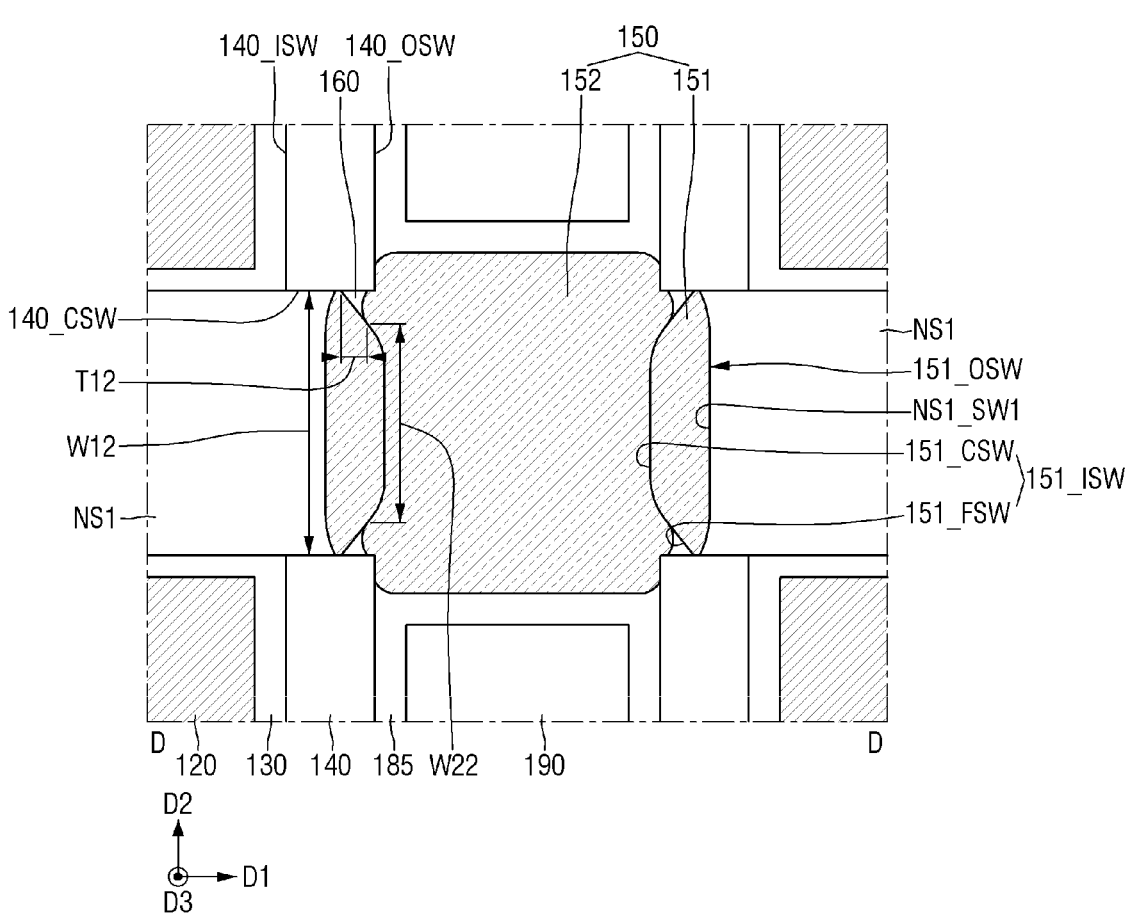
FIG. 6 is a plan view taken along line D-D of FIG. 2 and viewed from above.
Figure 7:
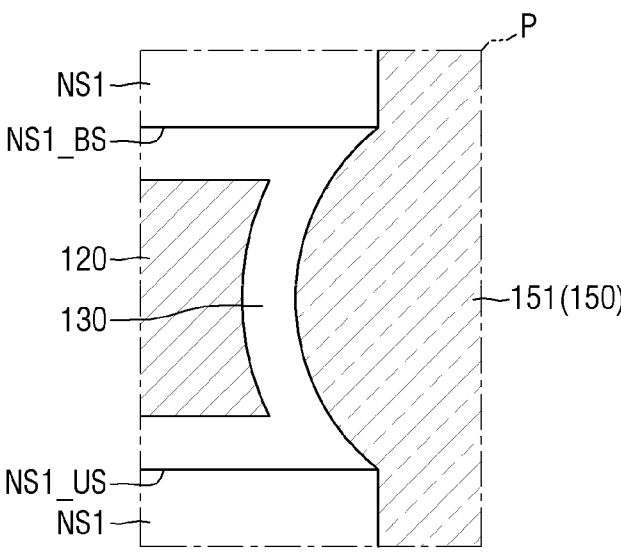
FIG. 7 is an enlarged view of region P of FIG. 2.
Figure 8:
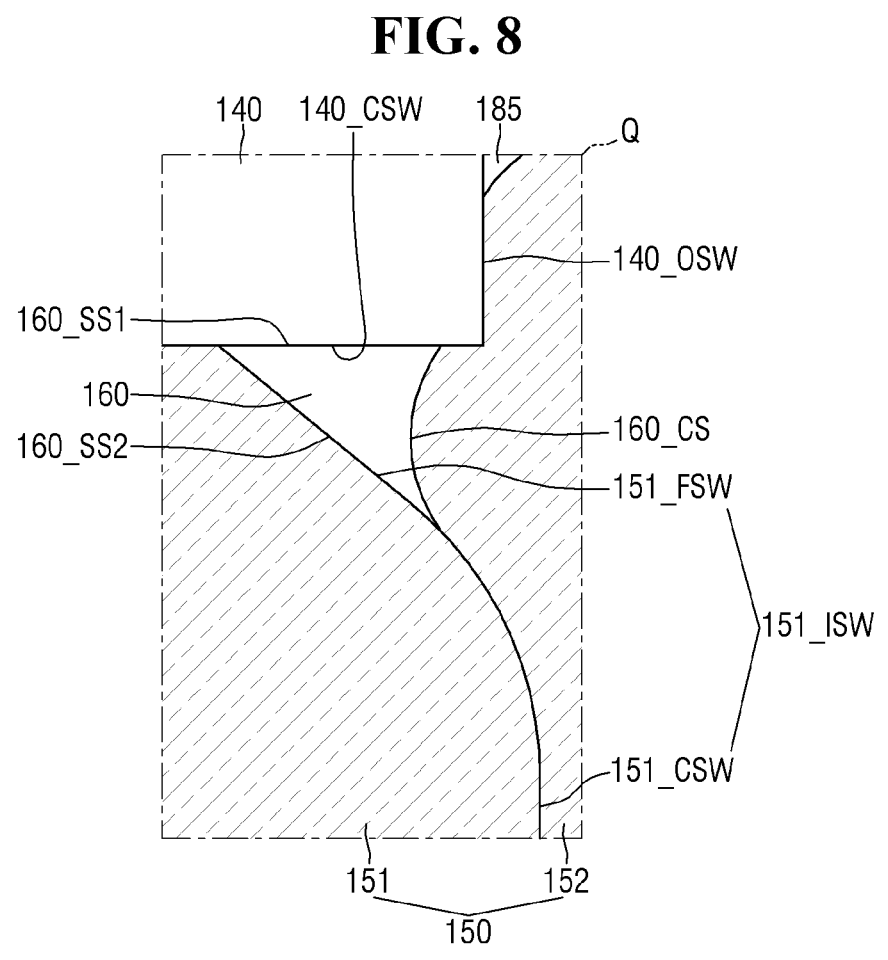

FIG. 1 is an illustrative plan view for describing a semiconductor device according to some embodiments. FIGS. 2 and 3 are cross-sectional views taken along line A-A and line B-B of FIG. 1, respectively. FIG. 4 is a view for describing a shape of a first sheet pattern of FIG. 2. FIG. 5 is a plan view taken along line C-C of FIG. 2 and viewed from above. FIG. 6 is a plan view taken along line D-D of FIG. 2 and viewed from above. FIG. 7 is an enlarged view of region P of FIG. 2. FIG. 8 is an enlarged view of portion Q of FIG. 5.

For reference, FIG. 1 schematically illustrates a semiconductor device except for a first gate insulating layer 130, an etch stop layer 185, an interlayer insulating layer 190, a wiring structure 205, and the like.

Referring to FIGS. 1 to 8, a semiconductor device according to some embodiments may include first active patterns AP1, a plurality of first gate structures GS1, first source/drain patterns 150, and first side etch blocking patterns 160. The terms "first," "second," "third," etc., may be used herein merely to distinguish one element from another.

A substrate 100 may be bulk silicon or silicon-on-insulator (SOI). Alternatively, the substrate 100 may be a silicon substrate or may include other materials such as silicon germanium, silicon germanium on insulator (SGOI), indium antimonide, a lead tellurium compound, indium arsenide, indium phosphide, gallium arsenide, or gallium antimonide, but is not limited thereto.

The first active pattern AP1 may be disposed on the substrate 100. The first active pattern AP1 may extend in a first direction D1. As an example, the first active pattern AP1 may be disposed in a region where a P-channel metal oxide semiconductor (PMOS) is formed. As another example, the first active pattern AP1 may be disposed in a region where an N-channel metal oxide semiconductor (NMOS) is formed. In the following description, it will be described that the first active pattern AP1 is disposed in the region where the PMOS is formed.

The first active pattern AP1 may be a multi-channel active pattern. The first active pattern AP1 may include a first lower pattern BP1 and a plurality of first sheet patterns NS1. The first lower pattern BP1 may protrude from the substrate 100. The first lower pattern BP1 may extend in the first direction D1.

The plurality of first sheet patterns NS1 may be disposed on an upper surface BP1_US of the first lower pattern. The plurality of first sheet patterns NS1 may be spaced apart from the first lower pattern BP1 in a third direction D3. The respective first sheet patterns NS1 may be spaced apart from each other in the third direction D3.

Each of the first sheet patterns NS1 may include an upper surface NS1_US and a lower surface NS1_BS. The upper surface NS1_US of the first sheet pattern is a surface opposite to the lower surface NS1_BS of the first sheet pattern in the third direction D3. Each of the first sheet patterns NS1 may include first sidewalls NS1_SW1 opposite to each other in the first direction D1 and second sidewalls NS1_SW2 opposite to each other in a second direction D2. The third direction D3 may be a direction crossing the first direction D1 and a second direction D2. For example, the third direction D3 may be a thickness direction of the substrate 100. The first direction D1 may be a direction crossing the second direction D2.

The upper surface NS1_US of the first sheet pattern and the lower surface NS1_BS of the first sheet pattern may be connected to each other by the first sidewalls NS1_SW1 of the first sheet pattern and the second sidewalls NS1_SW2 of the first sheet pattern. The first sidewall NS1_SW1 of the first sheet pattern is connected to and in contact with a first source/drain pattern 150) to be described later. Elements described as "in contact with" may include direct contact therebetween. Elements are described as in "direct" contact or "directly" on or connected have no intervening elements therebetween. The first sidewall NS1_SW1 of the first sheet pattern may include an end of the first sheet pattern NS1. For example, the end of the first sheet pattern NS1 may be positioned at a center line between the upper surface NS1_US of the first sheet pattern and the lower surface NS1_BS of the first sheet pattern, but is not limited thereto.

It has been illustrated that three first sheet patterns NS1 are disposed in the third direction D3, but this is only for convenience of explanation, and the present disclosure is not limited thereto.

The first lower pattern BP1 may be formed by etching a portion of the substrate 100, and may include an epitaxial layer grown from the substrate 100. The first lower pattern BP1 may include silicon or germanium, which is an elemental semiconductor material. In addition, the lower pattern BP1 may include a compound semiconductor, for example, a group IV-IV compound semiconductor or a group III-V compound semiconductor.

The group IV-IV compound semiconductor may be, for example, a binary compound or a ternary compound including two or more of carbon (C), silicon (Si), germanium (Ge), and tin (Sn), or a compound obtained by doping carbon (C), silicon (Si), germanium (Ge), and tin (Sn) with a group IV element.

The group III-V compound semiconductor may be, for example, one of a binary compound, a ternary compound, or a quaternary compound formed by combining at least one of aluminum (Al), gallium (Ga), and indium (In), which are group III elements, with one of phosphorus (P), arsenic (As), and antimony (Sb), which are group V elements, with each other.

The first sheet pattern NS1 may include one of silicon or germanium, which is an elemental semiconductor material, a group IV-IV compound semiconductor, or a group III-V compound semiconductor. Each of the first sheet patterns NS1 may include the same material as the first lower pattern BP1 or include a material different from that of the first lower pattern BP1.

In the semiconductor device according to some embodiments, the first lower pattern BP1 may be a silicon lower pattern including silicon, and the first sheet pattern NS1 may be a silicon sheet pattern including silicon.

Widths of the first sheet patterns NS1 in the second direction D2 may increase or decrease in proportion to a width of the first lower pattern BP1 in the second direction D2. It has been illustrated by way of example that the widths, in the second direction, of the first sheet patterns NS1 stacked in the third direction D3 are the same as each other, but this is only for convenience of explanation, and the present disclosure is not limited thereto. Unlike illustrated in the drawings, the widths, in the second direction D2, of the first sheet patterns NS1 stacked in the third direction D3 may decrease as the first sheet patterns NS1 become distant from the first lower pattern BP1.

A field insulating layer 105 may be formed on the substrate 100. The field insulating layer 105 may be disposed on sidewalls of the first lower pattern BP1. The field insulating layer 105 is not disposed on the upper surface BP1_US of the first lower pattern.

As an example, the field insulating layer 105 may entirely cover the sidewalls of the first lower pattern BP1. Unlike illustrated in the drawings, the field insulating layer 105 may cover portions of the sidewalls of the first lower pattern BP1. In this case, portions of the first lower pattern BP1 may protrude more than an upper surface of the field insulating layer 105 in the third direction D3.

Each of the first sheet patterns NS1 is disposed at a respective level above the upper surface of the field insulating layer 105. The field insulating layer 105 may include, for example, an oxide layer, a nitride layer, an oxynitride layer, or a combination thereof. It has been illustrated that the field insulating layer 105 is a single layer, but this is only for convenience of explanation, and the present disclosure is not limited thereto.

The plurality of first gate structures GS1 may be disposed on the substrate 100. Each of the first gate structures GS1 may extend in the second direction D2. The first gate structures GS1 may be disposed to be spaced apart from each other in the first direction D1 The first gate structures GS1 may be adjacent to each other in the first direction D1 For example, the first gate structures GS1 may be disposed on both sides of the first source/drain pattern 150 in the first direction D1.

The first gate structure GS1 may be disposed on the first active pattern AP1. The first gate structure GS1 may cross the first active pattern AP1. The first gate structure GS1 may cross the first lower pattern BP1. The first gate structure GS1 may surround each of the first sheet patterns NS1. The first gate structure GS1 may include, for example, a first gate electrode 120, a first gate insulating layer 130, a first gate spacer 140, and a first gate capping pattern 145.

The first gate structure GS1 may include a plurality of inner gate structures INT1_GS1, INT2_GS1, and INT3_GS1 disposed between the first sheet patterns NS1 adjacent to each other in the third direction D3 and between the first lower pattern BP1 and the first sheet pattern NS1. The inner gate structures INT1_GS1, INT2_GS1, and INT3_GS1 may be disposed between the upper surface BP1_US of the first lower pattern and the lower surface NS1_BS of the first lowermost sheet pattern and between the upper surface NS1_US of the first sheet pattern and the lower surface NS1_BS of the first sheet pattern facing each other in the third direction D3. For example, the number of inner gate structures INT1_GS1, INT2_GS1, and INT3_GS1 may be the same as the number of first sheet patterns NS1.

The inner gate structures INT1_GS1, INT2_GS1, and INT3_GS1 are in contact with the upper surface BP1_US of the first lower pattern, the upper surface NS1_US of the first sheet pattern, and the lower surface NS1_BS of the first sheet pattern. The inner gate structures INT1_GS1, INT2_GS1, and INT3_GS1 may be in direct contact with a first source/drain pattern 150 to be described later.

The first gate structure GS1 may include a first inner gate structure INT1_GS1, a second inner gate structure INT2_GS1, and a third inner gate structure INT3_GS1. The first inner gate structure INT1_GS1, the second inner gate structure INT2_GS1, and the third inner gate structure INT3_GS1 may be sequentially disposed on the first lower pattern BP1.

The third inner gate structure INT3_GS1 may be disposed between the first lower pattern BP1 and the first sheet pattern NS1. The third inner gate structure INT3_GS1 may be disposed at the lowermost portion among the inner gate structures INT1_GS1, INT2_GS1, and INT3_GS1. The third inner gate structure INT3_GS1 may be the lowermost inner gate structure.

The first inner gate structure INT1_GS1 and the second inner gate structure INT2_GS1 may be disposed between the first sheet patterns NS1 adjacent to each other in the third direction D3. The first inner gate structure INT1_GS1 may be disposed at the uppermost portion among the inner gate structures INT1_GS1, INT2_GS1, and INT3_GS1. The first inner gate structure INT1_GS1 may be the uppermost inner gate structure. The second inner gate structure INT2_GS1 is disposed between the first inner gate structure INT1_GS1 and the third inner gate structure INT3_GS1.

The inner gate structures INT1_GS1, INT2_GS1, and INT3_GS1 include first gate electrodes 120 and first gate insulating layers 130 disposed between the first sheet patterns NS1 adjacent to each other and between the first lower pattern BP1 and the first sheet pattern NS1.

As an example, a width of the first inner gate structure INT1_GS1 in the first direction D1 may be the same as a width of the second inner gate structure INT2_GS1 in the first direction D1. A width of the third inner gate structure INT3_GS1 in the first direction D1 may be the same as a width of the second inner gate structure INT2_GS1 in the first direction D1.

As another example, a width of the third inner gate structure INT3_GS1 in the first direction D1 may be greater than a width of the second inner gate structure INT2_GS1 in the first direction D1. A width of the first inner gate structure INT1_GS1 in the first direction D1 may be the same as a width of the second inner gate structure INT2_GS1 in the first direction D1.

Taking the second inner gate structure INT2_GS1 as an example, the width of the second inner gate structure INT2_GS1 may be measured in the middle between the upper surface NS1_US of the first sheet pattern and the lower surface NS1_BS of the first sheet pattern facing each other in the third direction D3.

For reference, a plan view at a level (i.e., a height relative to the substrate 100 or other reference feature) of the second inner gate structure INT2_GS1 is illustrated in FIG. 5. A plan view at a level of the first lowermost sheet pattern NS1 most adjacent to the first lower pattern BP1 among the first sheet patterns NS1 is illustrated in FIG. 6. Although not illustrated in the drawings, when a portion where a first source/drain contact 180 is formed is excluded, plan views at levels of the other inner gate structures INT1_GS1 and INT3_GS1 may be similar to FIG. 5. Although not illustrated in the drawings, when the portion where the first source/drain contact 180 is formed is excluded, plan views at levels of the other first sheet patterns NS1 may be similar to FIG. 6.

The first gate electrode 120 may be disposed on the first lower pattern BP1. The first gate electrode 120 may cross the first lower pattern BP1. The first gate electrode 120 may surround the first sheet patterns NS1. Portions of the first gate electrode 120 may be disposed between the first sheet patterns NS1 adjacent to each other and between the first lower pattern BP1 and the first sheet pattern NS1.

The first gate electrode 120 may include at least one of a metal, a metal alloy, conductive metal nitride, metal silicide, a doped semiconductor material, conductive metal oxide, and conductive metal oxynitride. The first gate electrode 120 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt)), nickel platinum (Ni-Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof, but is not limited thereto. The conductive metal oxide and the conductive metal oxynitride may include oxidized forms of the above-described materials, but are not limited thereto.

The first gate electrodes 120 may be disposed on both sides of a first source/drain pattern 150 to be described later. The first gate structures GS1 may be disposed on both sides of the first source/drain pattern 150 in the first direction D1.

As an example, both of the first gate electrodes 120 disposed on both sides of the first source/drain pattern 150 may be normal gate electrodes used as gates of transistors. As another example, the first gate electrode 120 disposed on one side of the first source/drain pattern 150 may be used as a gate of a transistor, but the first gate electrode 120 disposed on the other side of the first source/drain pattern 150 may be a dummy gate electrode.

The first gate insulating layer 130 may extend along the upper surface of the field insulating layer 105 and the upper surface BP1_US of the first lower pattern. The first gate insulating layer 130 may surround the plurality of first sheet patterns NS1. The first gate insulating layer 130 may be disposed along circumferences of the first sheet patterns NS1. The first gate electrode 120 is disposed on the first gate insulating layer 130. The first gate insulating layer 130 is disposed between the first gate electrode 120 and the first sheet patterns NS1. Portions of the first gate insulating layer 130 may be disposed between the first sheet patterns NS1 adjacent to each other in the third direction D3 and between the first lower pattern BP1 and the first sheet pattern NS1.

The first gate insulating layer 130 may include silicon oxide, silicon-germanium oxide, germanium oxide, silicon oxynitride, silicon nitride, or a high-k material having a dielectric constant greater than that of the silicon oxide. The high-k material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

It has been illustrated that the first gate insulating layer 130 is a single layer, but this is only for convenience of explanation, and the present disclosure is not limited thereto. The first gate insulating layer 130 may include a plurality of layers. The first gate insulating layer 130 may include an interfacial layer disposed between the first sheet pattern NS1 and the first gate electrode 120 and a high-k insulating layer.

The semiconductor device according to some embodiments may include a negative capacitance (NC) FET using a negative capacitor. For example, the first gate insulating layer 130 may include a ferroelectric material layer having ferroelectric characteristics and a paraelectric material layer having paraelectric characteristics.

The ferroelectric material layer may have a negative capacitance, and the paraelectric material layer may have a positive capacitance. For example, when two or more capacitors are connected to each other in series and capacitances of respective capacitors have a positive value, a total capacitance decreases as compared with a capacitance of each individual capacitor. On the other hand, when at least one of capacitances of two or more capacitors connected to each other in series has a negative value, a total capacitance may have a positive value and be greater than an absolute value of each individual capacitance.

When the ferroelectric material layer having negative capacitance and the paraelectric material layer having positive capacitance are connected to each other in series, the total capacitance value of the ferroelectric material layer and the paraelectric material layer connected to each other in series may increase. A transistor including the ferroelectric material layer may have a subthreshold swing (SS) less than 60 mV/decade at room temperature using the increase in the total capacitance value.

The ferroelectric material layer may have ferroelectric characteristics. The ferroelectric material layer may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material layer may further include a dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). A type of dopant included in the ferroelectric material layer may change depending on a type of ferroelectric material included in the ferroelectric material layer.

When the ferroelectric material layer includes hafnium oxide, the dopant included in the ferroelectric material layer may include, for example, at least one of gadolinium (Gd), silicon (Si), zirconium (Zr), aluminum (Al), and yttrium (Y).

When the dopant is aluminum (Al), the ferroelectric material layer may include 3 to 8 atomic % (at %) of aluminum. Here, a ratio of the dopant may be a ratio of aluminum to the sum of hafnium and aluminum.

When the dopant is silicon (Si), the ferroelectric material layer may include 2 to 10 at % of silicon. When the dopant is yttrium (Y), the ferroelectric material layer may include 2 to 10 at % of yttrium. When the dopant is gadolinium (Gd), the ferroelectric material layer may include 1 to 7 at % of gadolinium. When the dopant is zirconium (Zr), the ferroelectric material layer may include 50 to 80 at % of zirconium.

The paraelectric material layer may have the paraelectric characteristics. The paraelectric material layer may include, for example, at least one of silicon oxide and metal oxide having a high dielectric constant. The metal oxide included in the paraelectric material layer may include, for example, at least one of hafnium oxide, zirconium oxide, and aluminum oxide, but is not limited thereto.

The ferroelectric material layer and the paraelectric material layer may include the same material. The ferroelectric material layer may have ferroelectric characteristics, but the paraelectric material layer may not have ferroelectric characteristics. For example, when the ferroelectric material layer and the paraelectric material layer include hafnium oxide, a crystal structure of the hafnium oxide included in the ferroelectric material layer is different from a crystal structure of the hafnium oxide included in the paraelectric material layer.

The ferroelectric material layer may have a thickness having ferroelectric characteristics. The thickness of the ferroelectric material layer may be, for example, 0.5 to 10 nm, but is not limited thereto. Since a critical thickness to produce ferroelectric characteristics may be different for each ferroelectric material, the thickness of the ferroelectric material layer may change depending on the ferroelectric material.

As an example, the first gate insulating layer 130 may include one ferroelectric material layer. As another example, the first gate insulating layer 130 may include a plurality of ferroelectric material layers spaced apart from each other. The first gate insulating layer 130 may have a stacked layer structure in which a plurality of ferroelectric material layers and a plurality of paraelectric material layers are alternately stacked.

The first gate spacer 140 may be disposed on a sidewall of the first gate electrode 120. The first gate spacer 140 may not be disposed between the first lower pattern BP1 and the first sheet pattern NS1 and between the first sheet patterns NS1 adjacent to each other in the third direction D3.

The first gate spacer 140 may include an inner sidewall 140_ISW, a connection sidewall 140_CSW, and an outer sidewall 140_OSW. The inner sidewall 140_ISW of the first gate spacer faces the sidewall of the first gate electrode 120 extending in the second direction D2. The inner sidewall 140_ISW of the first gate spacer may extend in the second direction D2. The inner sidewall 140_ISW of the first gate spacer may be a surface opposite the outer sidewall 140_OSW of the first gate spacer facing a first interlayer insulating layer 190. The connection sidewall 140_CSW of the first gate spacer connects the inner sidewall 140_ISW2 of the first gate spacer and the outer sidewall 140_OSW of the first gate spacer to each other. The connection sidewall 140_CSW of the first gate spacer may extend in the first direction D1.

The first gate insulating layer 130 may extend along the inner sidewall 140_ISW of the first gate spacer. The first gate insulating layer 130 may be in contact with the inner sidewall 140_ISW of the first gate spacer.

The first gate spacer 140 may include, for example, at least one of silicon nitride (SiN), silicon oxynitride (SiON), silicon oxide ($SiO_2$), silicon oxycarbonitride (SiOCN), silicon boron nitride (SiBN), silicon oxy boronitride (SiOBN), silicon oxycarbide (SiOC), and combinations thereof. It has been illustrated that the first gate spacer 140 is a single layer, but this is only for convenience of explanation, and the present disclosure is not limited thereto.

The first gate capping pattern 145 may be disposed on the first gate electrode 120 and the first gate spacer 140. An upper surface of the first gate capping pattern 145 may be coplanar with an upper surface of the interlayer insulating layer 190. Unlike illustrated in the drawings, the first gate capping pattern 145 may be disposed between the first gate spacers 140.

The first gate capping pattern 145 may include, for example, at least one of silicon nitride (SiN), silicon oxynitride (SiON), silicon carbonitride (SiCN), silicon oxycarbonitride (SiOCN), and combinations thereof. The first gate capping pattern 145 may include a material having an etch selectivity with respect to the interlayer insulating layer 190.

The first source/drain pattern 150 may be disposed on the first active pattern AP1. The first source/drain pattern 150 may be disposed on the first lower pattern BP1. The first source/drain pattern 150 is connected to the first sheet patterns NS1.

The first source/drain pattern 150 may be disposed on a side of the first gate structure GS1. The first source/drain pattern 150 may be disposed between the first gate structures GS1 adjacent to each other in the first direction D1. For example, the first source/drain patterns 150 may be disposed on both sides of the first gate structure GS1. In contrast to the illustration in the drawings, the first source/drain pattern 150 may be disposed on one side of the first gate structure GS1 and may not be disposed on the other side of the first gate structure GS1.

The first source/drain pattern 150 may be included in a source/drain of a transistor using the first sheet pattern NS1 as a channel region.

The first source/drain pattern 150 may be disposed in a first source/drain recess 150R. The first source/drain recess 150R extends in the third direction D3. The first source/drain recess 150R may be defined between the first gate structures GS1 adjacent to each other in the first direction D1.

A bottom surface of the first source/drain recess 150R is defined by the first lower pattern BP1. Sidewalls of the first source/drain recess 150R may be defined by the first sheet patterns NS1 and the inner gate structures INT1_GS1, INT2_GS1, and INT3_GS1 The inner gate structures INT1_GS1, INT2_GS1, and INT3_GS1 may define portions of the sidewalls of the first source/drain recess 150R. In FIGS. 5 and 6, the first source/drain recess 150R includes the connection sidewall 140_CSW of the first gate spacer.

The inner gate structures INT1_GS1, INT2_GS1, and INT3_GS1 may include upper surfaces facing the lower surfaces NS1_BS of the first sheet patterns. The inner gate structures INT1_GS1, INT2_GS1, and INT3_GS1 include lower surfaces facing the upper surfaces NS1_US of the first sheet patterns or the upper surface BP1_US of the first lower pattern. The inner gate structures INT1_GS1, INT2_GS1, and INT3_GS1 include sidewalls connecting the upper surfaces of the inner gate structures INT1_GS1, INT2_GS1, and INT3_GS1 and the lower surfaces of the inner gate structures INT1_GS1, INT2_GS1, and INT3_GS1 to each other. The sidewalls of the inner gate structures INT1_GS1, INT2_GS1, and INT3_GS1 may define portions of the sidewalls of the first source/drain recess 150R.

Between the first sheet pattern NS1 disposed at the lowermost portion and the first lower pattern BP1, a boundary between the first gate insulating layer 130 and the first lower pattern BP1 may be the upper surface BP1_US of the first lower pattern. The upper surface BP1_US of the first lower pattern may be a boundary between the third inner gate structure INT3_GS1 and the first lower pattern BP1.

Width extension regions 150R_ER of the first source/drain recess may be defined between the first sheet patterns NS1 adjacent to each other in the third direction D3. The width extension region 150R_ER of the first source/drain recess may be defined between the first lower pattern BP1 and the first sheet pattern NS1. The width extension regions 150R_ER of the first source/drain recess may extend between the first sheet patterns NS1 adjacent to each other in the third direction D3. The width extension regions 150R_ER of the first source/drain recess may be defined between the inner gate structures INT1_GS1, INT2_GS1, and INT3_GS1 adjacent to each other in the first direction D1.

The width extension region 150R_ER of each of the first source/drain recesses may include a portion where a width thereof in the first direction D1 increases and a portion where a width thereof in the first direction D1 decreases as it moves away from the upper surface BP1_US of the first lower pattern. For example, the width of the width extension region 150R_ER of the first source/drain recess may increase and then decrease in the direction away from the upper surface BP1_US of the first lower pattern.

In the width extension region 150R_ER of each of the first source/drain recesses, a point where the width extension region 150R_ER of the first source/drain recess has a maximum width is positioned between the first sheet pattern NS1 and the first lower pattern BP1 or between the first sheet patterns NS1 adjacent to each other in the third direction D3.

The first source/drain pattern 150 may be in contact with the first sheet pattern NS1 and the first lower pattern BP1. A portion of the first source/drain pattern 150 may be in contact with the connection sidewall 140_CSW of the first gate spacer. The first gate insulating layers 130 of the inner gate structures INT1_GS1, INT2_GS1, and INT3_GS1 may be in contact with the first source/drain pattern 150.

The first source/drain pattern 150 may include an epitaxial pattern. The first source/drain pattern 150 includes a semiconductor material. The first source/drain pattern 150 may include a first semiconductor liner layer 151 and a first semiconductor filling layer 152. It has been illustrated that the first semiconductor filling layer 152 is a single layer, but this is only for convenience of explanation, and the present disclosure is not limited thereto.

The first semiconductor liner layer 151 may be continuously formed along the first source/drain recess 150R. The first semiconductor liner layer 151 may be formed along the sidewalls of the first source/drain recess 150R and the bottom surface of the first source/drain recess 150R. The first semiconductor liner layer 151 formed along the first source/drain recess 150R defined by the first sheet patterns NS1 is directly connected to the first semiconductor liner layer 151 formed along the first source/drain recess 150R defined by the inner gate structures INT1_GS1, INT2_GS1, and INT3_GS1. The first semiconductor liner layer 151 is in contact with the first gate insulating layers 130, the first sheet patterns NS1, and the first lower pattern BP1.

The first semiconductor liner layer 151 may include an outer sidewall 151_OSW and an inner sidewall 151_ISW. The outer sidewall 151_OSW of the first semiconductor liner layer 151 is in contact with the first gate insulating layers 130, the first sheet patterns NS1, and the first lower pattern BP1. The outer sidewall 151_OSW of the first semiconductor liner layer is directly connected to the first sidewalls NS1_SW1 of the first sheet patterns. The outer sidewall 151_OSW of the first semiconductor liner layer is in contact with the sidewalls of the inner gate structures INT1_GS1, INT2_GS1, and INT3_GS1. The outer sidewall 151_OSW of the first semiconductor liner layer may represent a profile of the first source/drain recess 150R.

The inner sidewall 151_ISW of the first semiconductor liner layer may be a surface opposite to the outer sidewall 151_OSW of the first semiconductor liner layer. In FIGS. 5 and 6, the first semiconductor liner layer 151 may include a portion where a width thereof in the second direction D2 decreases in the direction away from the outer sidewall 151_OSW of the first semiconductor liner layer 151. The inner sidewall 151_ISW of the first semiconductor liner layer may include a facet surface 151_FSW and a connection surface 151_CSW.

The facet surface 151_FSW of the inner sidewall 151_ISW of the first semiconductor liner layer may extend from the connection sidewall 140_CSW of the first gate spacer. The facet surface 151_FSW of the inner sidewall 151_ISW of the first semiconductor liner layer may form an acute angle with the connection sidewall 140_CSW of the first gate spacer. The first semiconductor liner layer 151 includes the facet surface 151_FSW extending from the connection sidewall 140_CSW of the first gate spacer. The facet surface 151_FSW of the inner sidewall 151_ISW of the first semiconductor liner layer may be a facet surface of the first semiconductor liner layer 151.

The connection surface 151_CSW of the inner sidewall 151_ISW of the first semiconductor liner layer may extend in the second direction D2. The connection surface 151_CSW of the inner sidewall 151_ISW of the first semiconductor liner layer may include a curved portion.

It has been illustrated in FIGS. 2, 5 and 6 that a thickness, in the first direction D1, of the first semiconductor liner layer 151 in contact with the first sidewalls NS1_SW1 of the first sheet patterns is smaller than a thickness, in the first direction D1, of the first semiconductor liner layer 151 in contact with the inner gate structures INT1_GS1, INT2_GS1, and INT3_GS1, but the present disclosure is not limited thereto.

The first semiconductor liner layer 151 may include, for example, silicon-germanium. The first semiconductor liner layer 151 may include a silicon-germanium layer. The first semiconductor liner layer 151 may include doped p-type impurities. For example, the p-type impurities may be boron (B), but are not limited thereto.

The first semiconductor filling layer 152 is disposed on the first semiconductor liner layer 151. The first semiconductor filling layer 152 is in contact with the first semiconductor liner layer 151. In FIG. 2, the first semiconductor filling layer 152 may fill the remainder of the first source/drain recess 150R.

The first semiconductor filling layer 152 is disposed on the inner sidewall 151_ISW of the first semiconductor liner layer. For example, the first semiconductor filling layer 152 may be in contact with the inner sidewall 151_ISW of the first semiconductor liner layer.

The first semiconductor filling layer 152 may cover a portion of the inner sidewall 151_ISW of the first semiconductor liner layer. In FIGS. 5 and 6, the first semiconductor filling layer 152 may not cover at least a portion of the facet surface 151_FSW of the inner sidewall 151_ISW of the first semiconductor liner layer. The first semiconductor filling layer 152 may cover at least a portion of the connection surface 151_CSW of the inner sidewall 151_ISW of the first semiconductor liner layer.

The first semiconductor filling layer 152 may include, for example, silicon-germanium. The first semiconductor filling layer 152 may include a silicon-germanium layer. The first semiconductor filling layer 152 may include doped p-type impurities. A fraction of germanium in the first semiconductor liner layer 151 is smaller than a fraction of germanium in the first semiconductor filling layer 152.

Although not illustrated in the drawings, as an example, a semiconductor capping layer including silicon may be disposed on the first semiconductor filling layer 152. As another example, a semiconductor capping layer including silicon germanium may be disposed on the first semiconductor filling layer 152. In this case, a fraction of germanium in the semiconductor capping layer may be smaller than a fraction of germanium in the first semiconductor filling layer 152.

The first side etch blocking pattern 160 is disposed between the first gate spacer 140 and the first source/drain pattern 150. The first side etch blocking pattern 160 may be disposed between the first gate spacer 140 and the first semiconductor liner layer 151.

In FIGS. 5 and 6, the first side etch blocking pattern 160 may extend along the third direction D3 between the first gate spacer 140 and the first source/drain pattern 150.

In FIGS. 2 and 5, the first side etch blocking pattern 160 is disposed between the inner gate structures INT1_GS1, INT2_GS1, and INT3_GS1 and the first semiconductor filling layer 152.

The first side etch blocking pattern 160 is disposed between the connection sidewall 140_CSW of the first gate spacer and the facet surface 151_FSW of the inner sidewall 151_ISW of the first semiconductor liner layer. That is, the first side etch blocking pattern 160 is disposed between the connection sidewall 140_CSW of the first gate spacer and the facet surface of the first semiconductor liner layer 151.

The first side etch blocking pattern 160 is in contact with the first gate spacer 140 and the first source/drain pattern 150. For example, the first side etch blocking pattern 160 is in direct contact with the first gate spacer 140 and the first source/drain pattern 150. The first side etch blocking pattern 160 is in contact with the connection sidewall 140_CSW of the first gate spacer and the facet surface 151_FSW of the inner sidewall 151_ISW of the first semiconductor liner layer.

A width of the first side etch blocking pattern 160 in the second direction D2 may increase in the direction away from the first gate electrode 120. In the plan view; the first side etch blocking pattern 160 may have a substantially triangular shape.

The first side etch blocking pattern 160 may include at least one substantially linear surface (referred to herein with reference to a first inclined surface 160_SS1, and a second inclined surface 160_SS2), and a (non-linear) connection surface 160_CS. The first inclined surface 160_SS1 of the first side etch blocking pattern faces the connection sidewall 140_CSW of the first gate spacer. The first inclined surface 160_SS1 of the first side etch blocking pattern is in contact with the connection sidewall 140_CSW of the first gate spacer. The second inclined surface 160_SS2 of the first side etch blocking pattern faces the facet surface of the first semiconductor liner layer 151. The second inclined surface 160_SS2 of the first side etch blocking pattern is in contact with the facet surface of the first semiconductor liner layer 151.

The connection surface 160_CS of the first side etch blocking pattern connects the first inclined surface 160_SS1 of the first side etch blocking pattern and the second inclined surface 160_SS2 of the first side etch blocking pattern to each other. According to some embodiments, the entirety of the connection surface 160_CS of the first side etch blocking pattern may be in contact with the first source/drain pattern 150. For example, the entirety of the connection surface 160_CS of the first side etch blocking pattern may be in contact with the first semiconductor filling layer 152.

In FIG. 5, the first side etch blocking pattern 160 may protrude toward the first gate electrode 120 less than the outer sidewall 151_OSW of the first semiconductor liner layer. In FIG. 6, the first side etch blocking pattern 160 protrudes toward the first sheet pattern NS1 less than the outer sidewall 151_OSW of the first semiconductor liner layer.

In the plan view; the first side etch blocking pattern 160 covers at least a portion of the facet surface of the first semiconductor liner layer 151. The first semiconductor filling layer 152 may be in contact with a portion of the facet surface of the first semiconductor liner layer 151. In contrast to the illustration in the drawings, when the first side etch blocking pattern 160 covers the entirety of the facet surface of the first semiconductor liner layer 151, the first semiconductor filling layer 152 is not contact with the facet surface of the first semiconductor liner layer 151.

In FIG. 5, a maximum width of the first semiconductor liner layer 151 in the second direction D2 is a first width W11. A width, in the second direction D2, of an interface between the first semiconductor liner layer 151 and the first semiconductor filling layer 152 is a second width W21. Since the first side etch blocking pattern 160 covers a portion of the inner sidewall 151_ISW of the first semiconductor liner layer, the first width W11 is greater than the second width W21. Here, the interface between the first semiconductor liner layer 151 and the first semiconductor filling layer 152 is a contact surface between the first semiconductor liner layer 151 and the first semiconductor filling layer 152.

In FIG. 6, a maximum width of the first semiconductor liner layer 151 in the second direction D2 is a third width W12. A width, in the second direction D2, of the interface between the first semiconductor liner layer 151 and the first semiconductor filling layer 152 is a fourth width W22. The third width W12 is greater than the fourth width W22.

In FIG. 5, a thickness or dimension of the first side etch blocking pattern 160 in the first direction D1 is a first thickness T11. In FIG. 6, a thickness or dimension of the first side etch blocking pattern 160 in the first direction D1 is a second thickness T12. It has been illustrated in FIGS. 5 and 6 that the thickness T11 of the first side etch blocking pattern 160 at a level of the inner gate structure is greater than the thickness T12 of the first side etch blocking pattern 160 at a level of the first sheet pattern, but this is only for convenience of explanation, and the present disclosure is not limited thereto.

As an example, the first side etch blocking pattern 160 may include an insulating material. For example, the first side etch blocking pattern 160 may include at least one of silicon nitride and silicon carbide, but is not limited thereto. As another example, the first side etch blocking pattern 160 may include a semiconductor material. For example, the first side etch blocking pattern 160 may include silicon, but is not limited thereto. As another example, the first side etch blocking pattern 160 may include a metal.

In the following description, the first side etch blocking pattern 160 includes an insulating material. For example, the first side etch blocking pattern 160 may include silicon nitride.

Figure 48:
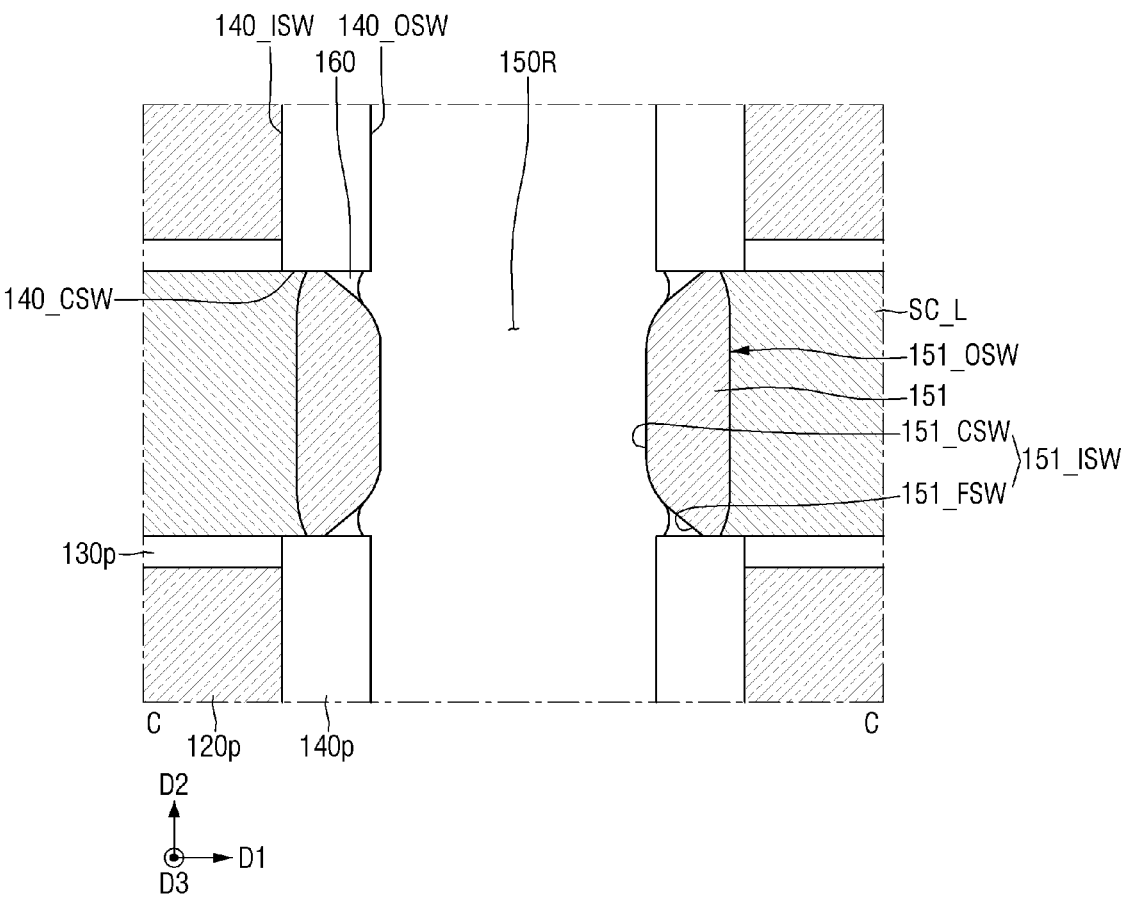
Figure 53:
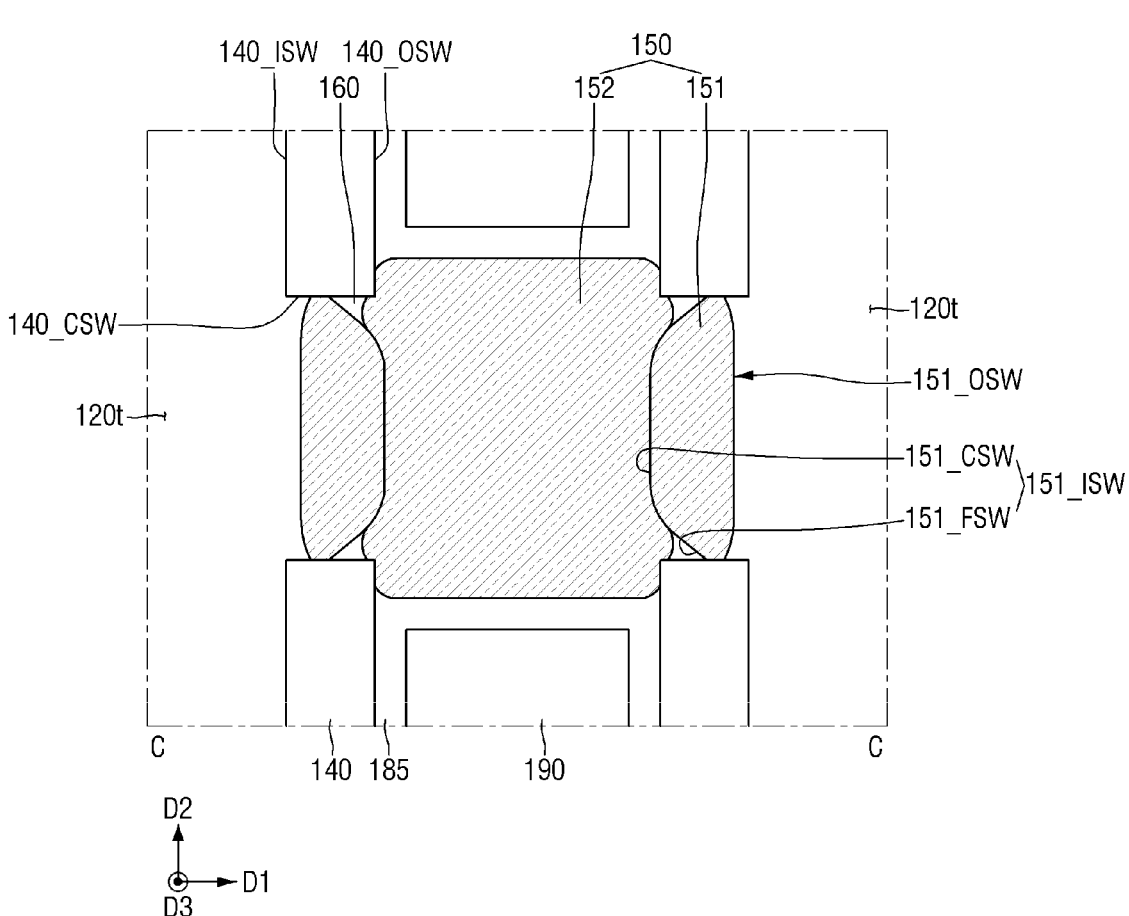

In FIGS. 48 and 53, while a sacrificial pattern SC_L is removed, an etchant for removing the sacrificial pattern SC_L may permeate through the vicinity of the connection sidewall 140_CSW of the first gate spacer. The permeating etchant etches the first semiconductor filling layer 152, and thus, reliability and performance of the semiconductor device may be deteriorated.

However, the first side etch blocking pattern 160 is formed between the first gate spacer 140 and the first semiconductor liner layer 151, and thus, the permeation of the etchant through the vicinity of the connection sidewall 140_CSW of the first gate spacer may be prevented. Therefore, the first side etch blocking pattern 160 may prevent the first semiconductor filling layer 152 from being etched by the etchant.

A source/drain etch stop layer 185 may extend along the outer sidewall 140_OSW of the first gate spacer and a profile of the first source/drain pattern 150. Although not illustrated in the drawings, the source/drain etch stop layer 185 may be disposed on the upper surface of the field insulating layer 105.

The source/drain etch stop layer 185 may include a material having an etch selectivity with respect to a first interlayer insulating layer 190 to be described later. The source/drain etch stop layer 185 may include, for example, at least one of silicon nitride (SiN), silicon oxynitride (SiON), silicon oxycarbonitride (SiOCN), silicon boron nitride (SiBN), silicon oxy boronitride (SiOBN), silicon oxycarbide (SiOC), and combinations thereof.

The first interlayer insulating layer 190 may be disposed on the source/drain etch stop layer 185. The first interlayer insulating layer 190 may be disposed on the first source/drain pattern 150. The first interlayer insulating layer 190 may not cover the upper surface of the first gate capping pattern 145. For example, an upper surface of the first interlayer insulating layer 190 may be coplanar with the upper surface of the first gate capping pattern 145.

The first interlayer insulating layer 190 may include, for example, at least one of silicon oxide, silicon nitride, silicon oxynitride, and a low-k material. The low-k material may include, for example, fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiary butosiloxane (DADBS), trimethylsilil phosphate (TMSP), polytetrafluoroethylene (PTFE), tonen silazen (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or combinations thereof, but is not limited thereto.

The first source/drain contact 180 is disposed on the first source/drain pattern 150. The first source/drain contact 180 is connected to the first source/drain pattern 150. The first source/drain contact 180 may pass through the first interlayer insulating layer 190 and the source/drain etch stop layer 185 to be connected to the first source/drain pattern 150.

A first metal silicide layer 155 may be further disposed between the first source/drain contact 180 and the first source/drain pattern 150.

It has been illustrated that the first source/drain contact 180 is a single layer, but this is only for convenience of explanation, and the present disclosure is not limited thereto. The first source/drain contact 180 may include, for example, at least one of a metal, a metal alloy, conductive metal nitride, conductive metal carbide, conductive metal oxide, conductive metal carbonitride, and a two-dimensional (2D) material.

The first metal silicide layer 155 may include metal silicide.

A second interlayer insulating layer 191 is disposed on the first interlayer insulating layer 190. The second interlayer insulating layer 191 may include, for example, at least one of silicon oxide, silicon nitride, silicon oxynitride, and a low-k material.

A wiring structure 205 is disposed in the second interlayer insulating layer 191. The wiring structure 205 may be connected to the first source/drain contact 180. The wiring structure 205 may include a wiring line 207 and a wiring via 206.

It has been illustrated that the wiring line 207 and the wiring via 206 are separated from each other, but this is only for convenience of explanation, and the present disclosure is not limited thereto. That is, as an example, after the wiring via 206 is formed, the wiring line 207 may be formed. As another example, the wiring via 206 and the wiring line 207 may be formed at the same time.

It has been illustrated that each of the wiring line 207 and the wiring via 206 is a single layer, but this is only for convenience of explanation, and the present disclosure is not limited thereto. Each of the wiring lines 207 and the wiring vias 206 may include, for example, at least one of a metal, a metal alloy, conductive metal nitride, conductive metal carbide, conductive metal oxide, conductive metal carboni-tride, and a two-dimensional (2D) material.

For example, an upper surface of the first source/drain contact 180 at a portion connected to the wiring structure 205 may be coplanar with an upper surface of the first source/drain contact 180 at a portion that is not connected to the wiring structure 205.

Figure 9:
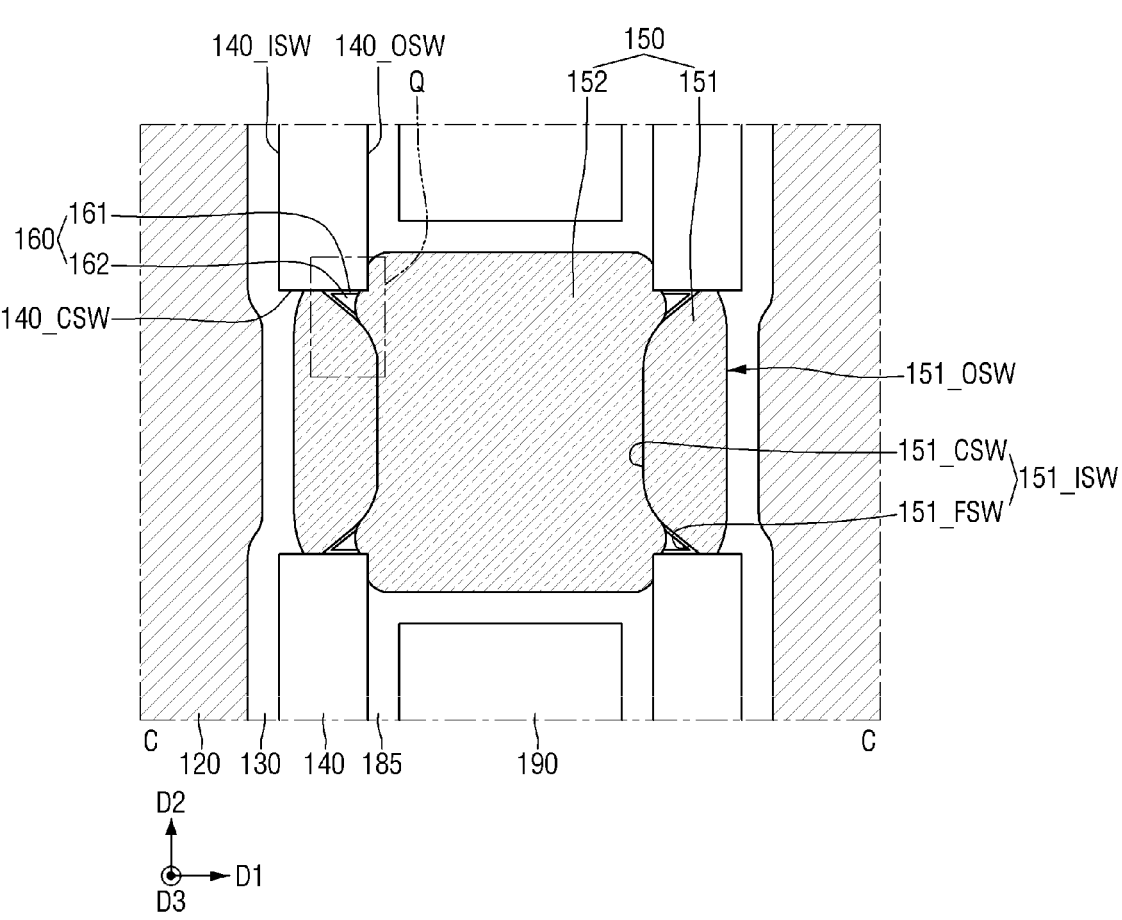
Figure 11:
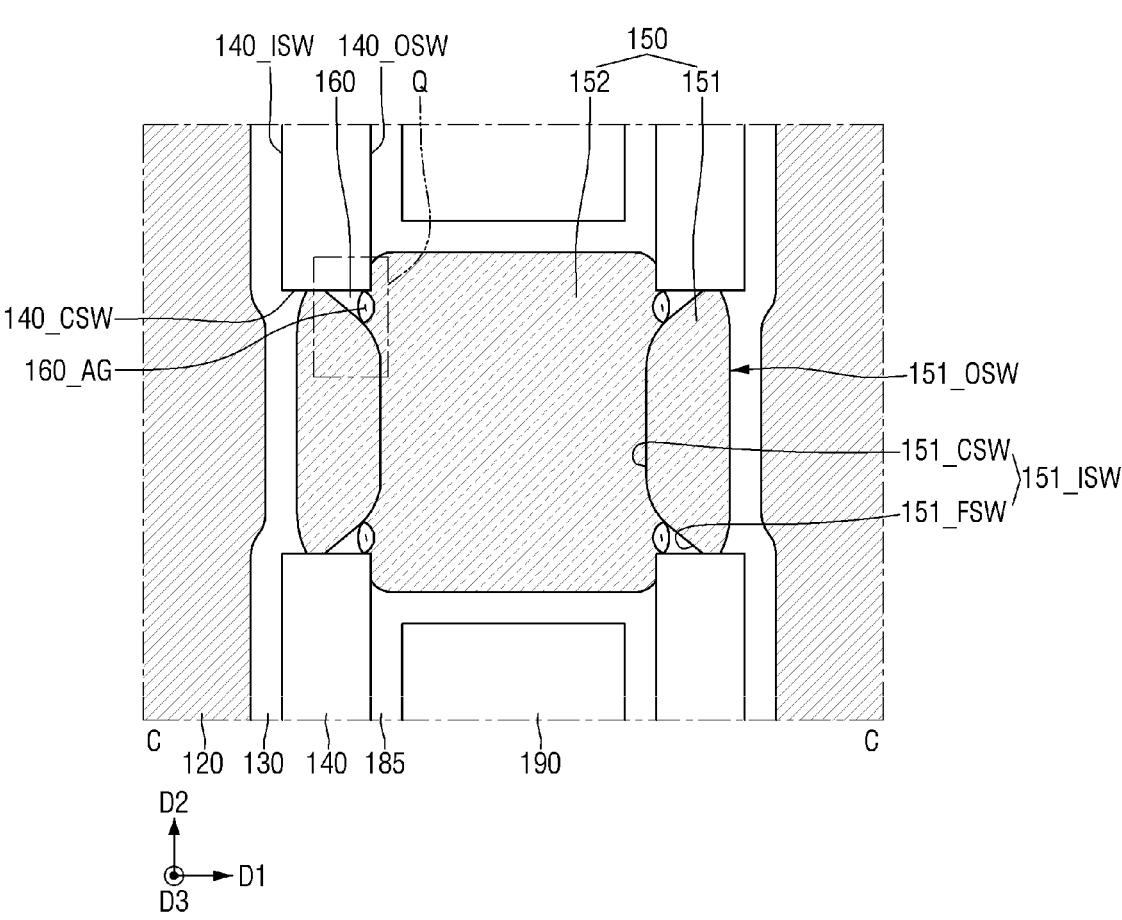

FIGS. 9 and 10 are views for describing a semiconductor device according to some embodiments. FIGS. 11 and 12 are views for describing a semiconductor device according to some embodiments. For convenience of explanation, contents different from those described with reference to FIGS. 1 to 8 will be mainly described. For reference, FIGS. 9 and 11 are plan views taken along line C-C of FIG. 2 and viewed from above. FIG. 10 is an enlarged view of portion Q of FIG. 9, and FIG. 12 is an enlarged view of portion Q of FIG. 11.

Referring to FIGS. 9 and 10, in a semiconductor device according to some embodiments, the first side etch blocking pattern 160 may include an etch blocking liner 161 and an etch blocking filling layer 162.

The etch blocking liner 161 extends along the connection sidewall 140_CSW of the first gate spacer and the facet surface of the first semiconductor liner layer 151. The etch blocking liner 161 extends along the facet surface 151_FSW of the inner sidewall 151_ISW of the first semiconductor liner layer.

The etch blocking liner 161 includes a first inclined surface 160_SS1 of the first side etch blocking pattern and a second inclined surface 160_SS2 of the first side etch blocking pattern.

The etch blocking peeling layer 162 is disposed on the etch blocking liner 161. The etch blocking filling layer 162 is disposed between the etch blocking liner 161 and the first semiconductor filling layer 152. A portion of a connection surface 160_CS of the first side etch blocking pattern is defined by the etch blocking filling layer 162.

The etch blocking liner 161 may include, for example, silicon oxide, but is not limited thereto. The etch blocking filling layer 162 may include, for example, silicon nitride, but is not limited thereto.

Referring to FIGS. 11 and 12, in the semiconductor device according to some embodiments, the first source/drain pattern 150 may include a side air gap 160_AG.

The side air gap 160_AG may be disposed between the first side etch blocking pattern 160 and the first semiconductor filling layer 152. At least a portion of the connection surface 160_CS of the first side etch blocking pattern is not in contact with the first semiconductor filling layer 152.

Although not illustrated in the drawings, in the plan view at a level of the first sheet pattern NS1, the side surface air gap 160_AG may be disposed between the first side etch blocking pattern 160 and the first semiconductor filling layer 152. The side air gap 160_AG may extend in the third direction D3 between the first side etch blocking pattern 160 and the first semiconductor filling layer 152.

It has been illustrated in FIG. 11 that the number of side air gaps 160_AG is the same as the number of first side etch blocking patterns 160, but the present disclosure is not limited thereto. The number of side air gaps 160_AG may be smaller than the number of first side etch blocking patterns 160.

Figure 13:
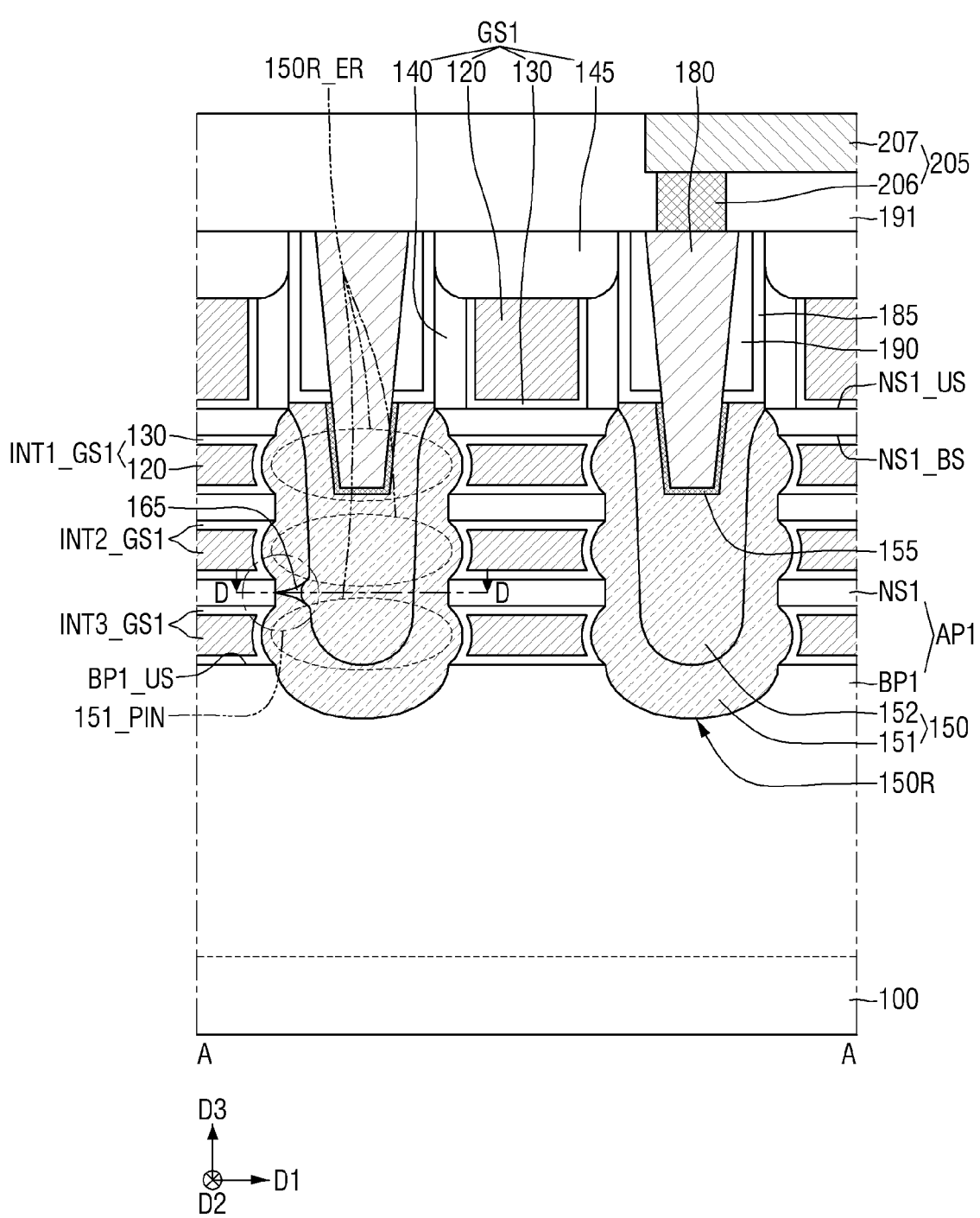
Figure 14:
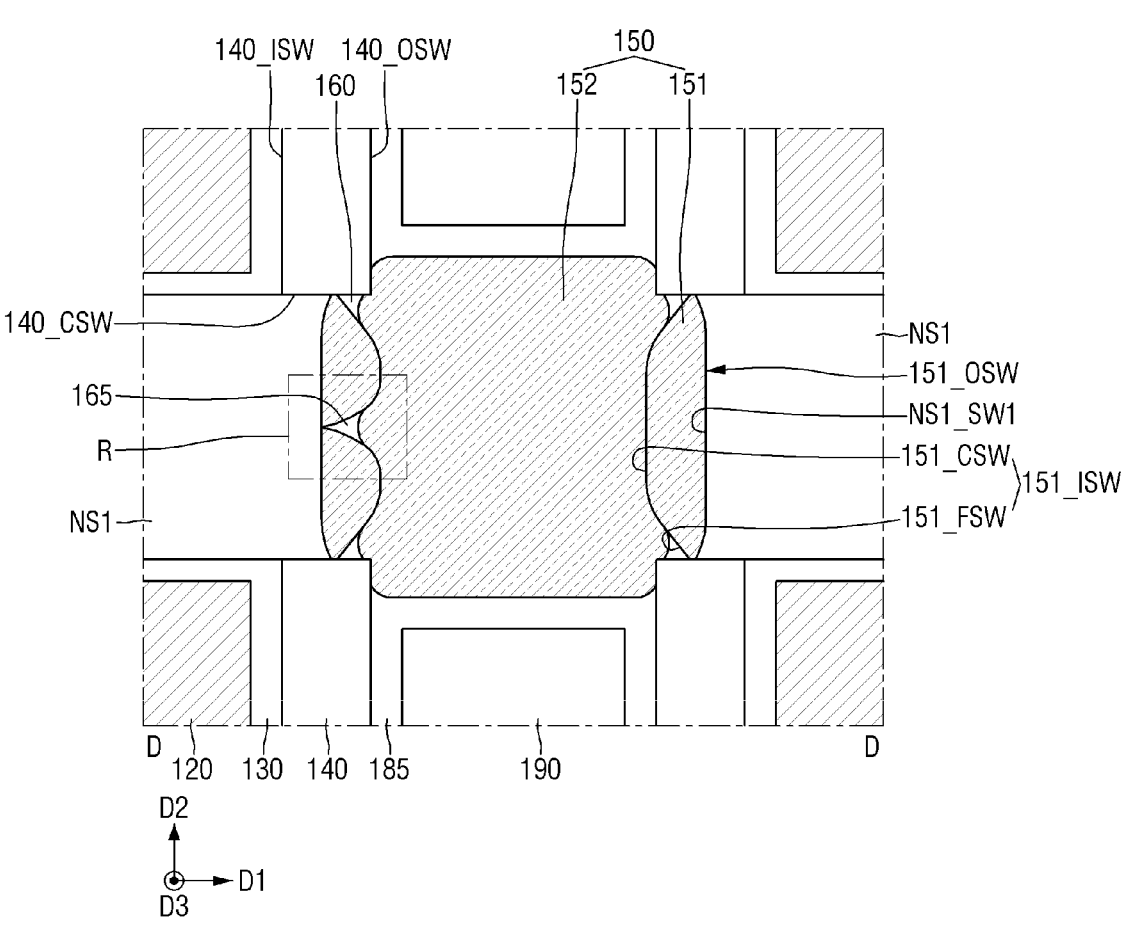
Figure 15:
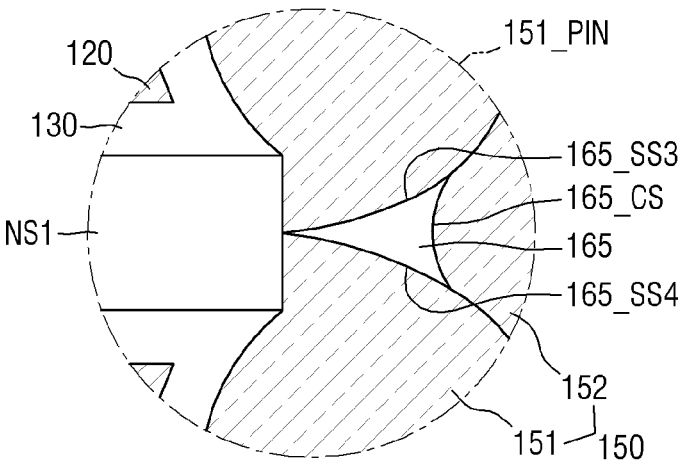

FIGS. 13 to 16 are views for describing a semiconductor device according to some embodiments. For convenience of explanation, contents different from those described with reference to FIGS. 1 to 8 will be mainly described. For reference, FIG. 14 is a plan view taken along line D-D of FIG. 13 and viewed from above. FIG. 15 is an enlarged view of a pinning region 151_PIN of FIG. 13, and FIG. 16 is an enlarged view of portion R of FIG. 14.

Referring to FIGS. 13 to 16, a semiconductor device according to some embodiments may further include a first internal etch blocking pattern 165 disposed in the first source/drain pattern 150.

The first semiconductor liner layer 151 may include pinning regions 151_PIN. The first semiconductor liner layer 151 extending along the sidewalls of the first source/drain recess 150R may include the pinning regions 151_PIN. For example, the pinning regions 151_PIN may be formed at positions overlapping the first sheet patterns NS1 in the first direction D1.

In the cross-sectional view as illustrated in FIG. 3, a thickness of the first semiconductor liner layer 151 in the pinning region 151_PIN may rapidly decrease. In the pinning region 151_PIN, the thickness of the first semiconductor liner layer 151 decreases and then increases as it moves away from the first lower pattern BP1.

In the plan view as illustrated in FIG. 14, the inner sidewall 151_ISW of the first semiconductor liner layer in the pinning region 151_PIN may be divided into two portions. For example, in the pinning region 151_PIN, the inner sidewall 151_ISW of the first semiconductor liner layer may meet the outer sidewall 151_OSW of the first semiconductor liner layer. Unlike illustrated in FIG. 14, in the pinning region 151_PIN, the inner sidewall 151_ISW of the first semiconductor liner layer may be spaced apart from the outer sidewall 151_OSW of the first semiconductor liner layer in the first direction D1.

It has been illustrated that one first semiconductor liner layer 151 includes one pinning region 151_PIN, but the present disclosure is not limited thereto. One first semiconductor liner layer 151 may also include a plurality of pinning regions 151_PIN.

It has been illustrated that some of the first source/drain patterns 150 include the pinning regions 151_PIN and the others of the first source/drain patterns 150 do not include the pinning regions 151_PIN, but the present disclosure is not limited thereto.

Unlike illustrated in the drawings, the pinning regions 151_PIN may be formed at positions overlapping the inner gate structures INT1_GS1, INT2_GS1, and INT3_GS1 in the first direction D1.

The first internal etch blocking pattern 165 may be disposed in the pinning region 151_PIN. The first internal etch blocking pattern 165 is disposed between the first semiconductor liner layer 151 and the first semiconductor filling layer 152. The first internal etch blocking pattern 165 is in direct contact with the first semiconductor liner layer 151.

In the plan view; a width of the first internal etch blocking pattern 165 in the second direction D2 may increase in the direction away from the first gate electrode 120 and the first sheet pattern NS1. The first internal etch blocking pattern 165 may have a substantially triangular shape. The first internal etch blocking pattern 165 may include a first inclined surface 165_SS1, a second inclined surface 165_SS2, and a connection surface 165_CS. The first inclined surface 165_SS1 of the first internal etch blocking pattern and the second inclined surface 165_SS2 of the first internal etch blocking pattern are in contact with the first semiconductor liner layer 151. The connection surface 165_CS of the first internal etch blocking pattern connects the first inclined surface 165_SS1 of the first internal etch blocking pattern and the second inclined surface 165_SS2 of the first internal etch blocking pattern to each other.

In the cross-sectional view, a width of the first internal etch blocking pattern 165 in the third direction D3 may increase in the direction away from the first gate electrode 120 and the first sheet pattern NS1. The first internal etch blocking pattern 165 may have a triangular shape. The first internal etch blocking pattern 165 may include a third inclined surface 165_SS3 and a fourth inclined surface 165_SS4. The third inclined surface 165_SS3 of the first internal etch blocking pattern and the fourth inclined surface 165_SS4 of the first internal etch blocking pattern are in contact with the first semiconductor liner layer 151. The connection surface 165_CS of the first internal etch blocking pattern connects the third inclined surface 165_SS3 of the first internal etch blocking pattern and the fourth inclined surface 165_SS4 of the first internal etch blocking pattern to each other.

In the semiconductor device according to some embodiments, the entirety of the connection surface 165_CS of the first internal etch blocking pattern may be in contact with the first semiconductor filling layer 152.

The first internal etch blocking pattern 165 includes the same material as the first side surface etch blocking pattern 160. When the first side etch blocking pattern 160 has a multilayer structure as illustrated in FIG. 9, the first internal etch blocking pattern 165 has the same multilayer structure as the first side etch blocking pattern 160.

Figure 17:
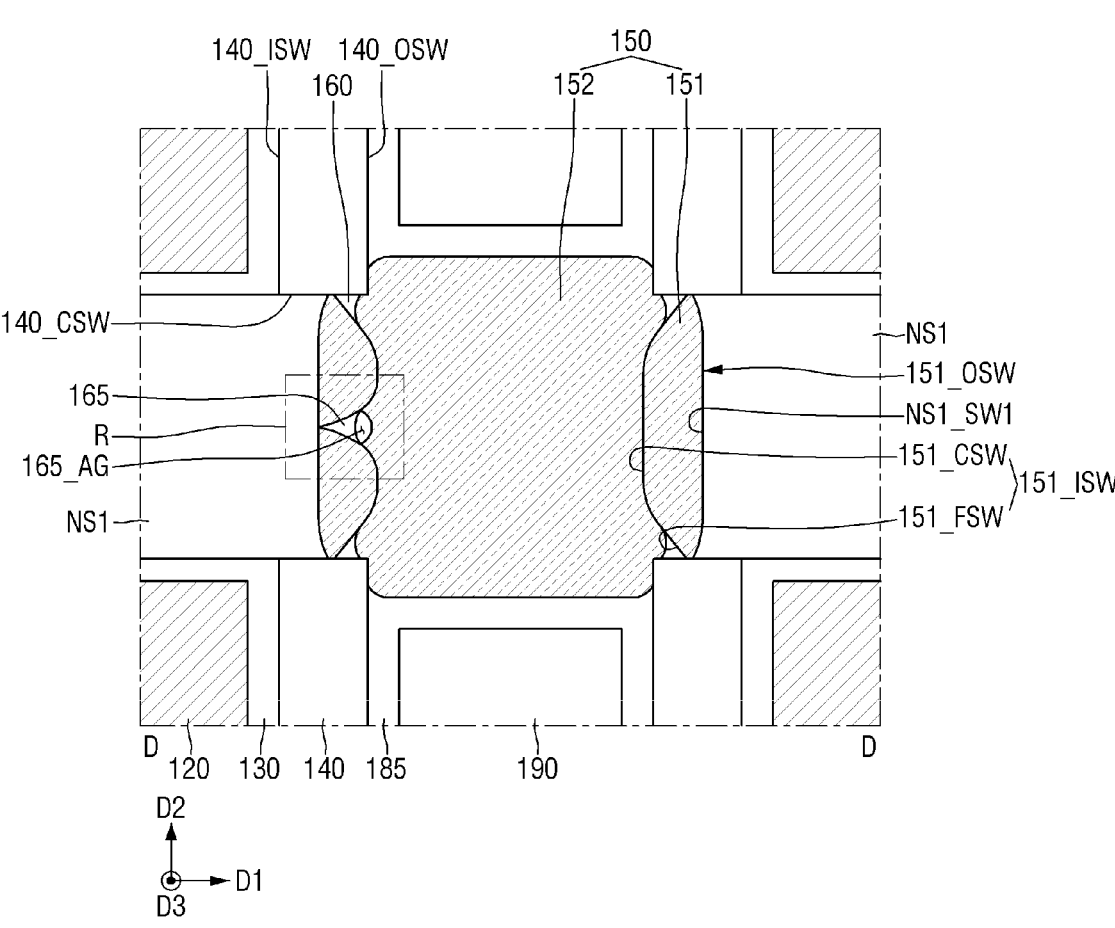
Figure 18:
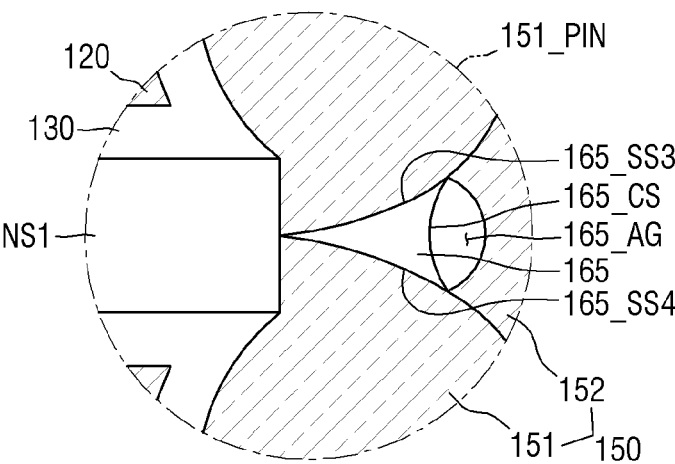
Figure 19:
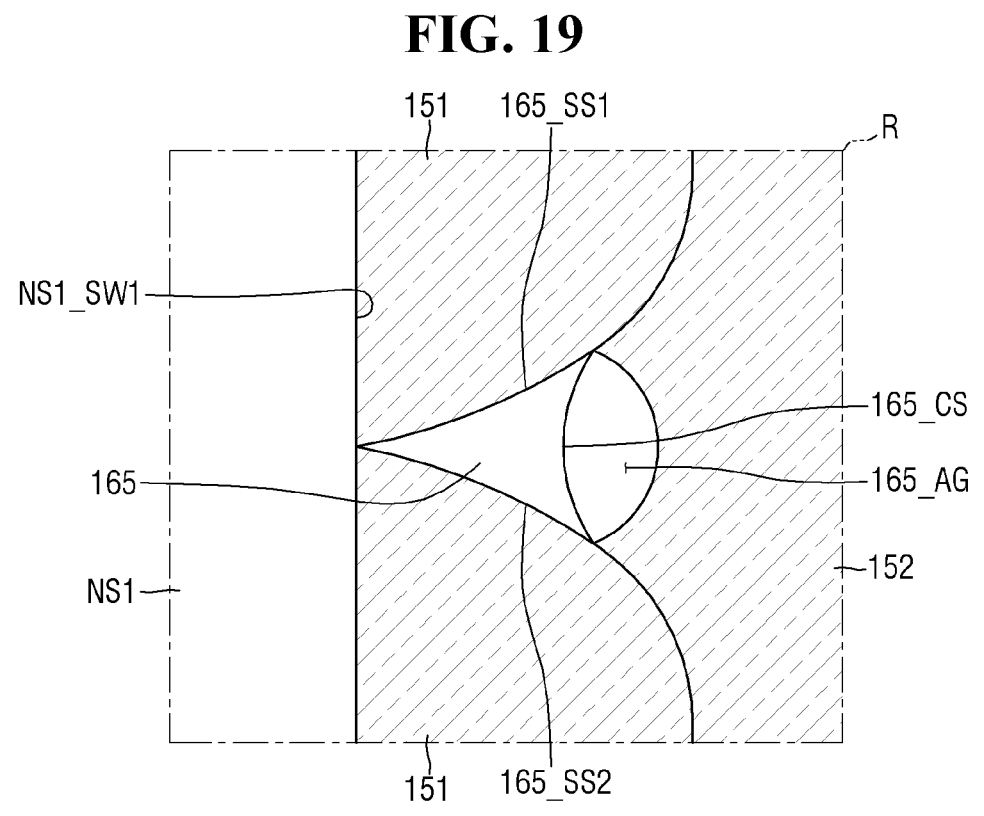

FIGS. 17 to 19 are views for describing a semiconductor device according to some embodiments. For convenience of explanation, contents different from those described with reference to FIGS. 13 to 16 will mainly be described. For reference, FIG. 17 is a plan view taken along line D-D of FIG. 13 and viewed from above. FIG. 18 is an enlarged view of a pinning region 151_PIN of FIG. 13, and FIG. 19 is an enlarged view of portion R of FIG. 17.

Referring to FIGS. 17 to 19, in a semiconductor device according to some embodiments, the first source/drain pattern 150 may include an internal air gap 165_AG.

The internal air gap 165_AG may be disposed between the first internal etch blocking pattern 165 and the first semiconductor filling layer 152. At least a portion of the connection surface 165_CS of the first internal etch blocking pattern is not in contact with the first semiconductor filling layer 152.

Although not illustrated in the drawings, in a plan view at the level of the inner gate structure, the internal air gap 165_AG may be disposed between the first internal etch blocking pattern 165 and the first semiconductor filling layer 152.

Figure 20:
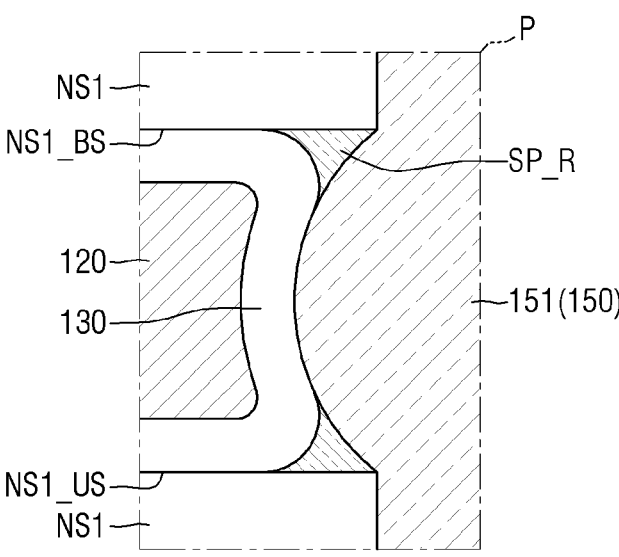
FIGS. 20 and 21 are views for describing a semiconductor device according to some embodiments.
Figure 21:
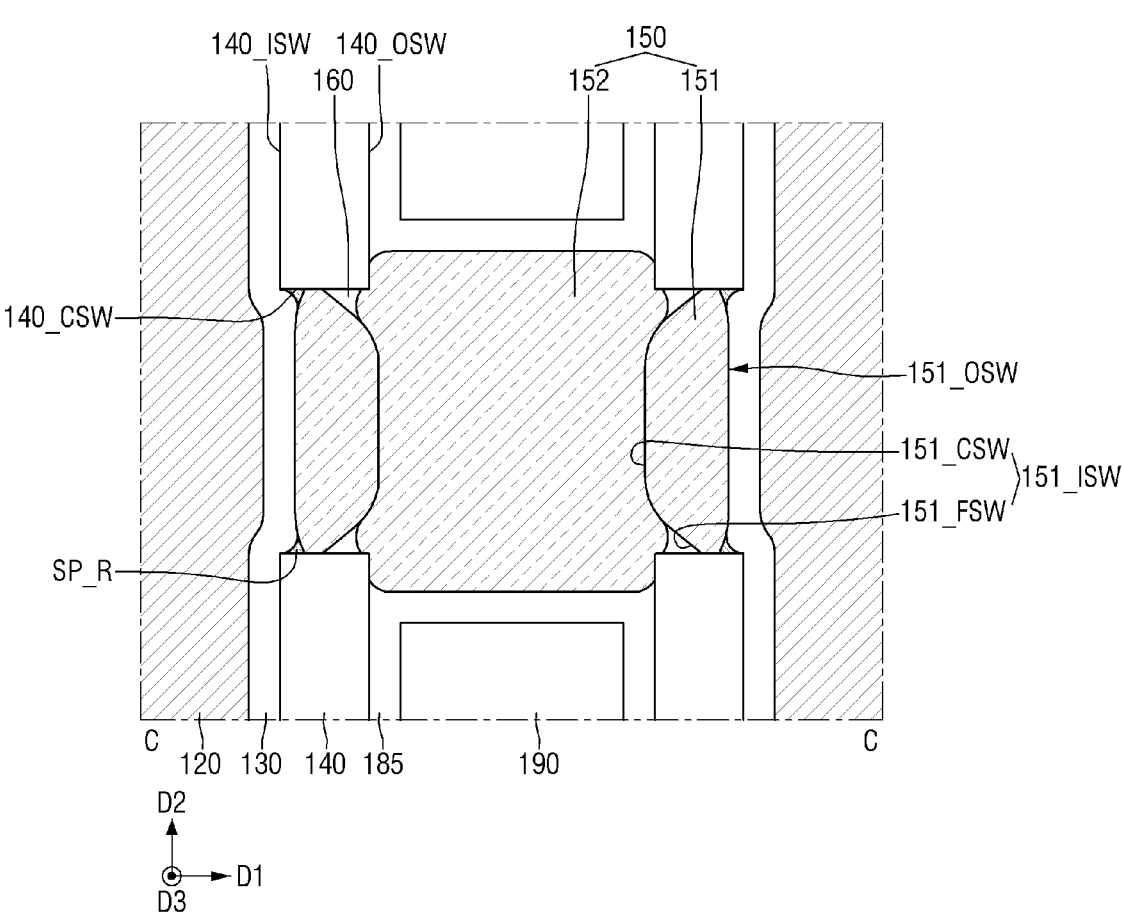
Figure 22:
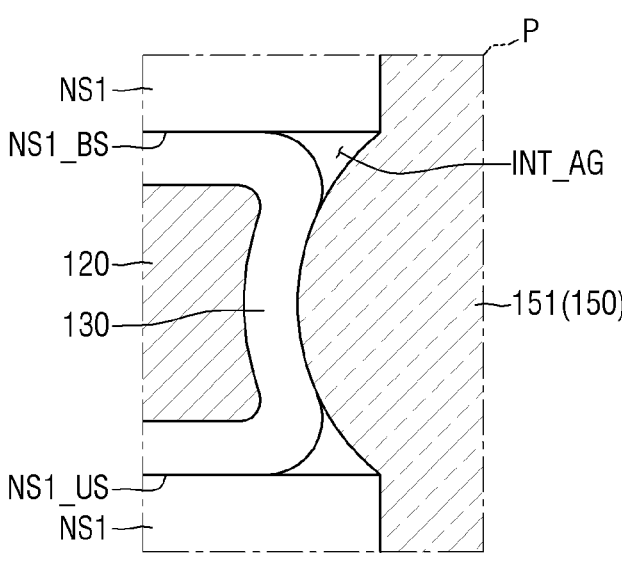
FIGS. 22 and 23 are views for describing a semiconductor device according to some embodiments.
Figure 23:
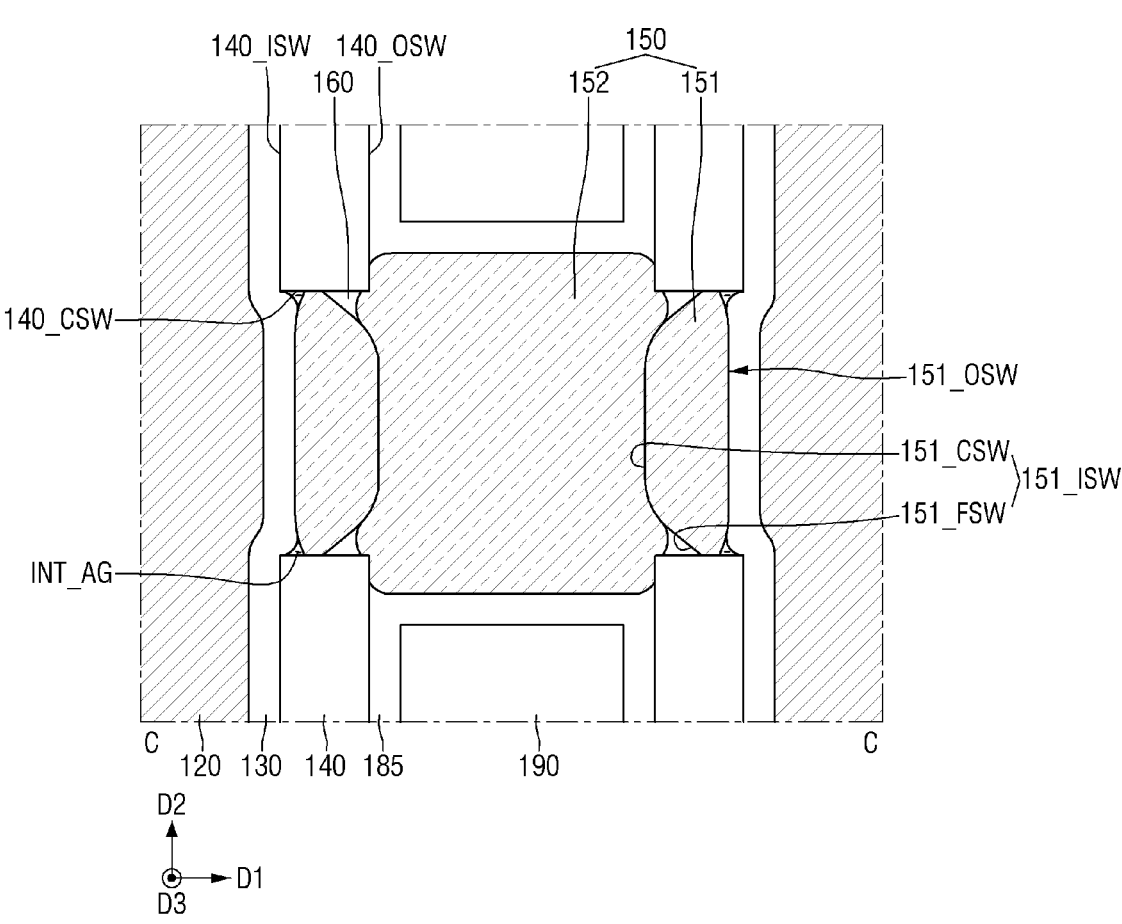

FIGS. 20 and 21 are views for describing a semiconductor device according to some embodiments. FIGS. 22 and 23 are views for describing a semiconductor device according to some embodiments. For convenience of explanation, contents different from those described with reference to FIGS. 1 to 8 will be mainly described. For reference, FIGS. 20 and 22 are enlarged views of portion P of FIG. 2. FIGS. 21 and 23 are plan views taken along line C-C of FIG. 2 and viewed from above.

Referring to FIGS. 2, 20, and 21, a semiconductor device according to some embodiments may further include semiconductor residue patterns SP_R disposed between the inner gate structures INT1_GS1, INT2_GS1, and INT3_GS1 and the first semiconductor liner layer 151.

In a cross-sectional view as illustrated in FIG. 20, the semiconductor residue pattern SP_R may be in contact with the first sheet pattern NS1. The semiconductor residue pattern SP_R may be in contact with the outer sidewall 151_OSW of the first semiconductor liner layer and the sidewalls of the inner gate structures INT1_GS1, INT2_GS1, and INT3_GS1.

In a plan view as illustrated in FIG. 21, the semiconductor residue patterns SP_R may be in contact with the outer sidewall 151_OSW of the first semiconductor liner layer, the sidewalls of the inner gate structures INT1_GS1, INT2_GS1, and INT3_GS1, and the connection sidewall 140_CSW of the first gate spacer.

The semiconductor residue pattern SP_R may include, for example, silicon-germanium. A fraction of germanium in the semiconductor residue pattern SP_R is greater than the fraction of germanium in the first semiconductor liner layer 151. The semiconductor residue pattern SP_R may be a residue remaining after a sacrificial pattern SC_L (see FIG. 48) is removed.

Unlike described above, as an example, the semiconductor residue patterns SP_R may appear in the cross-sectional view as illustrated in FIG. 20, but may not appear in the plan view as illustrated FIG. 21. As another example, the semiconductor residue patterns SP_R may appear in the plan view as illustrated in FIG. 21, but may not appear in the cross-sectional view as illustrated in FIG. 20.

Referring to FIGS. 2, 22, and 23, a semiconductor device according to some embodiments may further include inner gate air gaps INT_AG disposed between the inner gate structures INT1_GS1, INT2_GS1, and INT3_GS1 and the first semiconductor liner layer 151.

In a cross-sectional view as illustrated in FIG. 22, the inner gate air gaps INT_AG may be disposed between the first semiconductor liner layer 151 and the first gate insulating layers 130 of the inner gate structures INT1_GS1, INT2_GS1, and INT3_GS1. The inner gate air gaps INT_AG may be defined between the first semiconductor liner layer 151, the first sheet patterns NS1, and the inner gate structures INT1_GS1, INT2_GS1, and INT3_GS1.

In a plan view as illustrated in FIG. 23, the inner gate air gaps INT_AG may be disposed between the first semiconductor liner layer 151, the inner gate structures INT1_GS1, INT2_GS1, and INT3_GS1, and the first gate spacer 140.

Unlike described above, as an example, the inner gate air gaps INT_AG may appear in the cross-sectional view as illustrated in FIG. 22, but may not appear in the plan view as illustrated FIG. 23. As another example, the inner gate air gaps INT_AG may appear in the plan view as illustrated in FIG. 23, but may not appear in the cross-sectional view as illustrated in FIG. 22.

Figure 24:
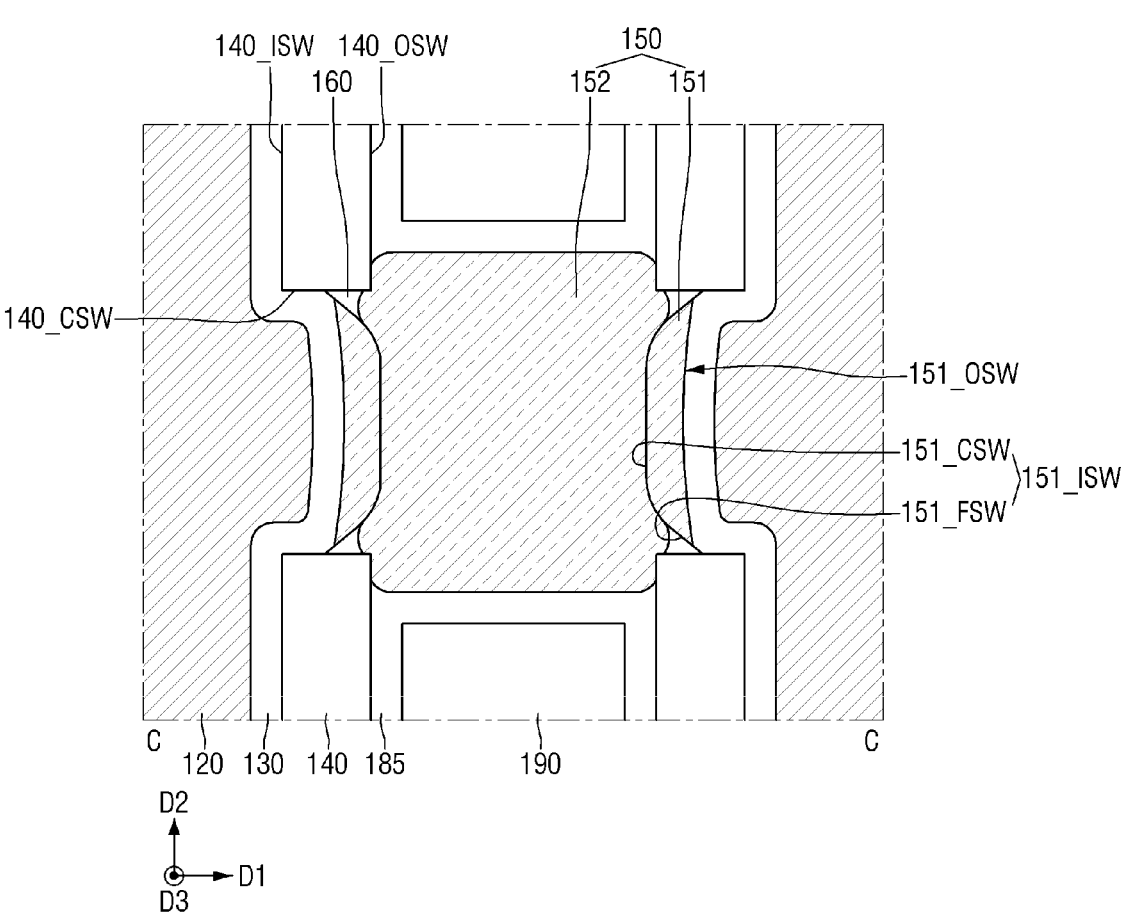
FIG. 24 is a view for describing a semiconductor device according to some embodiments.
Figure 25:
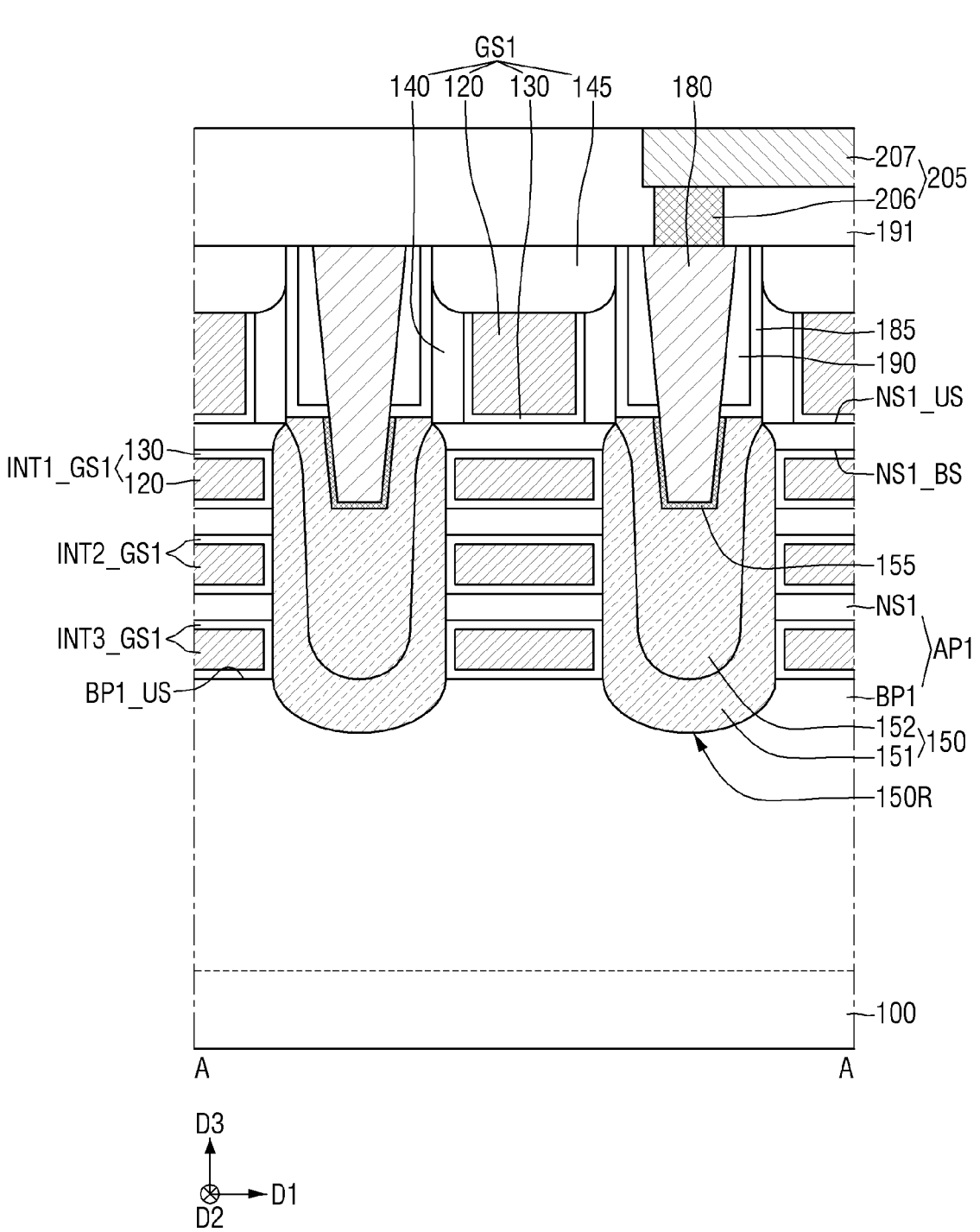
FIGS. 25, 26, and 27 are views for describing semiconductor devices according to some embodiments, respectively.
Figure 26:
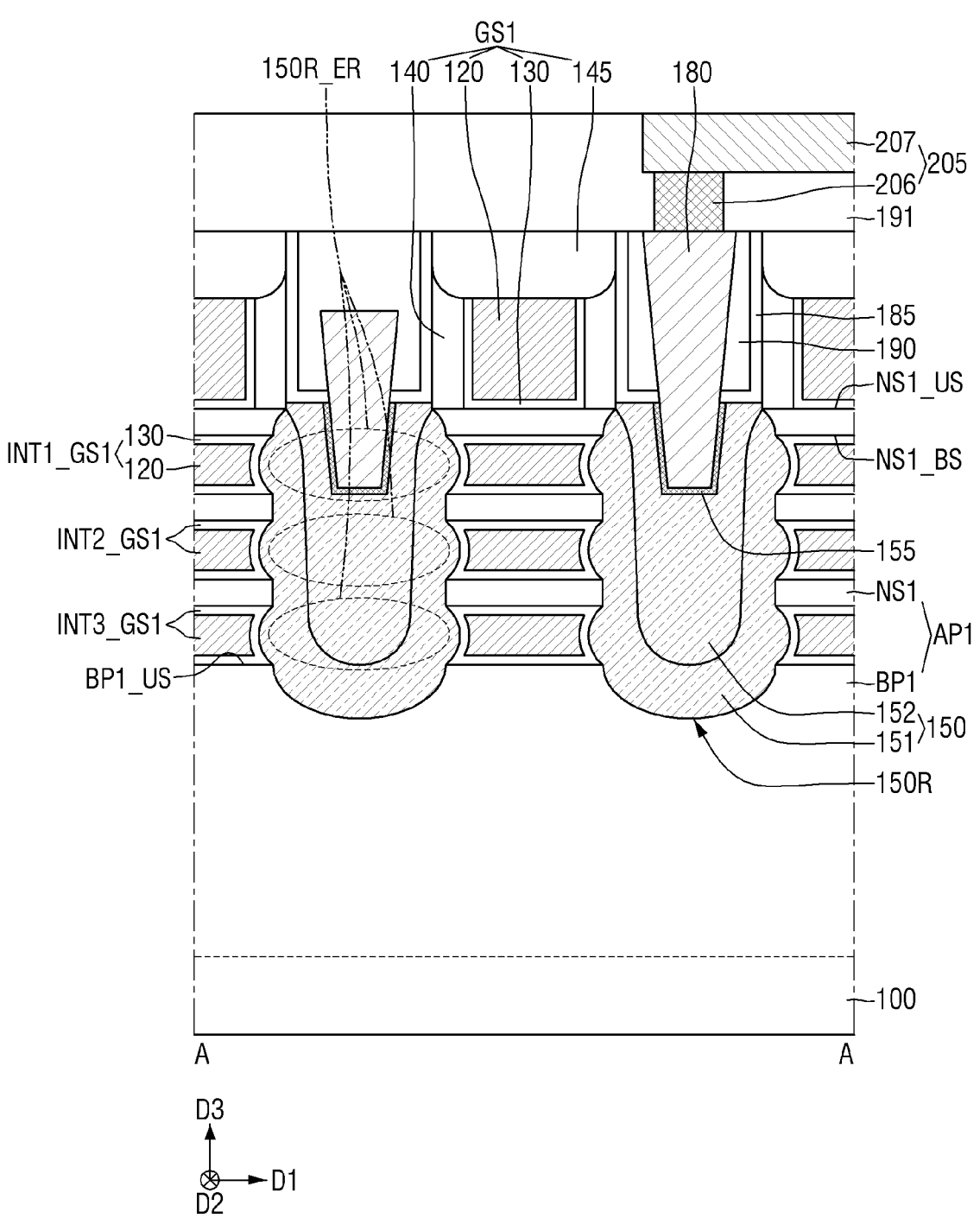
Figure 27:
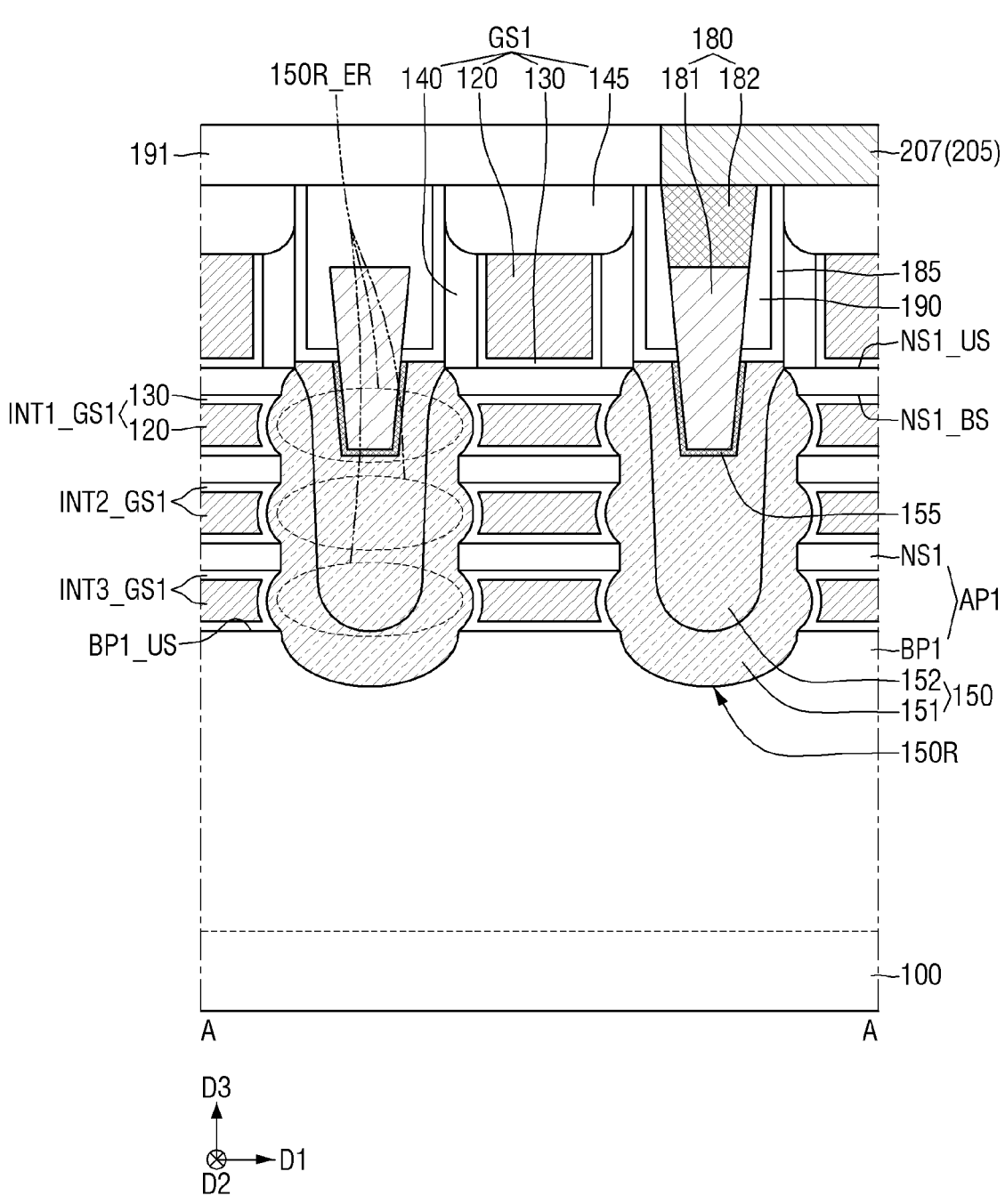

FIG. 24 is a view for describing a semiconductor device according to some embodiments. FIGS. 25 to 27 are views for describing semiconductor devices according to some embodiments, respectively. For convenience of explanation, contents different from those described with reference to FIGS. 1 to 8 will be mainly described. For reference, FIG. 24 is a plan view taken along line C-C of FIG. 2 and viewed from above.

Referring to FIG. 24, in a semiconductor device according to some embodiments, the first side etch blocking pattern 160 may protrude toward the first gate electrode 120 more than the outer sidewall 151_OSW of the first semiconductor liner layer.

In a process of removing the sacrificial pattern SC_L (see FIG. 48), a portion of the first semiconductor liner layer 151 may be removed. Accordingly, the first side etch blocking pattern 160 may protrude more than the outer sidewall 151_OSW of the first semiconductor liner layer.

Although not illustrated in the drawings, in a plan view at the level of the first sheet pattern, the first side etch blocking pattern 160 may protrude toward the first sheet pattern NS1 less than the outer sidewall 151_OSW of the first semiconductor liner layer.

Referring to FIG. 25, in a semiconductor device according to some embodiments, the first source/drain recess 150R does not include a plurality of width extension regions 150R_ER (see FIG. 2).

The sidewalls of the first source/drain recess 150R do not have a wavy shape (i.e., the sidewalls may be substantially straight or planar). Widths of upper portions of the sidewalls of the first source/drain recess 150R in the first direction D1 may decrease as it moves away from the first lower pattern BP1.

Referring to FIG. 26, in a semiconductor device according to some embodiments, the upper surface of the first source/drain contact 180 at the portion that is not connected to the wiring structure 205 is lower than the upper surface of the first gate capping pattern 145.

The upper surface of the first source/drain contact 180 at the portion connected to the wiring structure 205 is lower than the upper surface of the first source/drain contact 180 at the portion that is not connected to the wiring structure 205.

Referring to FIG. 27, in a semiconductor device according to some embodiments, the first source/drain contact 180) includes a lower source/drain contact 181 and an upper source/drain contact 182.

The upper source/drain contact 182 may be disposed at a portion connected to the wiring structure 205. On the other hand, the upper source/drain contact 182 may not be disposed at a portion that is not connected to the wiring structure 205.

The wiring line 207 may be connected to the first source/drain contact 180 without the wiring via 206 (see FIG. 2). The wiring structure 205 may not include the wiring via 206 (see FIG. 2).

It has been illustrated in FIG. 27 that each of the lower source/drain contact 181 and the upper source/drain contact 182 is a single layer, but this is only for convenience of explanation, and the present disclosure is not limited thereto. Each of the lower source/drain contact 181 and the upper source/drain contact 182 may include, for example, at least one of a metal, a metal alloy, conductive metal nitride, conductive metal carbide, conductive metal oxide, conductive metal carbonitride, and a two-dimensional (2D) material.

Figure 28:
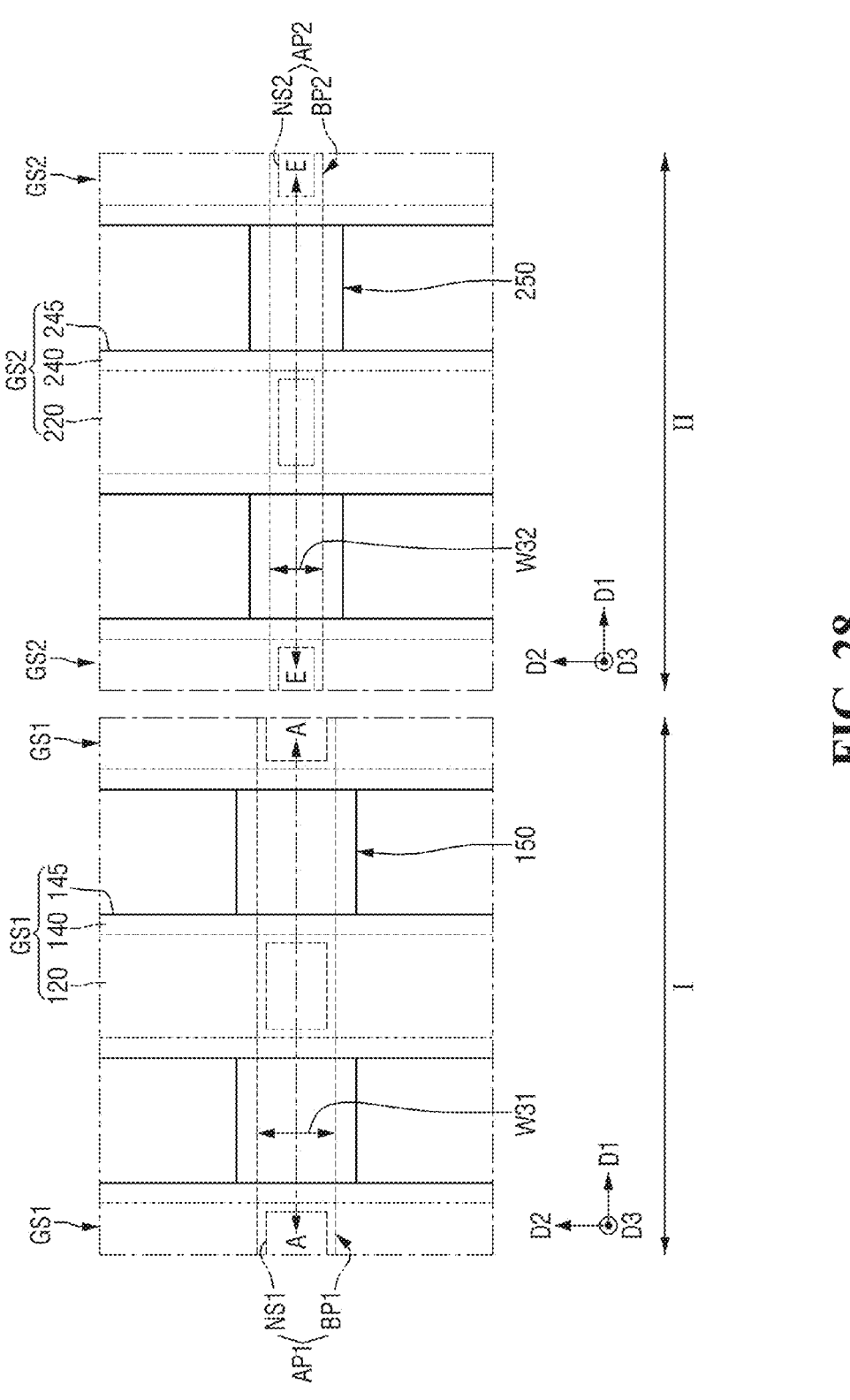
FIGS. 28, 29, 30, and 31 are views for describing a semiconductor device according to some embodiments.
Figure 29:
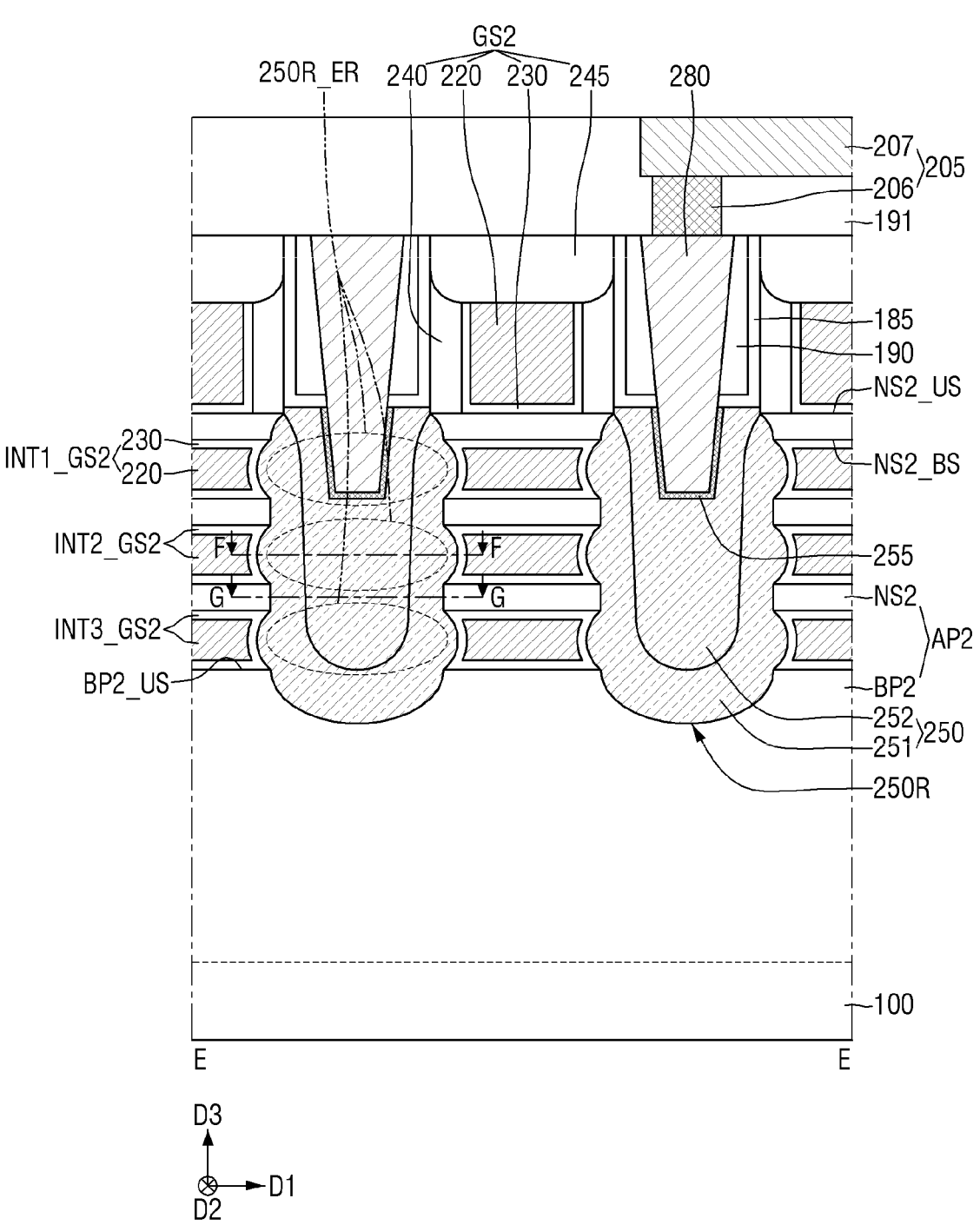
Figure 30:
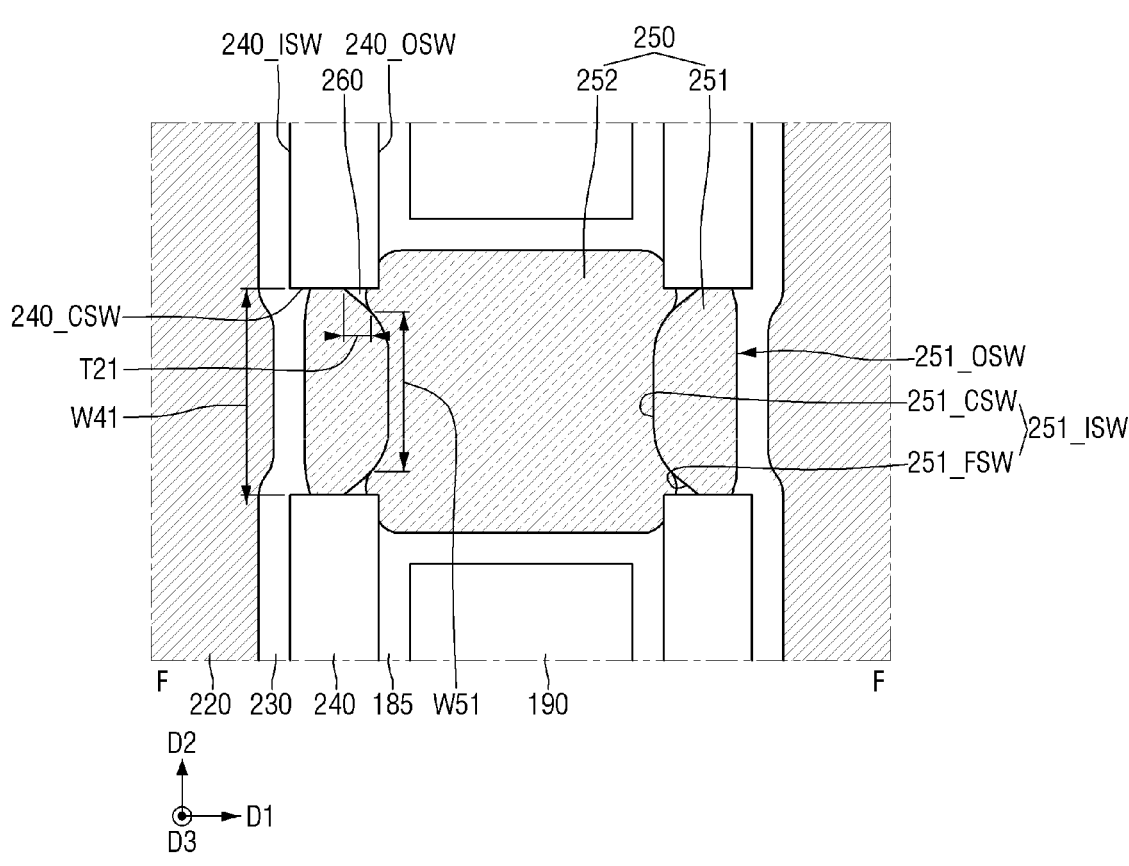
Figure 31:
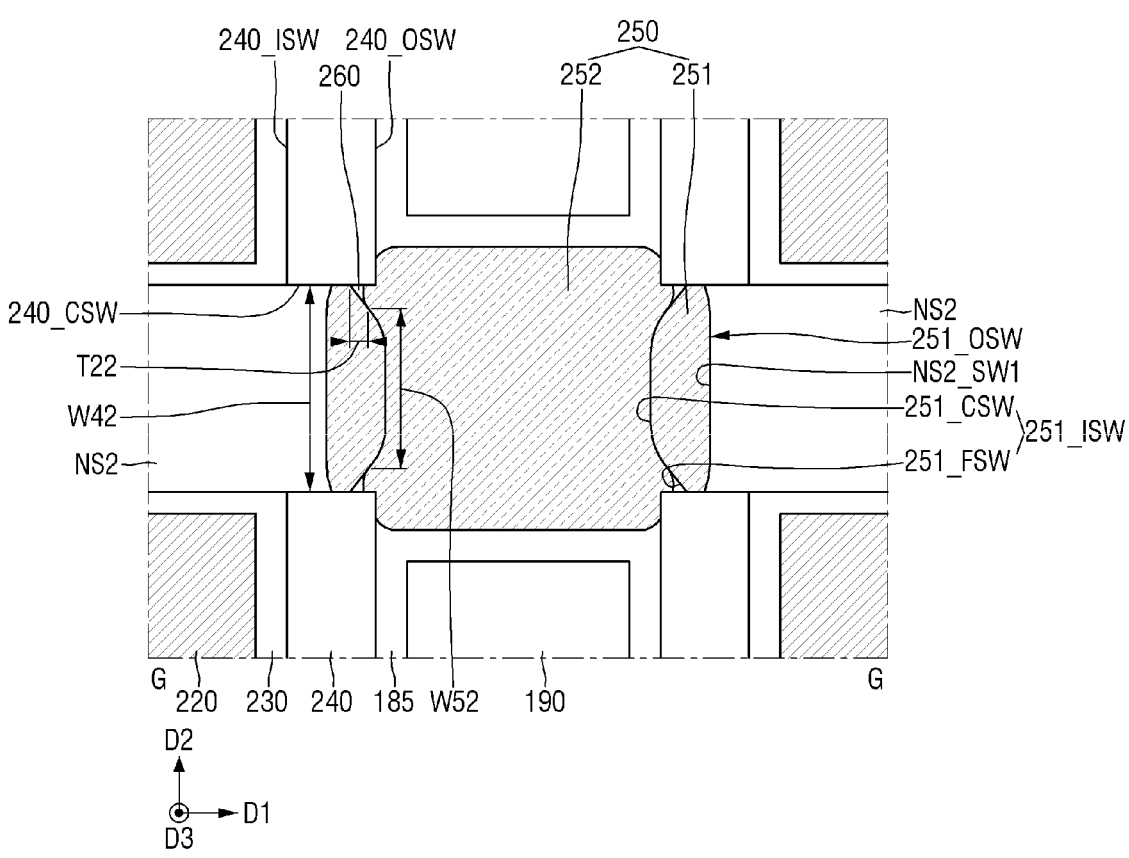

FIGS. 28 to 31 are views for describing a semiconductor device according to some embodiments. For reference FIG. 28 is an illustrative plan view for describing a semiconductor device according to some embodiments. FIG. 29 is a cross-sectional view taken along line E-E of FIG. 28. FIG. 30 is a plan view taken along line F-F of FIG. 28 and viewed from above. FIG. 31 is a plan view taken along line G-G of FIG. 28 and viewed from above.

Meanwhile, a cross-sectional view taken along line A-A of FIG. 28 may be the same as one of FIGS. 2, 13, and 25 to 27. In addition, a description of a first region I of FIG. 28 may be substantially the same as that described with reference to FIGS. 1 to 27. Accordingly, in the following description, contents of a second region II of FIG. 28 will be mainly described.

Referring to FIGS. 28 to 31, a semiconductor device according to some embodiments may include first active patterns AP1, a plurality of first gate structures GS1, first source/drain patterns 150, first side etch blocking patterns 160 (see FIG. 5), second active patterns AP2, a plurality of second gate structures GS2, second source/drain patterns 250, and second side etch blocking patterns 260.

A substrate 100 may include a first region I and a second region II. The first region I and the second region II may be regions in which PMOSs are formed.

The first active patterns AP1, the plurality of first gate structures GS1, the first source/drain patterns 150, and the first side etch blocking patterns 160 are disposed in the first region I of the substrate 100. The second active patterns AP2, the plurality of second gate structures GS2, the second source/drain patterns 250), and the second side etch blocking patterns 260 are disposed in the second region II of the substrate 100.

The second active pattern AP2 may include a second lower pattern BP2 and a plurality of second sheet patterns NS2. The plurality of second sheet patterns NS2 may be spaced apart from the second lower pattern BP2 in the third direction D3. The second sheet pattern NS2 includes an upper surface NS2_US and a lower surface NS2_BS opposite to each other in the third direction D3. Each of the second lower pattern BP2 and the second sheet pattern NS2 may include one of silicon or germanium, which is an elemental semiconductor material, a group IV-IV compound semiconductor, or a group III-V compound semiconductor. In the semiconductor device according to some embodiments, the second lower pattern BP2 may be a silicon lower pattern including silicon, and the second sheet pattern NS2 may be a silicon sheet pattern including silicon.

A width W32 of an upper surface BP2_US of the second lower pattern in the second direction D2 is smaller than a width W31 of the upper surface BP1_US of the first lower pattern in the second direction D2. A width of the second sheet pattern NS2 in the second direction D2 is smaller than a width of the first sheet pattern NS1 in the second direction D2.

The plurality of second gate structures GS2 may be disposed on the substrate 100. The second gate structure GS2 may be disposed on the second active pattern AP2. The second gate structure GS2 may cross the second active pattern AP2. The second gate structure GS2 may cross the second lower pattern BP2. The second gate structure GS2 may surround each of the second sheet patterns NS2. The second gate structure GS2 may include a plurality of inner gate structures INT1_GS2, INT2_GS2, and INT3_GS2 disposed between the second sheet patterns NS2 adjacent to each other in the third direction D3 and between the second lower pattern BP2 and the second sheet pattern NS2.

The second gate structure GS2 may include, for example, a second gate electrode 220, a second gate insulating layer 230, a second gate spacer 240, and a second gate capping pattern 245. The second gate spacer 240 may include an inner sidewall 240_ISW, a connection sidewall 240_CSW, and an outer sidewall 240_OSW. A description of the second gate electrode 220, the second gate insulating layer 230, the second gate spacer 240, and the second gate capping pattern 245 is substantially the same as the description of the first gate electrode 120, the first gate insulating layer 130, the first gate spacer 140, and the first gate capping pattern 145, and will thus be omitted below.

The second source/drain pattern 250 may be disposed on the second active pattern AP2. The second source/drain pattern 250 may be disposed on the second lower pattern BP2. The second source/drain pattern 250 may be connected to the second sheet pattern NS2. The second source/drain pattern 250) may be included in a source/drain of a transistor using the second sheet pattern NS2 as a channel region.

The second source/drain pattern 250) may be disposed in a second source/drain recess 250R. The second source/drain recess 250R may include a plurality of width extension regions 250R_ER. The width extension region 250R_ER of each of the second source/drain recesses may include a portion where a width thereof in the first direction D1 increases and a portion where a width thereof in the first direction D1 decreases, as it moves away from the upper surface BP2_US of the second lower pattern.

The second source/drain pattern 250 may be in contact with the second sheet pattern NS2 and the second lower pattern BP2. A portion of the second source/drain pattern 250 may be in contact with the connection sidewall 240_CSW of the second gate spacer. The second gate insulating layers 230 of the inner gate structures INT1_GS2, INT2_GS2, and INT3_GS2 may be in contact with the second source/drain pattern 250.

The second source/drain pattern 250) may include an epitaxial pattern. The second source/drain pattern 250) includes a semiconductor material. The second source/drain pattern 250) may include a second semiconductor liner layer 251 and a second semiconductor filling layer 252. It has been illustrated that the second semiconductor filling layer 252 is a single layer, but this is only for convenience of explanation, and the present disclosure is not limited thereto.

The second semiconductor liner layer 251 may include an outer sidewall 251_OSW and an inner sidewall 251_ISW. The inner sidewall 251_ISW of the second semiconductor liner layer may include a facet surface 251_FSW and a connection surface 251_CSW. A description of a shape and a material of the second source/drain pattern 250 is substantially the same as the description of the shape and the material of the first source/drain pattern 150, and will thus be omitted below.

The second side etch blocking pattern 260 may be disposed between the second gate spacer 240 and the second source/drain pattern 250. The second side etch blocking pattern 260 may be disposed between the second gate spacer 240 and the second semiconductor liner layer 251.

In FIGS. 30 and 31, the second side etch blocking pattern 260 may extend along the third direction D3 between the second gate spacer 240 and the second source/drain pattern 250.

The second side etch blocking pattern 260 may be disposed between the connection sidewall 240_CSW of the second gate spacer and the facet surface 251_FSW of the inner sidewall 251_ISW of the second semiconductor liner layer. The second side etch blocking pattern 260 may be disposed between the connection sidewall 240_CSW of the second gate spacer and a facet surface of the second semiconductor liner layer 251.

The second side etch blocking pattern 260 may be in direct contact with the second gate spacer 240 and the second source/drain pattern 250. The second side etch blocking pattern 260 may be in contact with the connection sidewall 240_CSW of the second gate spacer and the facet surface of the second semiconductor liner layer 251.

A width of the second side etch blocking pattern 260 in the second direction D2 may increase in the direction away from the second gate electrode 220. In a plan view, the second side surface etch blocking pattern 260 may have a substantially triangular shape.

In a plan view; the second side etch blocking pattern 260 covers at least a portion of the facet surface of the second semiconductor liner layer 251. The second semiconductor filling layer 252 may be in contact with a portion of the facet surface of the second semiconductor liner layer 251.

In FIG. 30, since the second side etch blocking pattern 260 covers a portion of the inner sidewall 251_ISW of the second semiconductor liner layer 251, a maximum width W41 of the second semiconductor liner layer 251 in the second direction D2 is greater than a width W51, in the second direction D2, of an interface between the second semiconductor liner layer 251 and the second semiconductor filling layer 252.

In FIG. 31, a maximum width W42 of the second semiconductor liner layer 251 in the second direction D2 is greater than a width W52, in the second direction D2, of the interface between the second semiconductor liner layer 251 and the second semiconductor filling layer 252.

In FIG. 30, a thickness of the second side surface etch blocking pattern 260 in the first direction D1 is a third thickness T21. In FIG. 31, a thickness of the second side surface etch blocking pattern 260 in the first direction D1 is a fourth thickness T22. It has been illustrated in FIGS. 30 and 31 that the thickness T21 of the second side surface etch blocking pattern 260 at a level of the inner gate structure is greater than the thickness T22 of the second side surface etch blocking pattern 260 at a level of the second sheet pattern, but this is only for convenience of explanation, and the present disclosure is not limited thereto.

In FIGS. 5 and 30, the thickness T11 of the first side etch blocking pattern 160 in the first direction D1 is greater than the thickness T21 of the second side etch blocking pattern 260 in the first direction D1.

In FIGS. 6 and 31, the thickness T21 of the first side etch blocking pattern 160 in the first direction D1 is greater than the thickness T22 of the second side etch blocking pattern 260 in the first direction D1.

As an example, the internal etch blocking pattern described with reference to FIGS. 13 to 19 may not be disposed in the second source/drain pattern 250.

As another example, the internal etch blocking pattern described with reference to FIGS. 13 to 19 may be disposed in the second source/drain pattern 250. In this case, a thickness, in the first direction D1, of the internal etch blocking pattern in the second source/drain pattern 250 is smaller than the thickness, in the first direction D1, of the first internal etch blocking pattern 165 (see FIG. 14) in the first source/drain pattern 150.

A second source/drain contact 280 is disposed on the second source/drain pattern 250. The second source/drain contact 280 is connected to the second source/drain pattern 250. A second metal silicide layer 255 may be further disposed between the second source/drain contact 280 and the second source/drain pattern 250.

Figure 32:
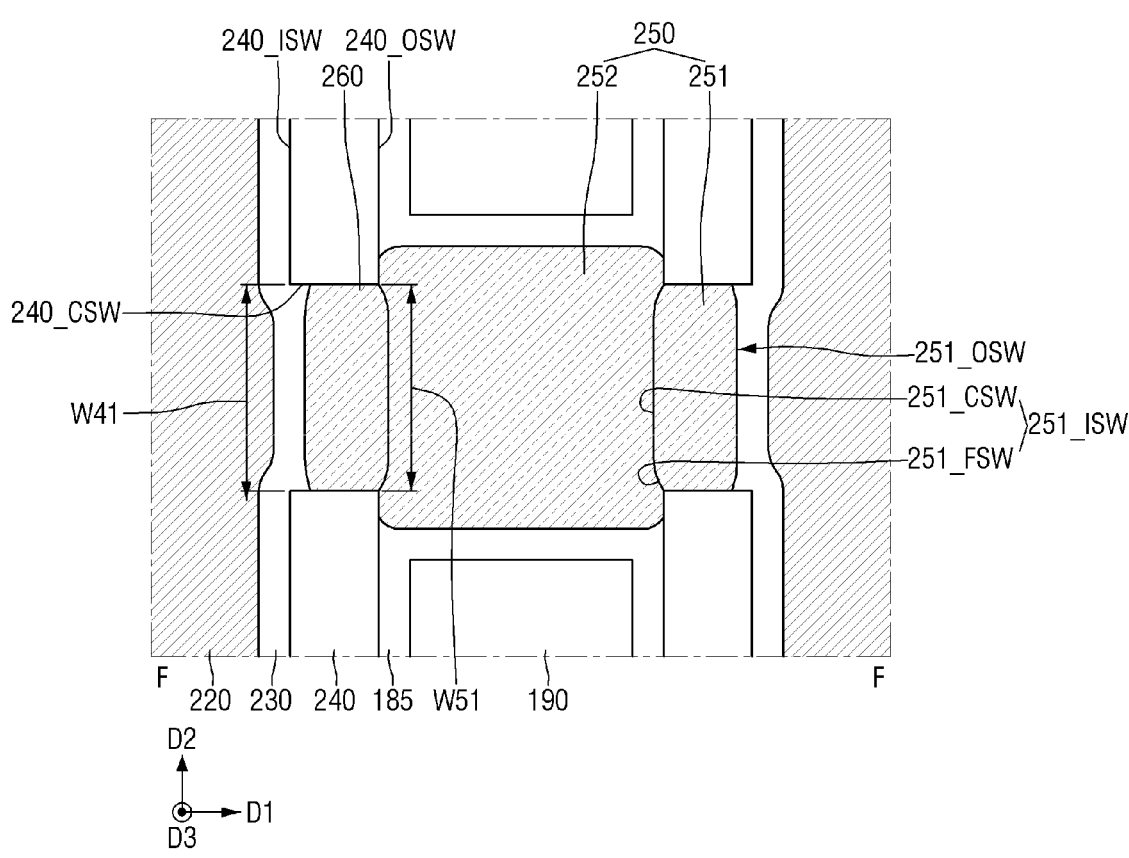
FIG. 32 is a view for describing a semiconductor device according to some embodiments.

FIG. 32 is a view for describing a semiconductor device according to some embodiments. For convenience of explanation, contents different from those described with reference to FIGS. 28 to 31 will be mainly described. For reference, FIG. 32 is a plan view taken along line F-F of FIG. 28 and viewed from above.

Referring to FIG. 32, in a semiconductor device according to some embodiments, the second side etch blocking pattern 260 (see FIG. 30) is not disposed between the second source/drain pattern 250 and the second gate spacer 240.

The maximum width W41 of the second semiconductor liner layer 251 in the second direction D2 may be the same as the width W51, in the second direction D2, of the interface between the second semiconductor liner layer 251 and the second semiconductor filling layer 252.

Although not illustrated in the drawings, one of ordinary skill in the art to which the present disclosure pertains may perceive a plan view taken along line G-G of FIG. 29 and viewed from above through FIG. 32.

Figure 33:
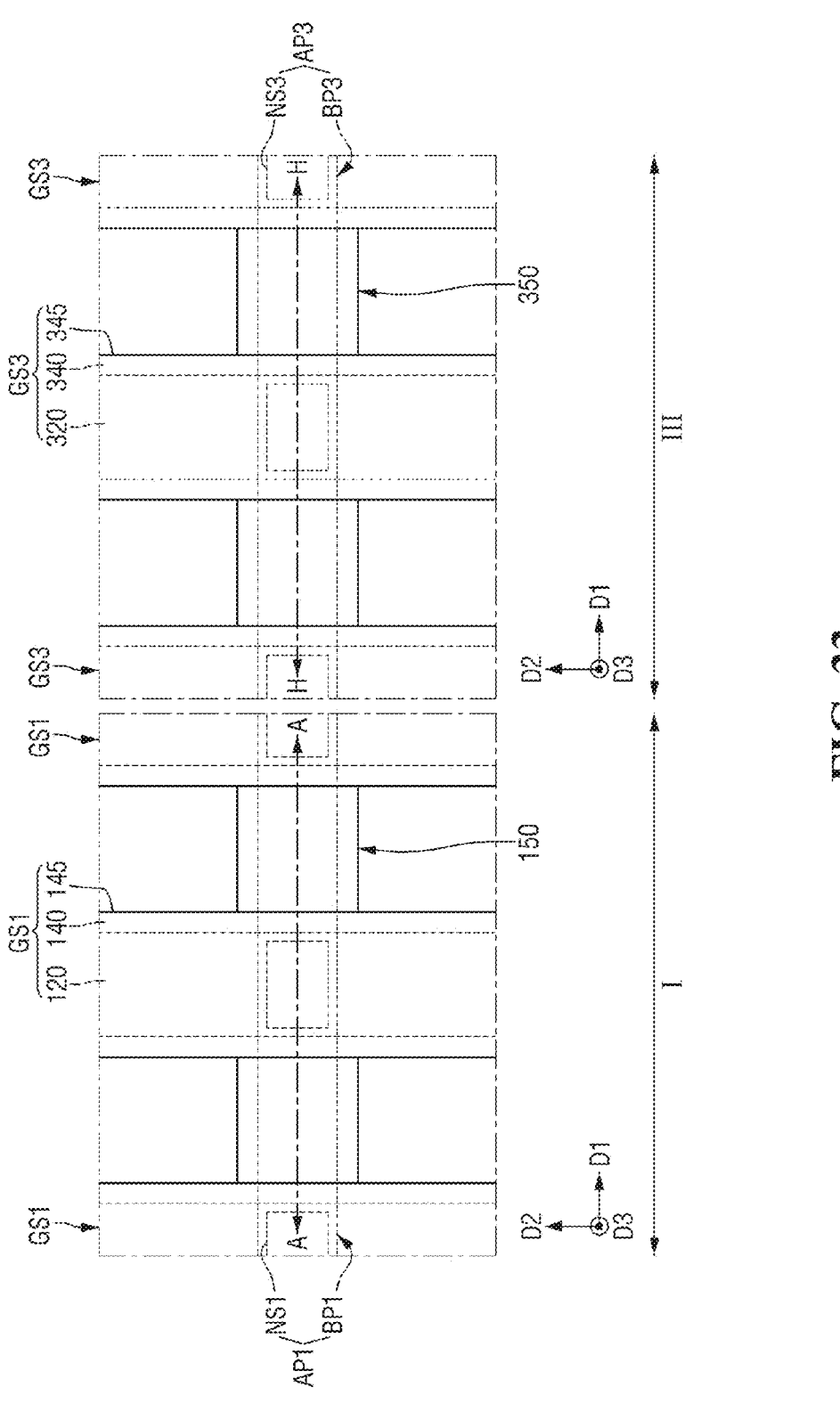
FIGS. 33, 34, and 35 are views for describing a semiconductor device according to some embodiments.
Figure 34:
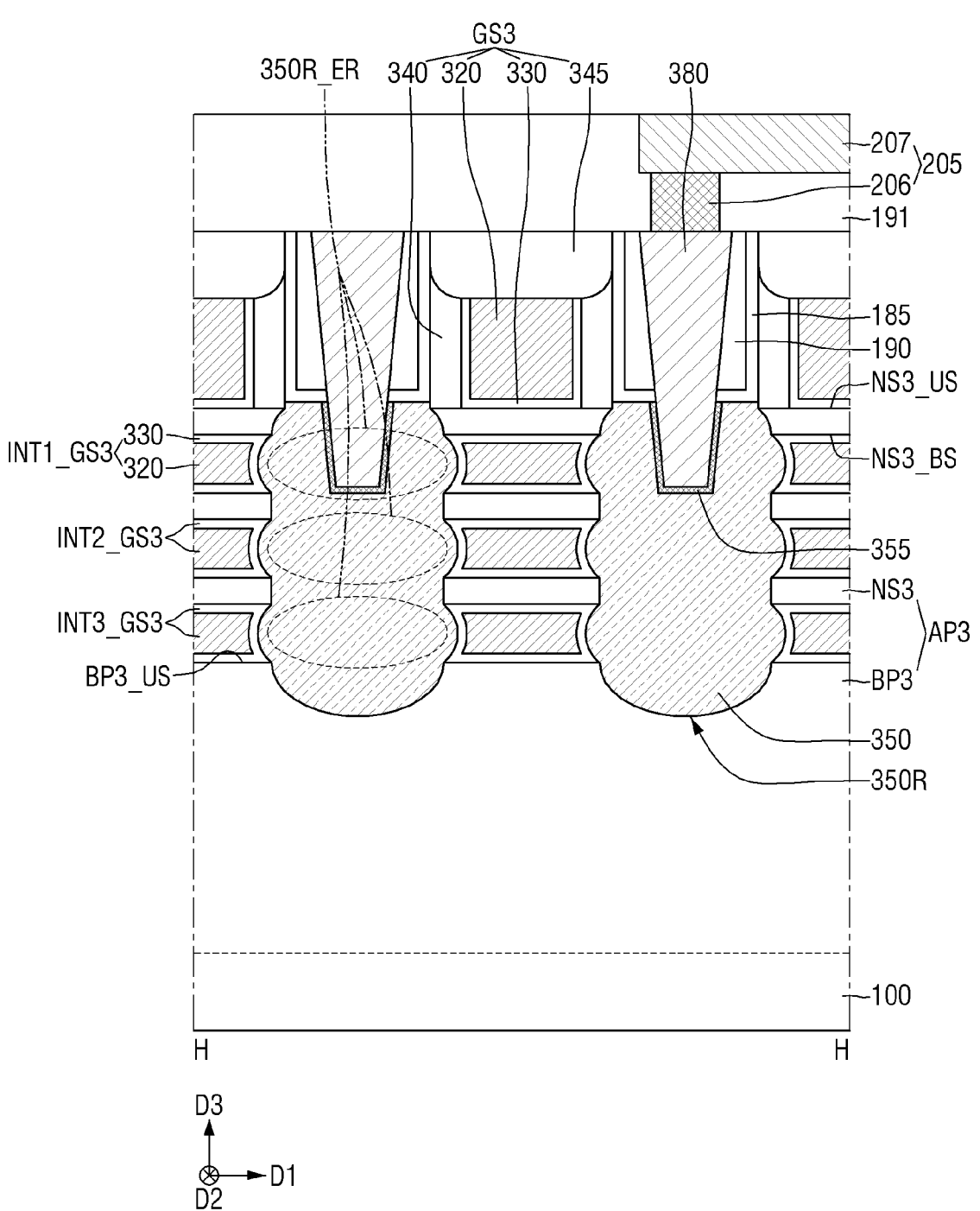
Figure 35:
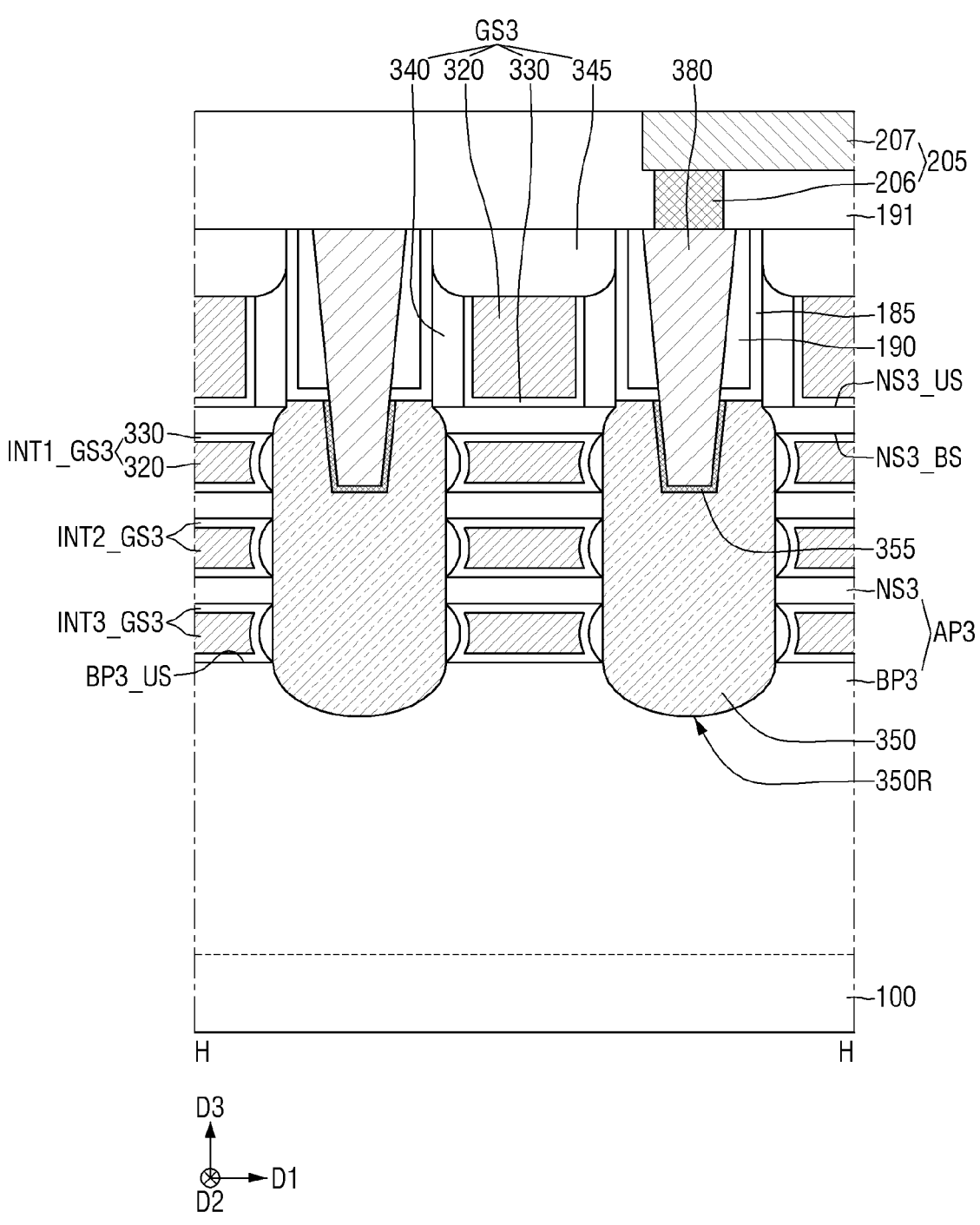

FIGS. 33 to 35 are views for describing a semiconductor device according to some embodiments. For reference FIG. 33 is an illustrative plan view for describing a semiconductor device according to some embodiments. FIGS. 34 and 35 are cross-sectional views taken along line H-H of FIG. 33.

In addition, a cross-sectional view taken along line A-A of FIG. 33 may be the same as one of FIGS. 2, 13, and 25 to 27. In addition, a description of a first region I of FIG. 33 may be substantially the same as that described with reference to FIGS. 1 to 27. Accordingly, in the following description, contents of a third region III of FIG. 33 will be mainly described.

Referring to FIGS. 33 to 35, a semiconductor device according to some embodiments may include first active patterns AP1, a plurality of first gate structures GS1, first source/drain patterns 150, first side etch blocking patterns 160 (see FIG. 5), third active patterns AP3, a plurality of third gate structures GS3, and third source/drain patterns 350).

A substrate 100 may include a first region I and a third region III. The first region I may be a region in which a PMOS is formed, and the third region III may be a region in which an NMOS is formed.

The first active patterns AP1, the plurality of first gate structures GS1, the first source/drain patterns 150, and the first side etch blocking patterns 160 are disposed in the first region I of the substrate 100. The third active patterns AP3, the plurality of third gate structures GS3, and the third source/drain patterns 350 are disposed in the third region III of the substrate 100.

The third active pattern AP3 may include a third lower pattern BP3 and a plurality of third sheet patterns NS3. The plurality of third sheet patterns NS3 are disposed on an upper surface BP3_US of the third lower pattern. The third sheet pattern NS3 includes an upper surface NS3_US and a lower surface NS3_BS opposite to each other in the third direction D3. Each of the third lower pattern BP3 and the third sheet pattern NS3 may include one of silicon or germanium, which is an elemental semiconductor material, a group IV-IV compound semiconductor, or a group III-V compound semiconductor. In the semiconductor device according to some embodiments, the third lower pattern BP3 may be a silicon lower pattern including silicon, and the third sheet pattern NS3 may be a silicon sheet pattern including silicon.

The plurality of third gate structures GS3 may be disposed on the substrate 100. The third gate structure GS3 may be disposed on the third active pattern AP3. The third gate structure GS3 may cross the third active pattern AP3. The third gate structure GS3 may cross the third lower pattern BP3. The third gate structure GS3 may surround each of the third sheet patterns NS3. The third gate structure GS3 may include a plurality of inner gate structures INT1_GS3, INT2_GS3, and INT3_GS3 disposed between the third sheet patterns NS3 adjacent to each other in the third direction D3 and between the third lower pattern BP3 and the third sheet pattern NS3. The third gate structure GS3 may include, for example, a third gate electrode 320, a third gate insulating layer 330, a third gate spacer 340, and a third gate capping pattern 345.

In FIG. 34, the third gate spacer 340 is not disposed between the plurality of inner gate structures INT1_GS3, INT2_GS3, and INT3_GS3 and the third source/drain pattern 350. The third gate insulating layers 330 included in the inner gate structures INT1_GS3, INT2_GS3, and INT3_GS3 may be in contact with the third source/drain pattern 350.

In FIG. 35, the third gate structure GS3 may include inner spacers ISP1_GS3, ISP2_GS3, and ISP3_GS3. The inner spacers ISP1_GS3, ISP2_GS3, and ISP3_GS3 may be disposed between the third sheet patterns NS3 adjacent to each other in the third direction D3 and between the third lower pattern BP3 and the third sheet pattern NS3. The inner spacers ISP1_GS3, ISP2_GS3, and ISP3_GS3 may be in contact with the third gate insulating layers 330 included in the inner gate structures INT1_GS3, INT2_GS3, and INT3_GS3. The inner spacers ISP1_GS3, ISP2_GS3, and ISP3_GS3 may define a portion of a third source/drain recess 350R.

The third source/drain pattern 350) may be formed on the third active pattern AP3. The third source/drain pattern 350 may be formed on the third lower pattern BP3. The third source/drain pattern 350) may be connected to the third sheet pattern NS3. The third source/drain pattern 350) may be included in a source/drain of a transistor using the third sheet pattern NS3 as a channel region.

The third source/drain pattern 350 may be disposed in the third source/drain recess 350R. A bottom surface of the third source/drain recess 350R may be defined by the third lower pattern BP3. Sidewalls of the third source/drain recess 350R may be defined by the third sheet patterns NS3 and the third gate structure GS3.

The third source/drain pattern 350 may include an epitaxial pattern. The third source/drain pattern 350 may include, for example, silicon or germanium, which is an elemental semiconductor material. In addition, the third source/drain pattern 350 may include, for example, a binary compound or a ternary compound including two or more of carbon (C), silicon (Si), germanium (Ge), and tin (Sn), or a compound obtained by doping carbon (C), silicon (Si), germanium (Ge), and tin (Sn) with a group IV element. For example, the third source/drain pattern 350 may include silicon, silicon-germanium, silicon carbide, or the like, but is not limited thereto.

The third source/drain pattern 350 may include impurities doped into a semiconductor material. For example, the third source/drain pattern 350 may include n-type impurities. The doped impurities may include at least one of phosphorus (P), arsenic (As), antimony (Sb), and bismuth (Bi).

In FIG. 34, the third source/drain recess 350R may include a plurality of width extension regions 350R_ER.

In FIG. 35, the third source/drain recess 350R does not include the plurality of width extension regions 350R_ER.

A third source/drain contact 380 is disposed on the third source/drain pattern 350. The third source/drain contact 380 is connected to the third source/drain pattern 350. A third metal silicide layer 355 may be further disposed between the third source/drain contact 380 and the third source/drain pattern 350.

Figure 40:
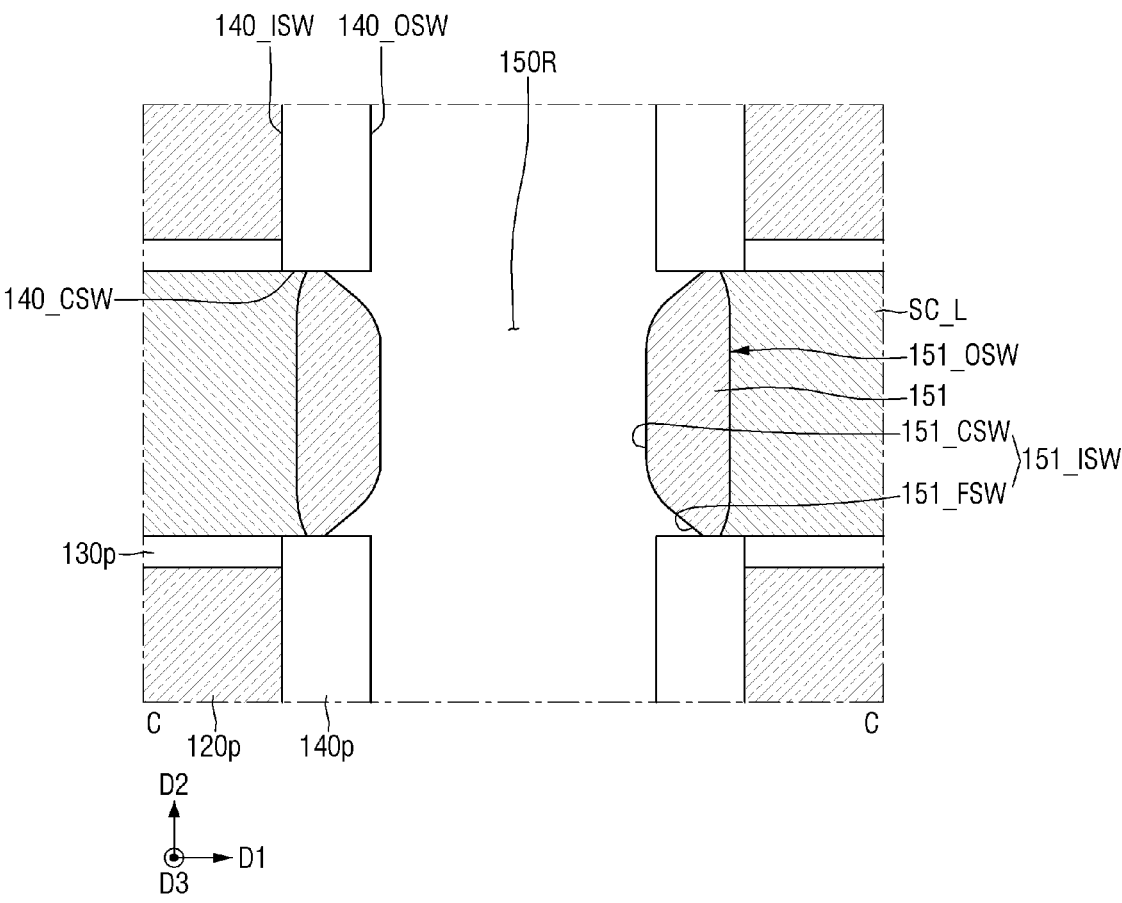
Figure 41:
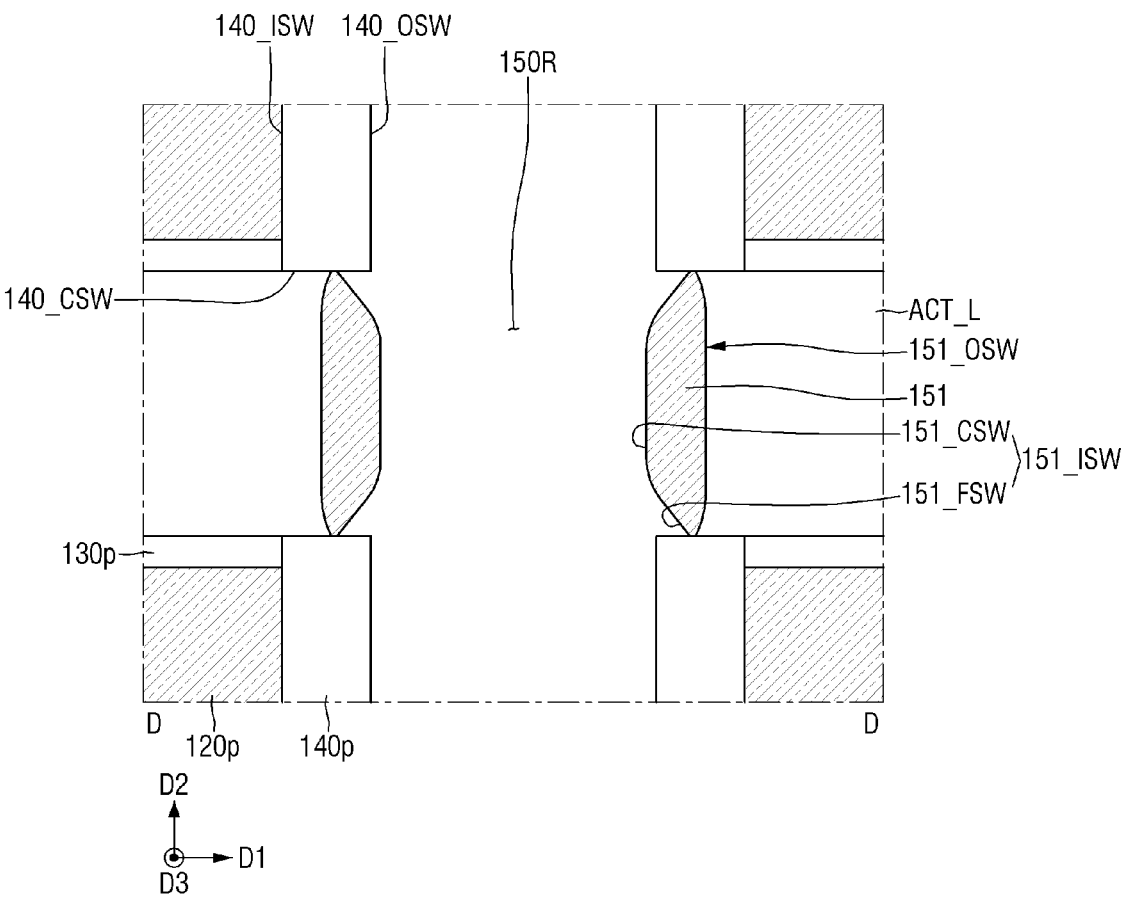

FIGS. 36 to 53 are views for describing intermediate steps of a method for fabricating a semiconductor device according to some embodiments. FIGS. 36 to 39, 42, 45, and 50 to 52 may be cross-sectional views taken along line A-A of FIG. 1. FIGS. 40 and 41 are plan views taken along line C-C and line D-D of FIG. 39 and viewed from above, respectively. FIGS. 43 and 44 are plan views taken along line C-C and line D-D of FIG. 42 and viewed from above, respectively. FIGS. 46 to 49 are plan views taken along line C-C and line D-D of FIG. 45 and viewed from above. FIG. 53 is a plan view taken along line C-C of FIG. 52 and viewed from above.

Figure 36:
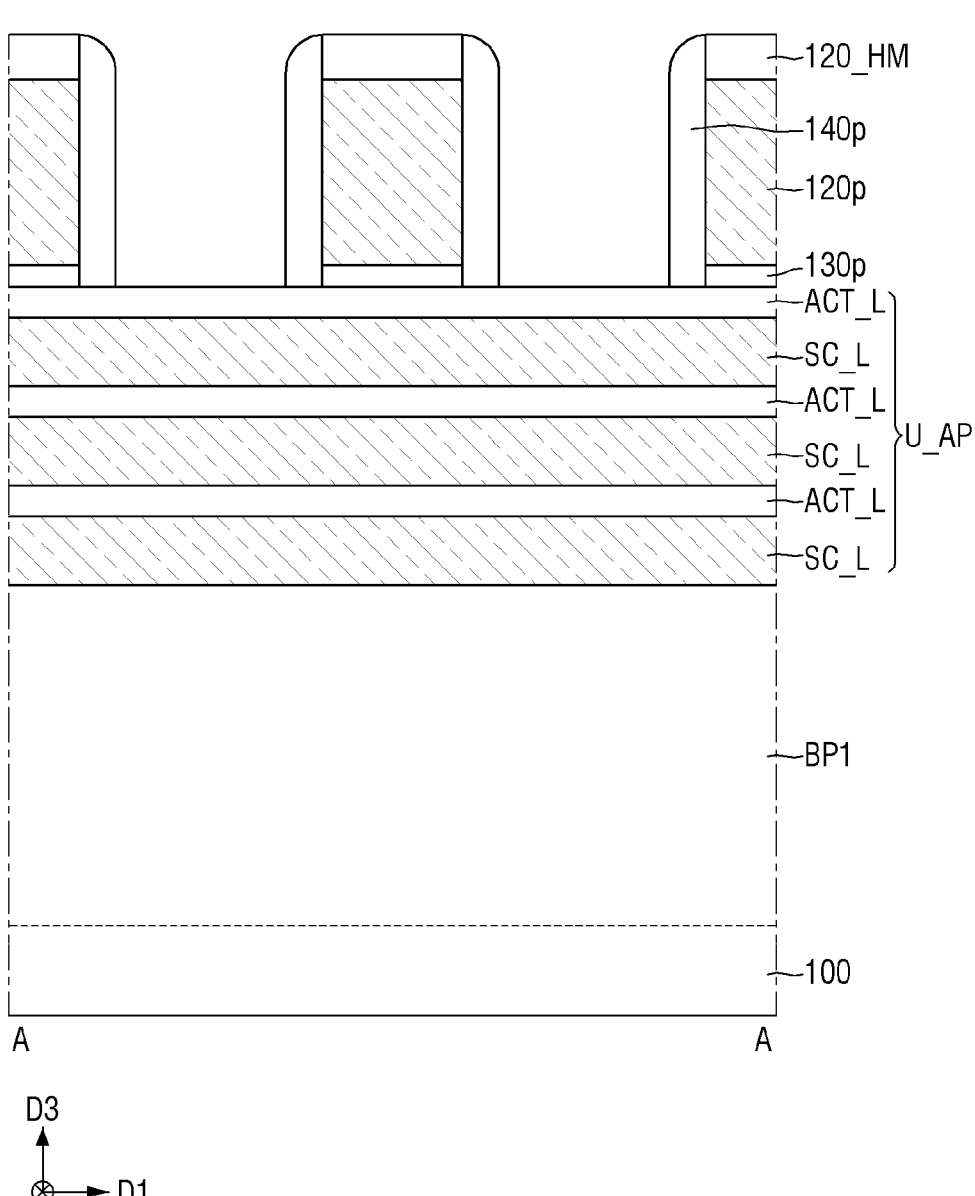

Referring to FIG. 36, the first lower pattern BP1 and an upper pattern structure U_AP may be formed on the substrate 100.

The first lower pattern BP1 extends in the first direction D1. The upper pattern structure U_AP may be disposed on the first lower pattern BP1. The upper pattern structure U_AP may include sacrificial patterns SC_L and active patterns ACT_L alternately stacked on the first lower pattern BP1. For example, the sacrificial pattern SC_L may include a silicon-germanium layer. The active pattern ACT_L may include a silicon layer. A fraction of germanium in the sacrificial pattern SC_L is greater than the fraction of germanium in the first semiconductor liner layer 151 of FIG. 2.

Next, a dummy gate structure extending in the second direction D2 is formed on the upper pattern structure U_AP. The dummy gate structure may include a dummy gate insulating layer 130p, a dummy gate electrode 120p, a dummy gate capping layer 120_HM, and a pre-gate spacer 140p. The dummy gate insulating layer 130p may include, for example, silicon oxide, but is not limited thereto. The dummy gate electrode 120p may include, for example, polysilicon, but is not limited thereto. The dummy gate capping layer 120_HM may include, for example, silicon nitride, but is not limited thereto.

The pre-gate spacer 140p may include an inner sidewall 140_ISW (see FIG. 40), a connection sidewall 140_CSW (see FIG. 40), and an outer sidewall 140_OSW (see FIG. 40).

The inner sidewall 140_ISW of the pre-gate spacer faces a sidewall of the dummy gate electrode 120p extending in the second direction D2. The outer sidewall 140_OSW of the pre-gate spacer is a surface opposite to the inner sidewall 140_ISW of the pre-gate spacer. The connection sidewall 140_CSW of the pre-gate spacer connects the inner sidewall 140_ISW2 of the pre-gate spacer and the outer sidewall 140_OSW of the pre-gate spacer to each other.

Figure 37:
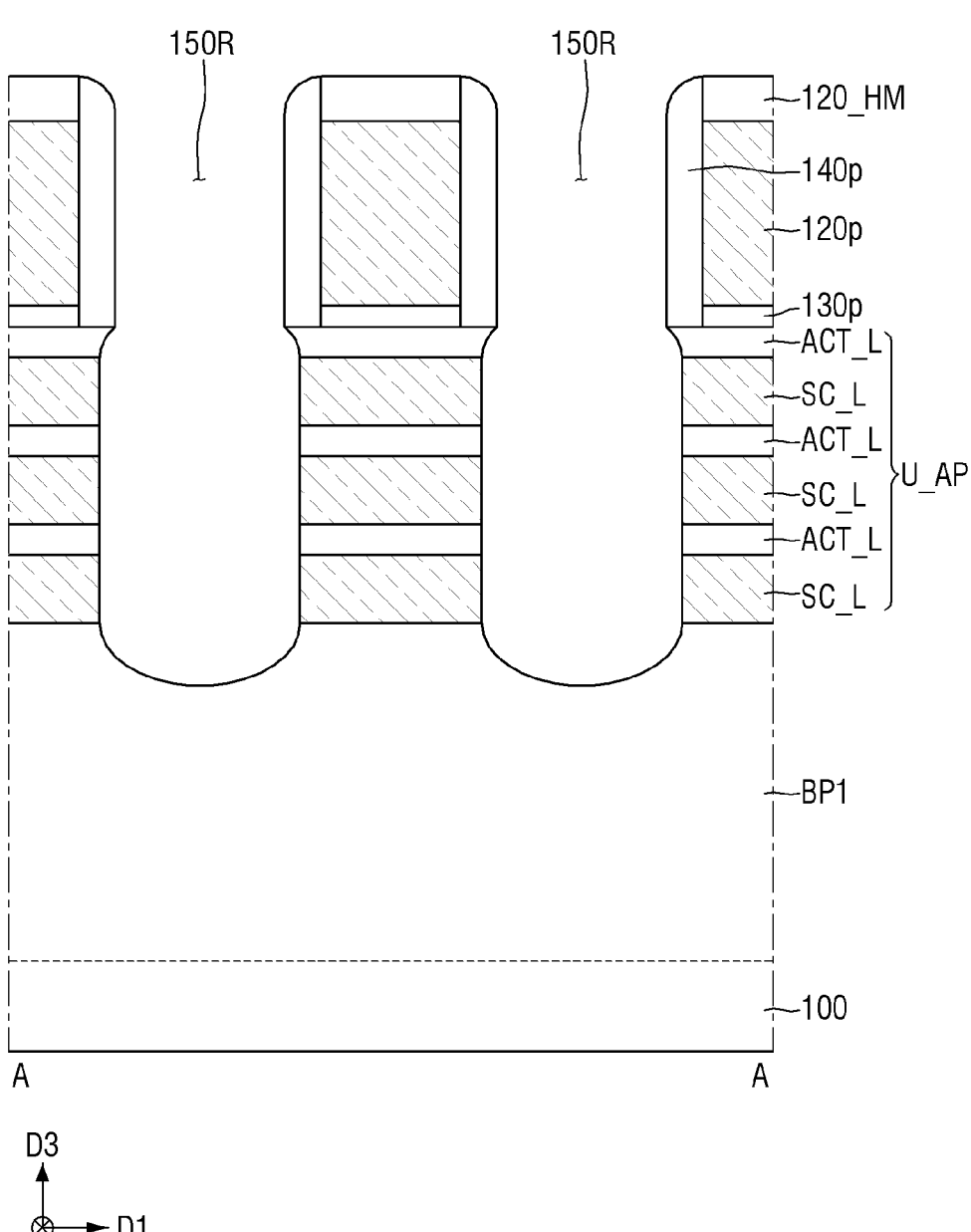

Referring to FIG. 37, the first source/drain recesses 150R may be formed in the upper pattern structure U_AP using the dummy gate structure as a mask.

A portion of the first source/drain recess 150R may be formed in the first lower pattern BP1.

Figure 38:
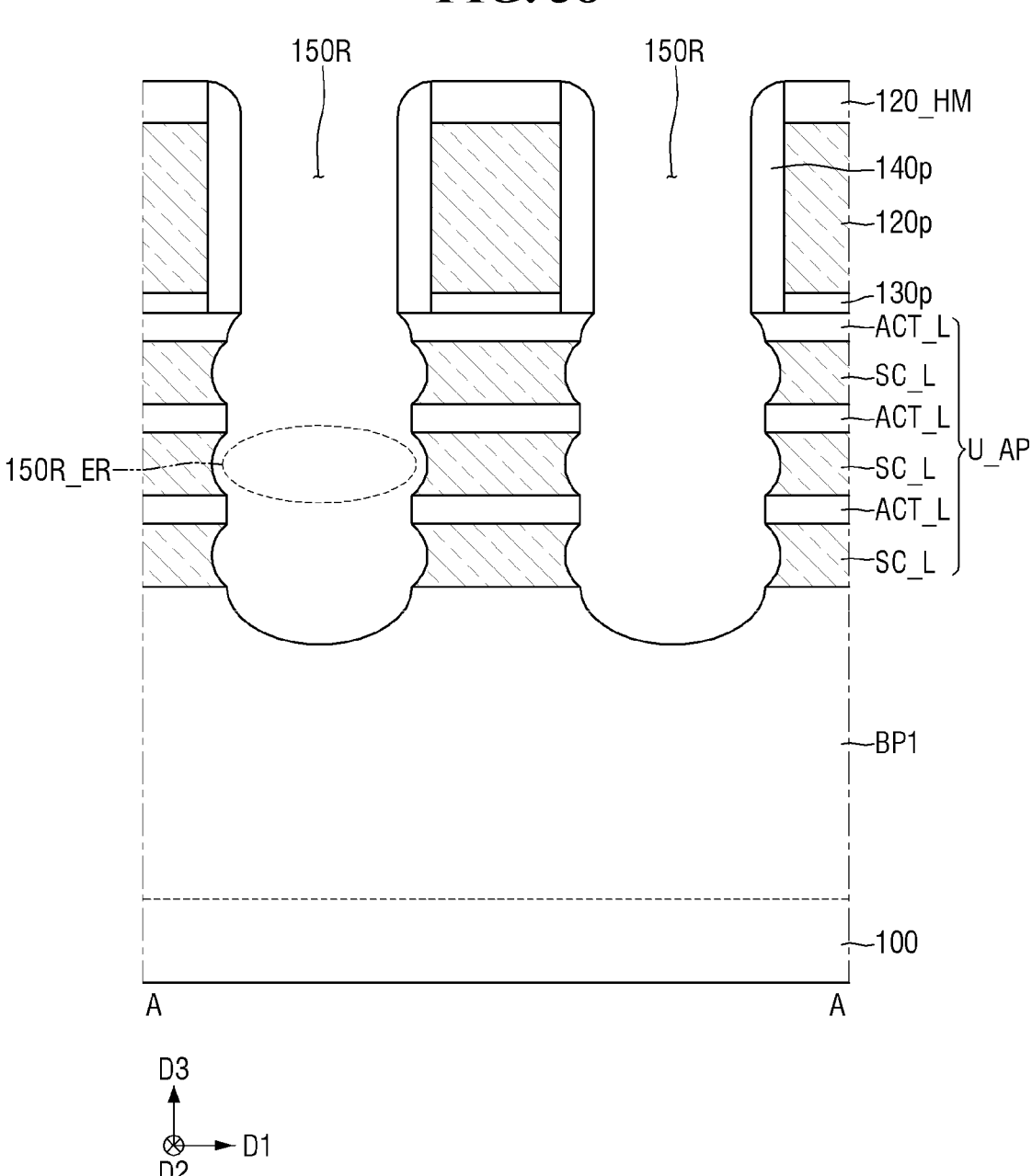

Referring to FIG. 38, portions of the sacrificial patterns SC_L exposed by the first source/drain recesses 150R may be removed.

As a result, width extension regions 150R_ER of a plurality of first source/drain recesses may be formed. The first source/drain recess 150R may include the width extension regions 150R_ER of the first source/drain recess.

In FIGS. 37 and 38, the first source/drain recess 150R may expose at least a portion of the connection sidewall 140_CSW (see FIG. 40) of the pre-gate spacer.

Figure 39:
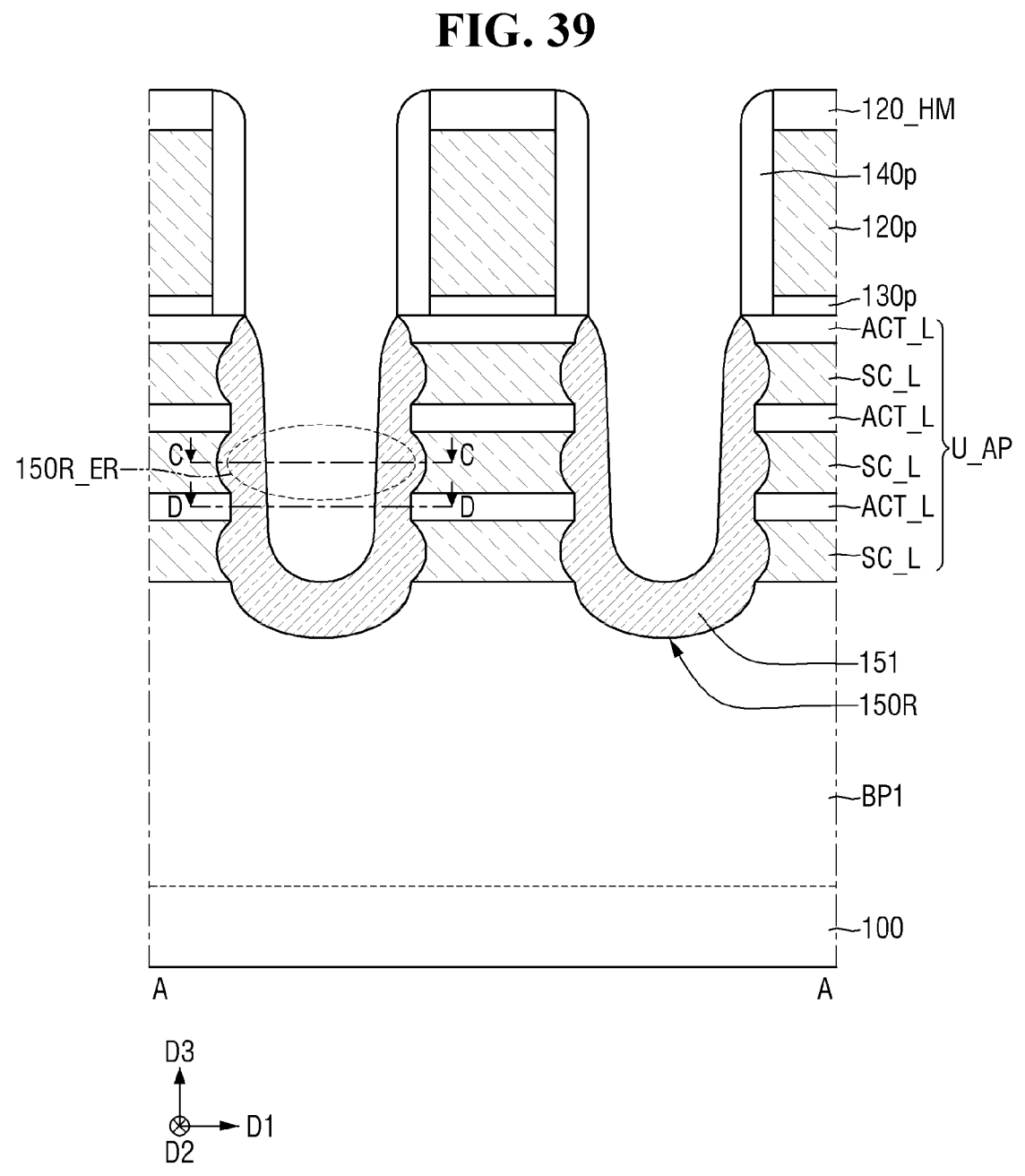

Referring to FIGS. 39 and 41, the first semiconductor liner layer 151 may be formed along a profile of the first source/drain recess 150R.

The first semiconductor liner layer 151 may include an outer sidewall 151_OSW and an inner sidewall 151_ISW. The outer sidewall 151_OSW of the first semiconductor liner layer may be in direct contact with the sacrificial patterns SC_L and the active patterns ACT_L. The inner sidewall 151_ISW of the second semiconductor liner layer may include a facet surface 151_FSW and a connection surface 151_CSW. The facet surface 151_FSW of the inner sidewall 151_ISW of the first semiconductor liner layer may extend from the connection sidewall 140_CSW of the pre-gate spacer.

Figure 42:
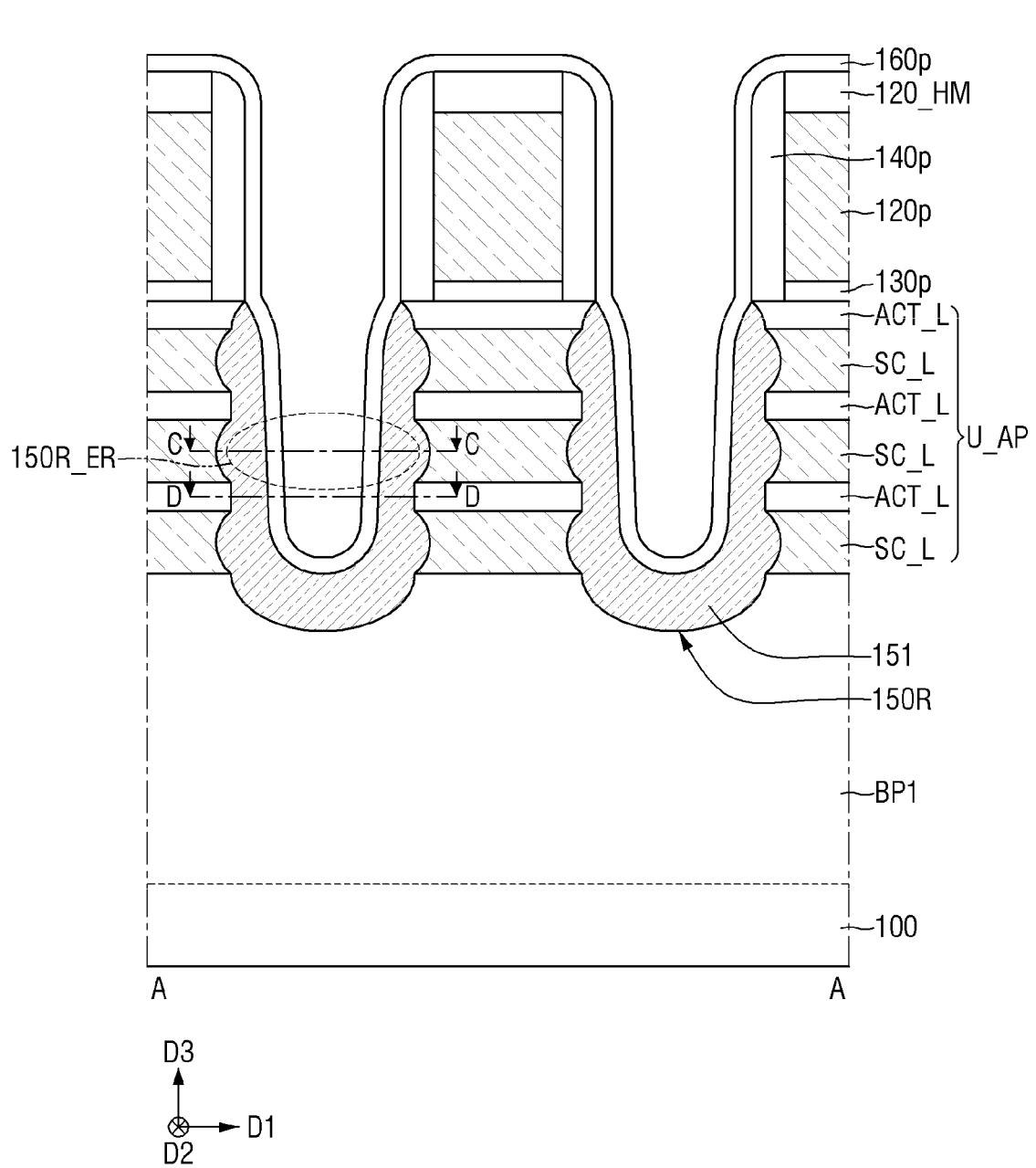
Figure 43:
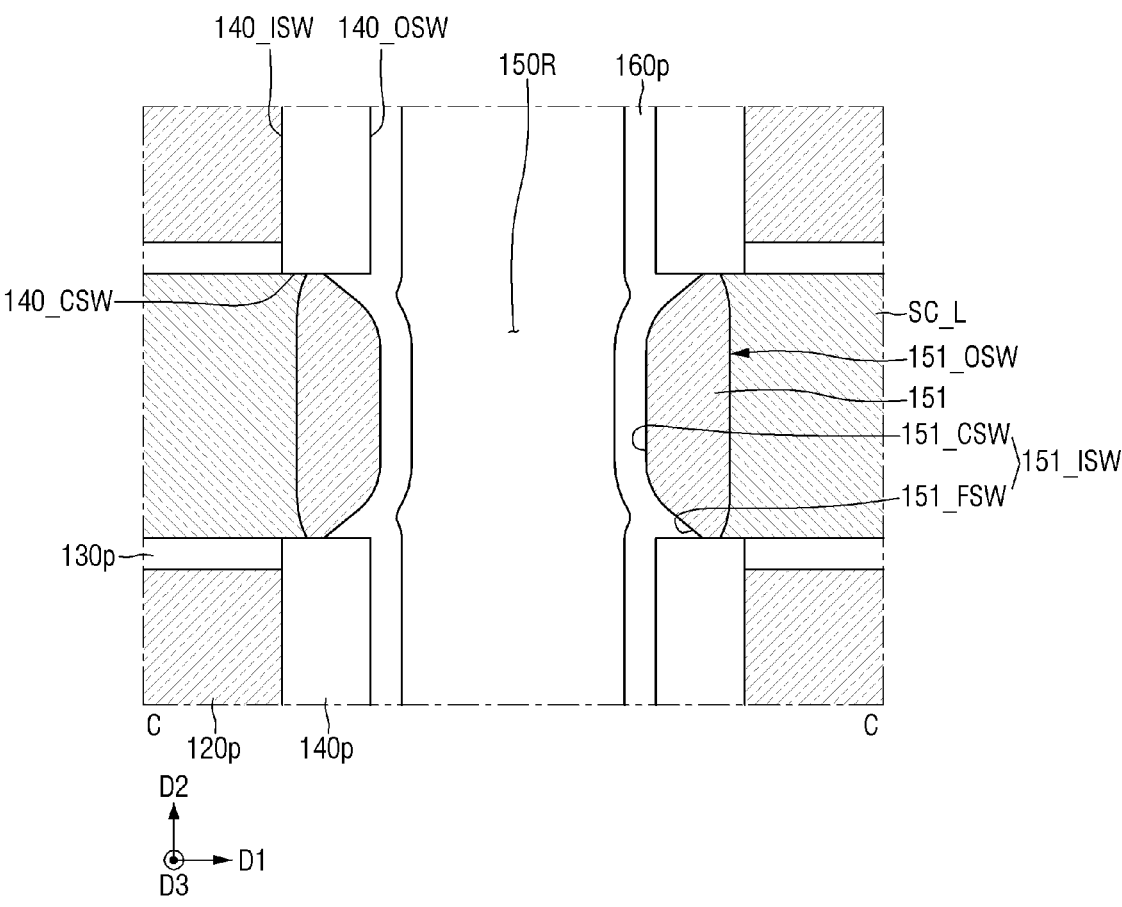
Figure 44:
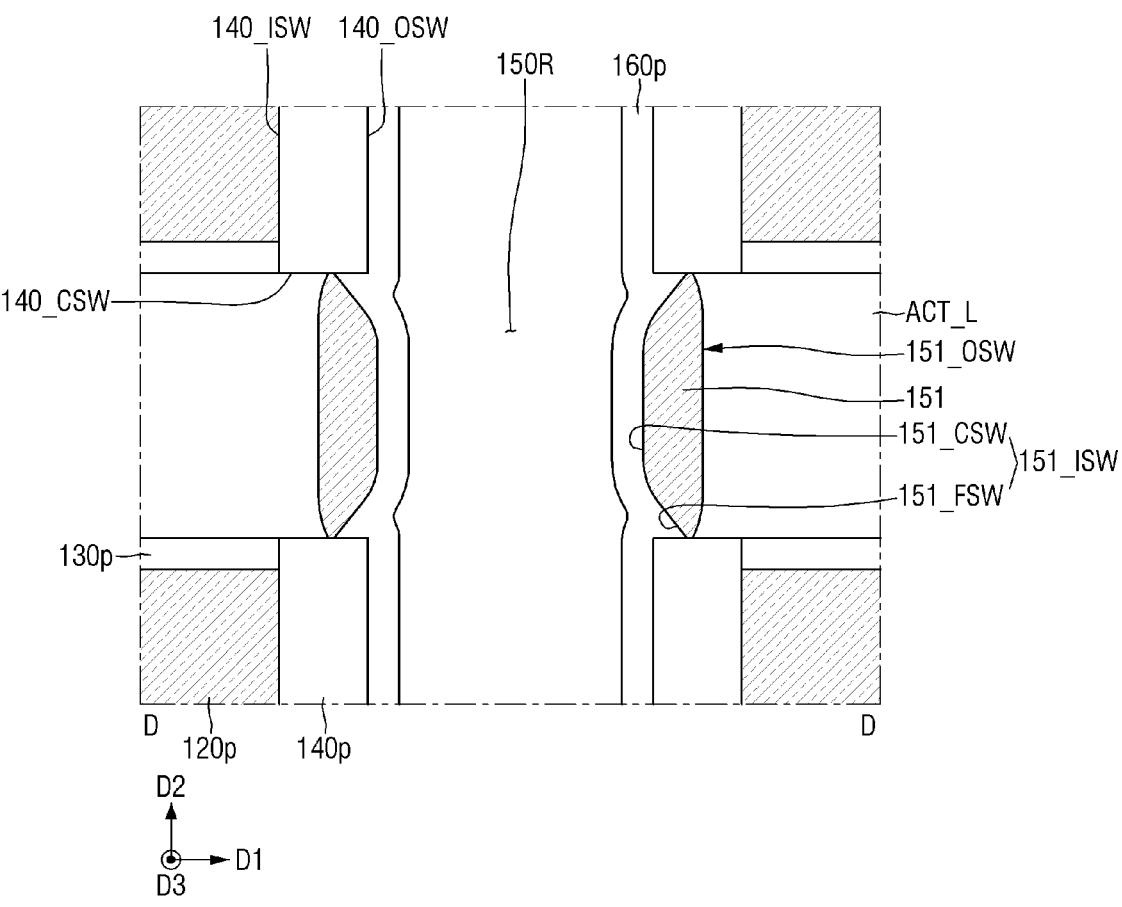

Referring to FIGS. 42 to 44, a pre-etch blocking layer 160p is formed on the first semiconductor liner layer 151.

The pre-etch blocking layer 160p is formed along a profile of the first semiconductor liner layer 151. The pre-etch blocking layer 160p is formed along the inner sidewall 151_ISW of the first semiconductor liner layer. The pre-etch blocking layer 160p covers the first semiconductor liner layer 151.

The pre-etch blocking layer 160p may cover the outer sidewall 140_OSW of the pre-gate spacer and the connection sidewall 140_CSW of the pre-gate spacer.

The pre-etch blocking layer 160p may be formed using, for example, chemical vapor deposition (CVD), but is not limited thereto.

Figure 45:
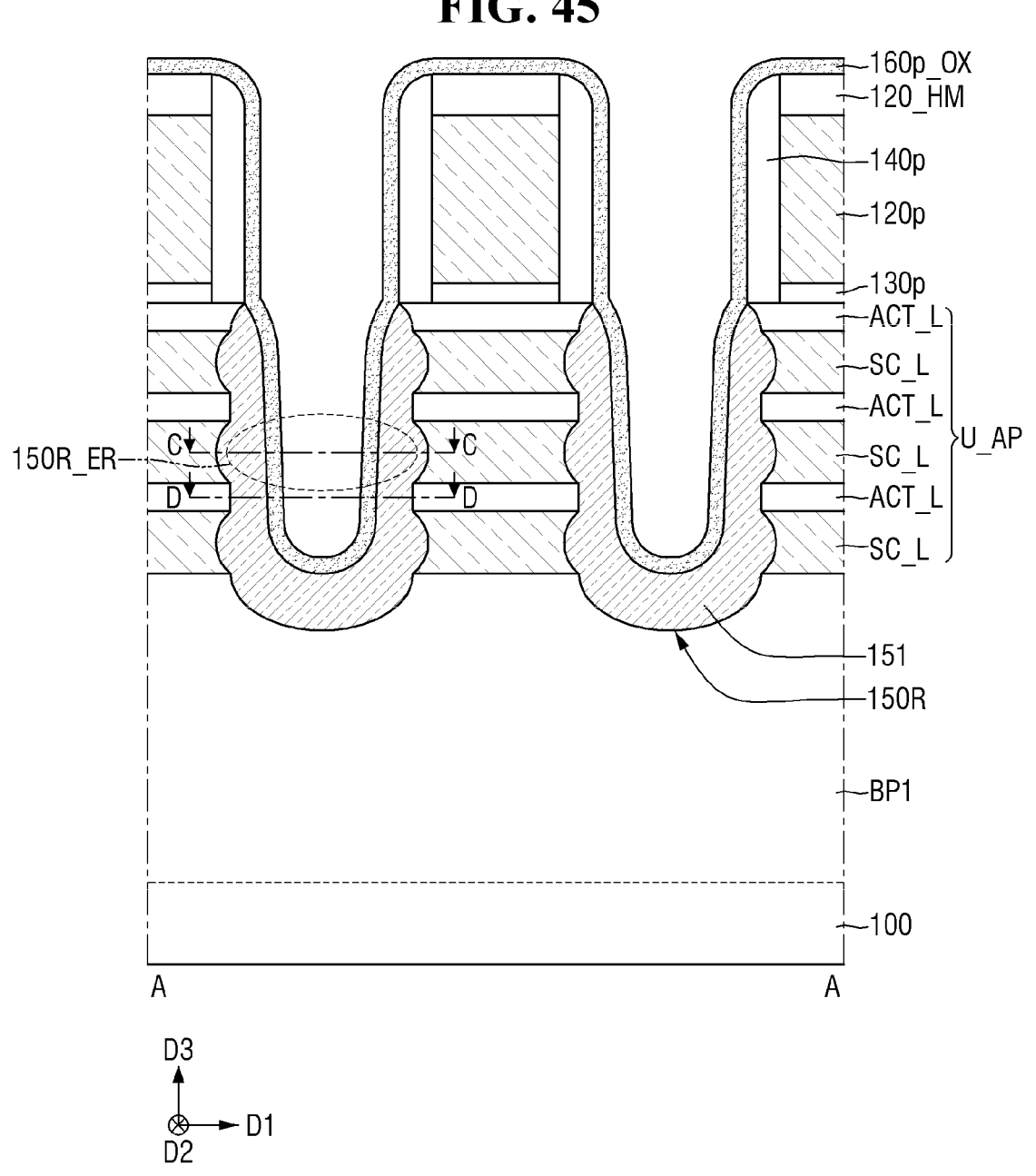
Figure 46:
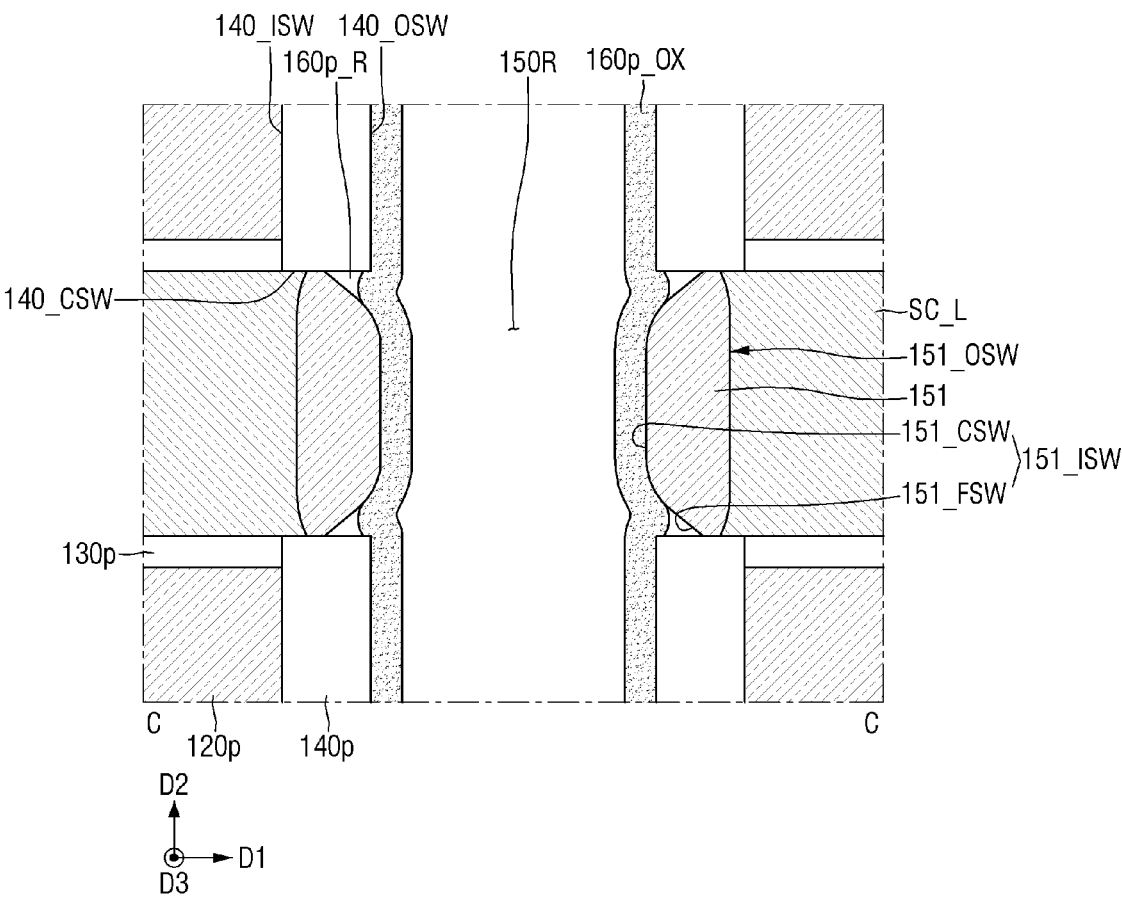
Figure 47:
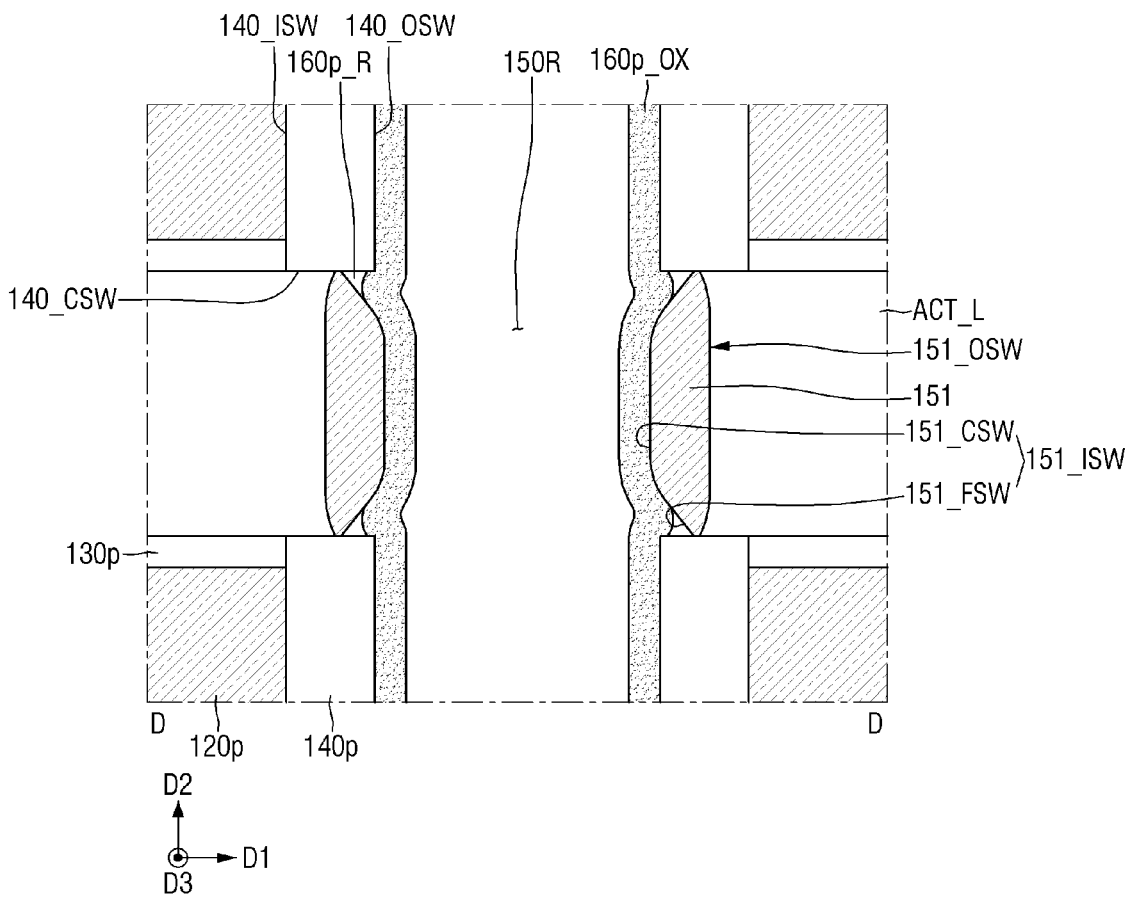

Referring to FIGS. 45 to 47, a pre-etch blocking oxide layer 160p_OX may be formed on the first semiconductor liner layer 151.

The pre-etch blocking oxide layer 160p_OX may be formed by oxidizing a portion of the pre-etch blocking layer 160p. The pre-etch blocking layer 160p may include a residue pre-etch blocking layer 160p_R and a pre-etch blocking oxide layer 160p_OX.

The residue pre-etch blocking layer 160p_R is disposed between the connection sidewall 140_CSW of the pre-gate spacer and the facet surface 151_FSW of the inner sidewall 151_ISW of the first semiconductor liner layer. In a plan view, the residue pre-etch blocking layer 160p_R covers at least a portion of the facet surface of the first semiconductor liner layer 151.

Figure 49:
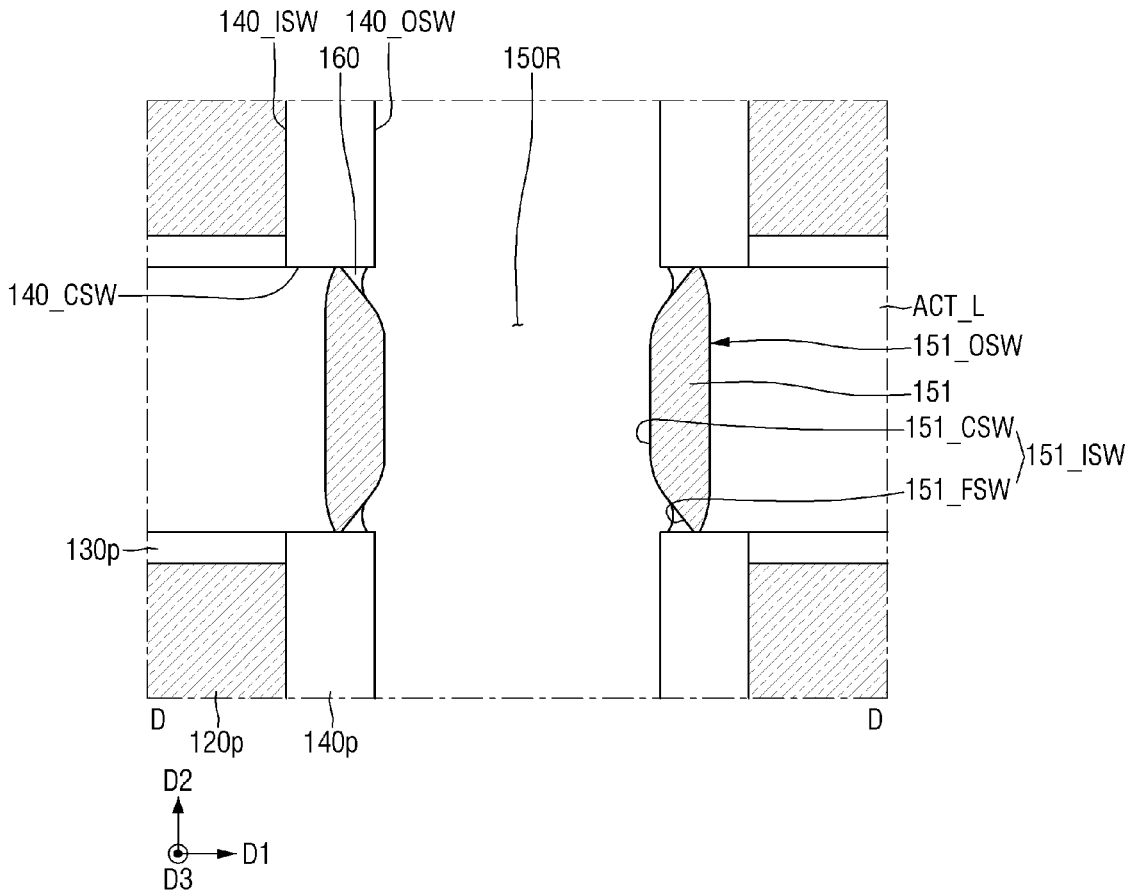

Referring to FIGS. 48 and 49, the first side surface etch blocking pattern 160 is formed by removing the pre-etch blocking oxide layer 160p_OX.

The first side etch blocking pattern 160 may be the residue pre-etch blocking layer 160p_R. The first side etch blocking pattern 160 is in contact with the facet surface of the first semiconductor liner layer 151 and the connection sidewall 140_CSW of the pre-gate spacer.

The first side etch blocking pattern 160 may extend in the third direction D3.

Figure 50:
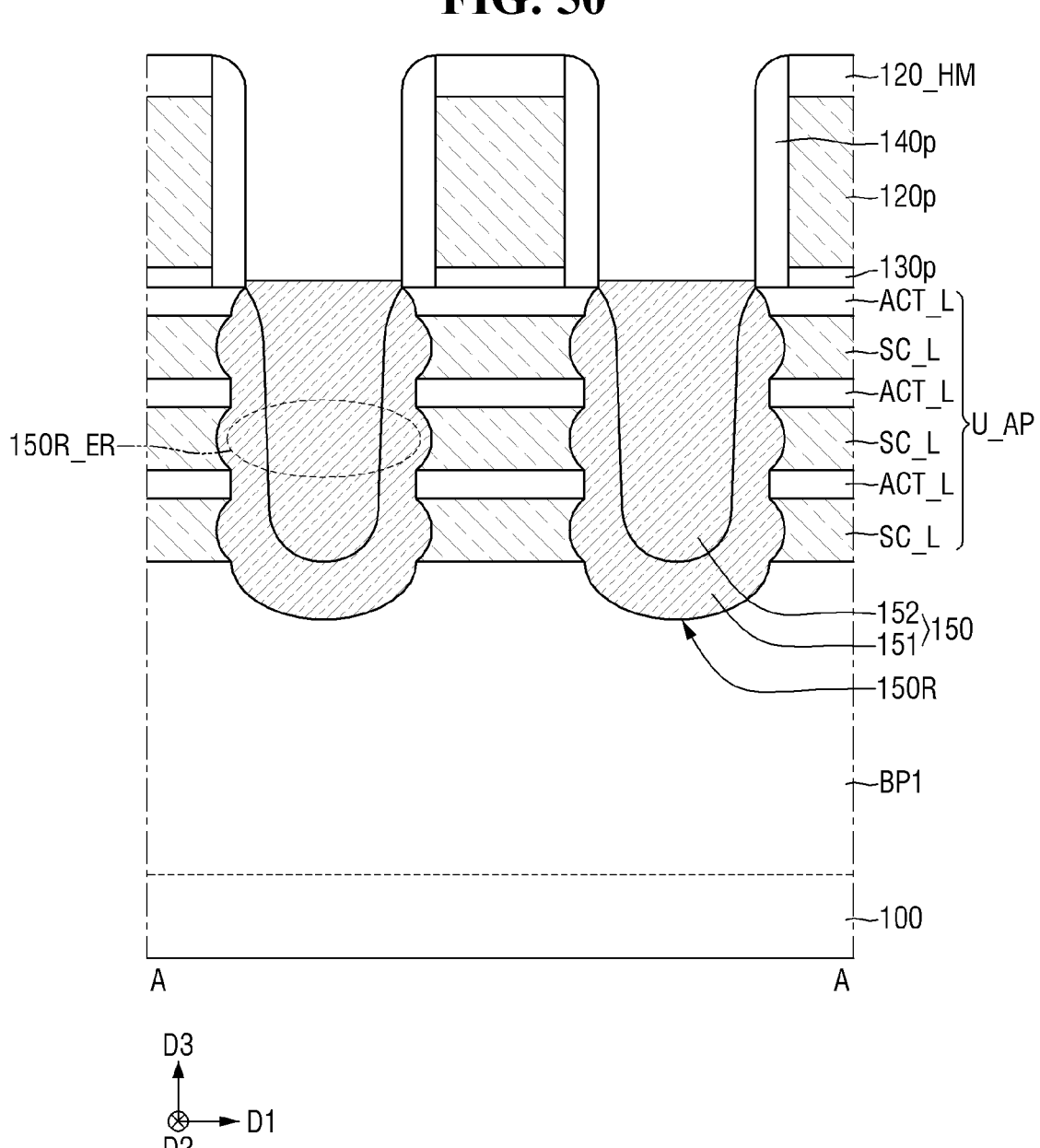

Referring to FIG. 50, the first semiconductor filling layer 152 is formed on the first semiconductor liner layer 151.

The first semiconductor filling layer 152 may fill the remainder of the first source/drain recess 150R. In FIGS. 5 and 6, the first semiconductor filling layer 152 is formed on the first side etch blocking pattern 160.

Figure 51:
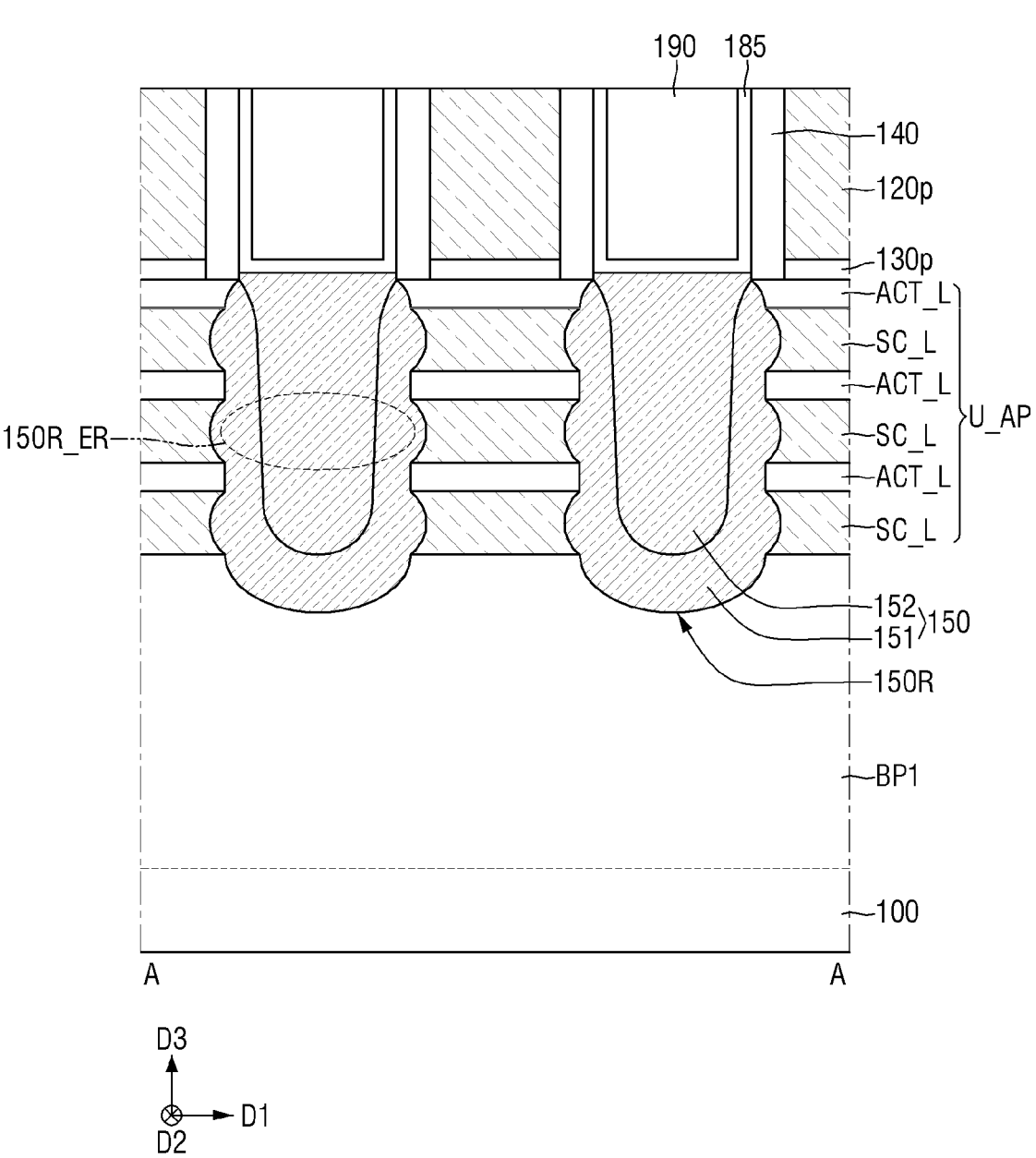

Referring to FIG. 51, the source/drain etch stop layer 185 and the first interlayer insulating layer 190 are sequentially formed on the first source/drain pattern 150. Next, an upper surface of the dummy gate electrode 120p is exposed by removing a portion of the first interlayer insulating layer 190, a portion of the source/drain etch stop layer 185, and the dummy gate capping layer 120_HM. While the upper surface of the dummy gate electrode 120p is exposed, the first gate spacer 140 may be formed. For example, the connection sidewall 140_CSW of the pre-gate spacer becomes the connection sidewall of the first gate spacer.

Figure 52:
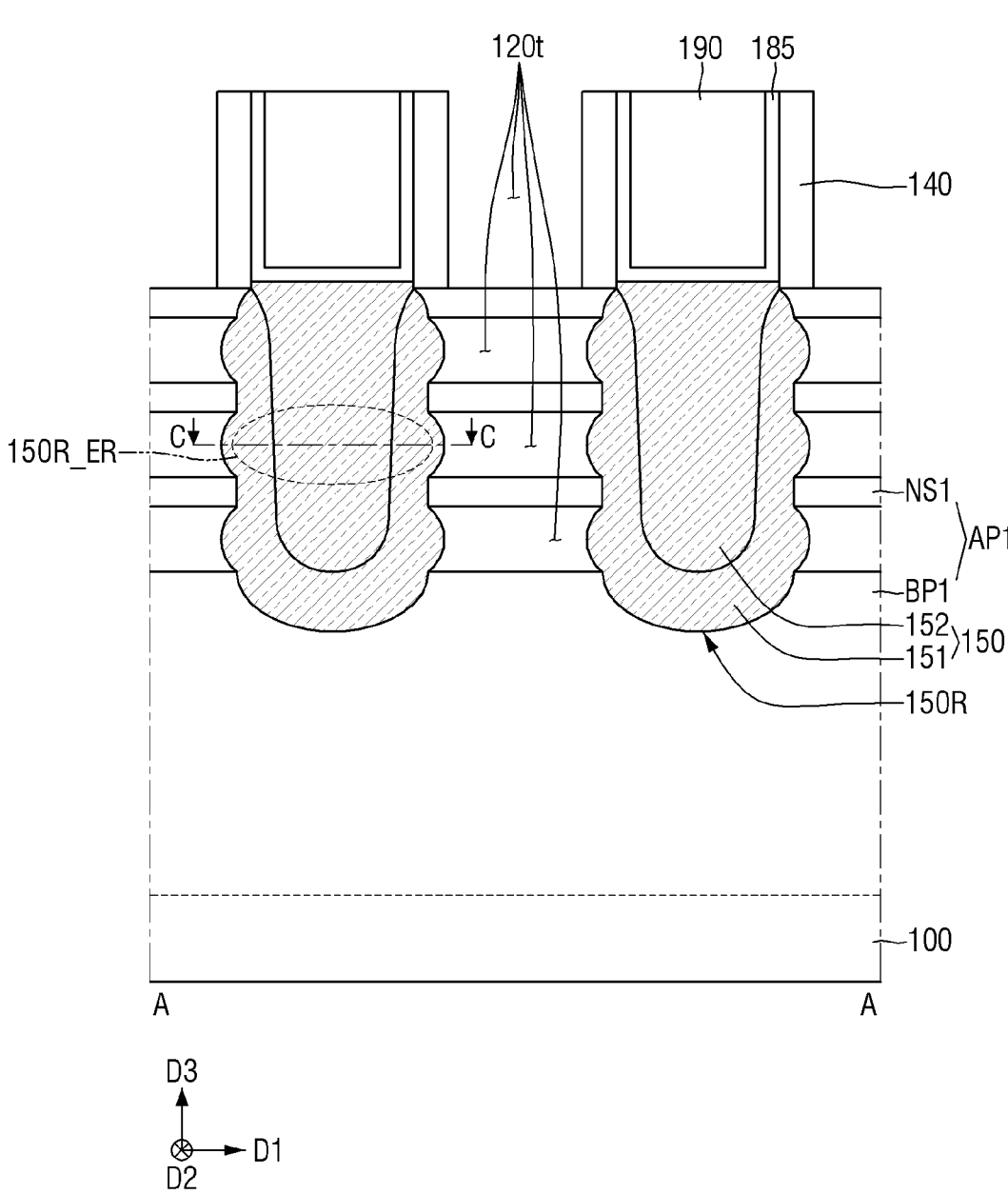

Referring to FIGS. 52 and 53, the upper pattern structure U_AP between the first gate spacers 140 may be exposed by removing the dummy gate insulating layer 130*p* and the dummy gate electrode 120*p*.

Next, the first sheet patterns NS1 may be formed by removing the sacrificial patterns SC_L. As a result, first gate trenches 120*t* are formed between the first gate spacers 140. In addition, the first active pattern AP1 including the first lower pattern BP1 and the first sheet patterns NS1 is formed.

Next, referring to FIG. 2, the first gate insulating layers 130 and the first gate electrodes 120 may be formed in the first gate trenches 120*t*. In addition, the first gate capping pattern 145 may be formed.

Figure 54:
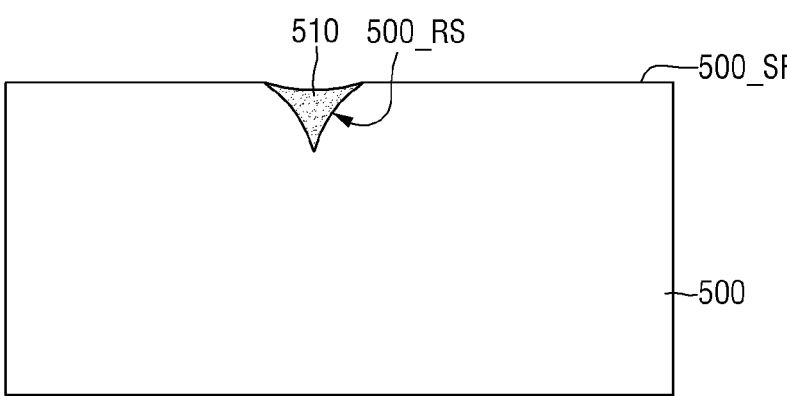
FIGS. 54 and 55 are views for describing semiconductor devices according to some embodiments, respectively.
Figure 55:
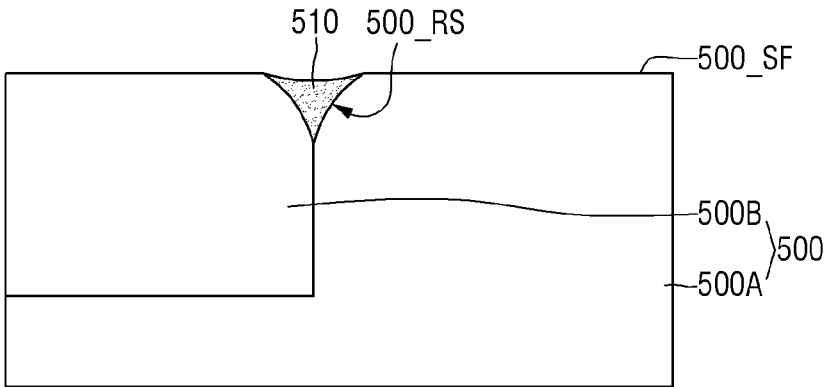

FIGS. 54 and 55 are views for describing semiconductor devices according to some embodiments, respectively.

Referring to FIGS. 54 and 55, a semiconductor device according to some embodiments may include a base material 500, a ruggedness structure 500_RS, and a blocking pattern 510.

The base material 500 may include one surface 500_SF. The base material 500 may include, for example, at least one of a semiconductor material, an insulating material, and a material including a metal.

The ruggedness structure 500_RS may be a structure recessed from one surface 500_SF of the base material.

The blocking pattern 510 fills the ruggedness structure 500_RS. The blocking pattern 510 is in direct contact with a surface of the ruggedness structure 500_RS. The blocking pattern 510 is not disposed on one surface 500_SF of the base material.

The blocking pattern 510 may include, for example, at least one of a semiconductor material, an insulating material, and a material including a metal. In the semiconductor device according to embodiments of the present disclosure, the blocking pattern 510 may be made of an insulating material.

In FIG. 54, the ruggedness structure 500_RS may be formed in the base material made of one material.

In FIG. 55, the base material 500 may include a first portion 500A and a second portion 500B. The ruggedness structure 500_RS may be formed in a boundary region between the first portion 500A of the base material and the second portion 500B of the base material.

FIGS. 56 to 59 are views for describing intermediate steps of a method for fabricating a semiconductor device according to some embodiments.

Figure 56:
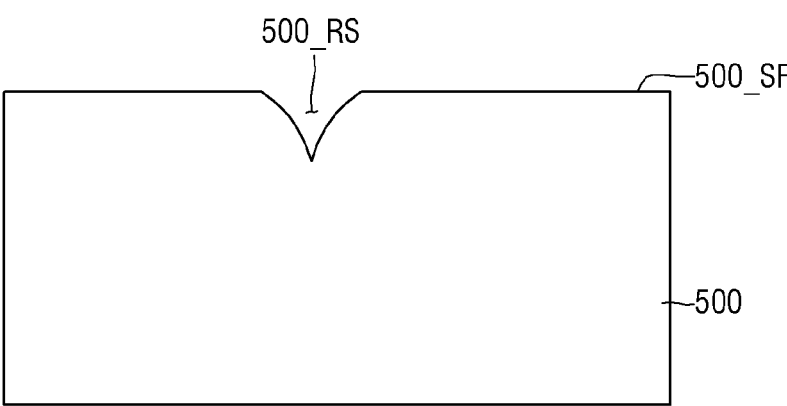

Referring to FIG. 56, the ruggedness structure 500_RS is formed on one surface 500_SF of the base material.

The ruggedness structure 500_RS may be formed by a deposition process, an etching process or the like, but is not limited thereto.

Figure 57:
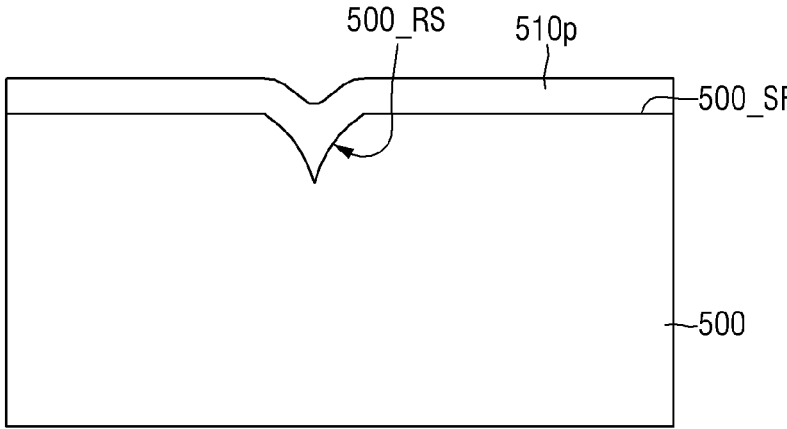

Referring to FIG. 57, a pre-blocking layer 510*p* is formed on one surface 500_SF of the base material. The pre-blocking layer 510*p* fills the ruggedness structure 500_RS.

Figure 58:
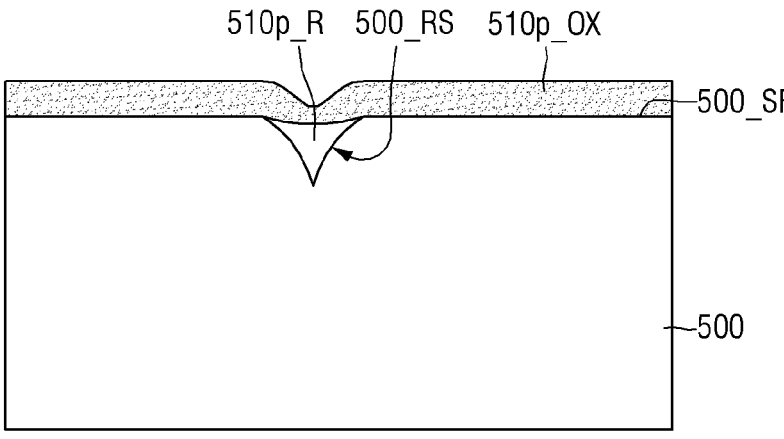

Referring to FIG. 58, a pre-blocking oxide layer 510*p*_OX is formed on one surface 500_SF of the base material.

The pre-blocking oxide layer 510*p*_OX may be formed by oxidizing a portion of the pre-blocking layer 510*p*. The pre-blocking layer 510*p* may include a residue pre-blocking layer 510*p*_R and the pre-blocking oxide layer 510*p*_OX.

Figure 59:
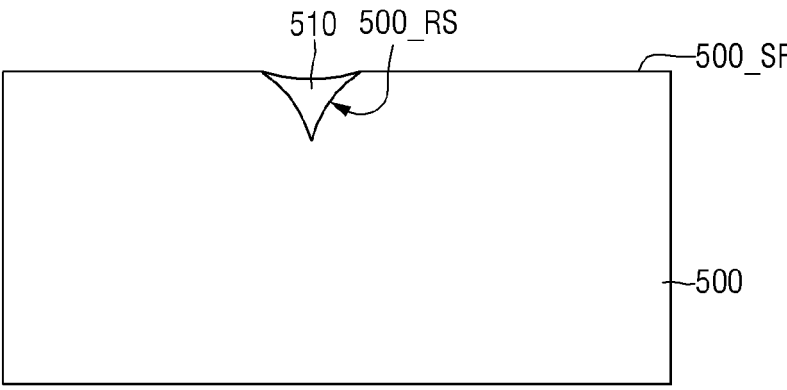

Referring to FIG. 59, the blocking pattern 510 is formed by removing the pre-blocking oxide layer 510*p*_OX. The blocking pattern 510 fills the ruggedness structure 500_RS.

The blocking pattern 510 may be the residue pre-blocking layer 510*p*_R.

In concluding the detailed description, those skilled in the art will appreciate that many variations and modifications may be made to the preferred embodiments without substantially departing from the principles of the present inventive concept. Therefore, the disclosed preferred embodiments of the invention are used in a generic and descriptive sense only and not for purposes of limitation.

What is claimed is:

1. A semiconductor device comprising:
an active pattern comprising a lower pattern extending in a first direction and a plurality of sheet patterns spaced apart from the lower pattern in a second direction;
a gate structure on the lower pattern and comprising a gate insulating layer, a gate electrode, and a gate spacer, the gate electrode extending in a third direction perpendicular to the first direction;
a source/drain pattern on the lower pattern and in contact with the sheet patterns and the gate insulating layer; and
a first etch blocking pattern between the gate spacer and the source/drain pattern,
wherein the gate spacer comprises an inner sidewall facing the gate electrode and extending in the third direction, and a connection sidewall extending from the inner sidewall of the gate spacer in the first direction,
the source/drain pattern comprises a semiconductor liner layer and a semiconductor filling layer on the semiconductor liner layer,
the semiconductor liner layer is in contact with the sheet patterns, and comprises a facet surface extending from the connection sidewall of the gate spacer, and
the first etch blocking pattern is in contact with the facet surface of the semiconductor liner layer and the connection sidewall of the gate spacer.

2. The semiconductor device of claim 1, wherein a width of the first etch blocking pattern in the third direction increases with distance in the first direction away from the gate electrode.

3. The semiconductor device of claim 1, wherein the first etch blocking pattern comprises an insulating material.

4. The semiconductor device of claim 1, wherein the first etch blocking pattern comprises a blocking liner extending along the facet surface of the semiconductor liner layer and the connection sidewall of the gate spacer, and a blocking filling layer on the blocking liner.

5. The semiconductor device of claim 1, wherein the gate structure comprises an inner gate structure between the lower pattern and the sheet patterns and between the sheet patterns adjacent to each other, the inner gate structure comprising the gate electrode and the gate insulating layer, and
the first etch blocking pattern is between the inner gate structure and the semiconductor filling layer.

6. The semiconductor device of claim 1, wherein the first etch blocking pattern comprises a first surface facing the facet surface of the semiconductor liner layer, a second surface facing the connection sidewall of the gate spacer, and a connection surface extending from the first surface to the second surface, and
an entirety of the connection surface of the first etch blocking pattern is in contact with the semiconductor filling layer.

7. The semiconductor device of claim 1, wherein the source/drain pattern comprises an air gap between the first etch blocking pattern and the semiconductor filling layer.

8. The semiconductor device of claim 1, further comprising:

a second etch blocking pattern in the source/drain pattern, wherein the second etch blocking pattern is between the semiconductor liner layer and the semiconductor filling layer, and a width of the second etch blocking pattern in the third direction increases with distance in the first direction away from the gate electrode.

9. The semiconductor device of claim 8, wherein the source/drain pattern comprises an air gap between the second etch blocking pattern and the semiconductor filling layer.

10. The semiconductor device of claim 8, wherein the second etch blocking pattern comprises first and second surfaces in contact with the semiconductor liner layer and a connection surface extending from the first surface to the second surface, and an entirety of the connection surface of the second etch blocking pattern is in contact with the semiconductor filling layer.

11. The semiconductor device of claim 1, wherein each of the semiconductor liner layer and the semiconductor filling layer comprises silicon-germanium.

12. A semiconductor device comprising:

an active pattern comprising a lower pattern elongated in a first direction and a plurality of sheet patterns spaced apart from the lower pattern in a second direction;

a gate structure on the lower pattern and comprising a gate insulating layer, a gate electrode, and a gate spacer, the gate electrode elongated in a third direction perpendicular to the first direction; and a source/drain pattern on the lower pattern and in contact with the sheet patterns and the gate insulating layer, wherein the source/drain pattern comprises a semiconductor liner layer and a semiconductor filling layer on the semiconductor liner layer and in contact with the semiconductor liner layer, the semiconductor liner layer is in contact with the sheet patterns, and comprises a facet surface extending from the gate spacer, and in plan view at a level of one of the sheet patterns, a first width comprising a maximum width of the semiconductor liner layer in the third direction is greater than a second width, in the third direction, of an interface between the semiconductor liner layer and the semiconductor filling layer.

13. The semiconductor device of claim 12, wherein in plan view, the semiconductor filling layer is in contact with a portion of the facet surface of the semiconductor liner layer.

14. The semiconductor device of claim 12, further comprising:

an etch blocking pattern between the gate spacer and the source/drain pattern, wherein the gate spacer comprises an inner sidewall facing the gate electrode and extending in the third direction and a connection sidewall extending from the inner sidewall of the gate spacer in the first direction, and the etch blocking pattern is in contact with the facet surface of the semiconductor liner layer and the connection sidewall of the gate spacer.

15. The semiconductor device of claim 14, wherein in plan view, the etch blocking pattern further comprises a third surface extending between the facet surface of the semiconductor liner layer and the connection sidewall of the gate spacer, and the third surface is concave.

16. A semiconductor device comprising:

a first active pattern comprising a first lower pattern extending in a first direction and a plurality of first sheet patterns spaced apart from the first lower pattern in a second direction;

a first gate structure on the first lower pattern and comprising a first gate insulating layer, a first gate electrode, and a first gate spacer, the first gate electrode extending in a third direction perpendicular to the first direction;

a second active pattern comprising a second lower pattern extending in the first direction and a plurality of second sheet patterns spaced apart from the second lower pattern in the second direction, a width of an upper surface of the second lower pattern in the third direction being smaller than a width of an upper surface of the first lower pattern in the third direction;

a second gate structure on the second lower pattern and comprising a second gate insulating layer, a second gate electrode, and a second gate spacer, the second gate electrode extending in the third direction;

a first source/drain pattern on the first lower pattern and in contact with the first sheet patterns and the first gate insulating layer;

a second source/drain pattern on the second lower pattern and in contact with the second sheet patterns and the second gate insulating layer; and a first etch blocking pattern between the first gate spacer and the first source/drain pattern, wherein the first gate spacer comprises an inner sidewall facing the first gate electrode and extending in the third direction and a connection sidewall extending from the inner sidewall of the first gate spacer in the first direction, the first source/drain pattern comprises a semiconductor liner layer and a semiconductor filling layer on the semiconductor liner layer, the semiconductor liner layer is in contact with the first sheet patterns, and comprises a facet surface extending from the connection sidewall of the first gate spacer, and the first etch blocking pattern is in contact with the facet surface of the semiconductor liner layer and the connection sidewall of the first gate spacer.

17. The semiconductor device of claim 16, wherein the second gate spacer and the second source/drain pattern are free of an etch blocking pattern therebetween.

18. The semiconductor device of claim 16, further comprising:

a second etch blocking pattern between the second gate spacer and the second source/drain pattern, wherein a dimension of the first etch blocking pattern in the first direction is greater than a dimension of the second etch blocking pattern in the first direction.

19. The semiconductor device of claim 16, wherein the first etch blocking pattern comprises a blocking liner extending along the facet surface of the semiconductor liner layer and the connection sidewall of the first gate spacer, and a blocking filling layer on the blocking liner.

20. The semiconductor device of claim 16, further comprising:

a second etch blocking pattern in the first source/drain pattern, wherein the second etch blocking pattern is between the semiconductor liner layer and the semiconductor filling layer, a width of the second etch blocking pattern in the third direction increases with distance from the first gate electrode, and the second source/drain pattern is free of an etch blocking pattern therein.

\* \* \* \* \*